(12) United States Patent  (10) Patent No.: US 9,107,291 B2
Cheng et al.  (45) Date of Patent: Aug. 11, 2015

(54) FORMATION OF A COMPOSITE PATTERN INCLUDING A PERIODIC PATTERN SELF-ALIGNED TO A PREPATTERN

(71) Applicant: International Business Machines Corporation, Armonk, NY (US)

(72) Inventors: Joy Cheng, San Jose, CA (US); Gregory S. Doerk, Mountain View, CA (US); Charles T. Rettner, San Jose, CA (US); Daniel P. Sanders, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 181 days.

(21) Appl. No.: 13/683,447

(22) Filed: Nov. 21, 2012

(65) Prior Publication Data

US 2015/0195916 A1    Jul. 9, 2015

(51) Int. Cl.
*G03F 7/38* (2006.01)
*H05K 3/00* (2006.01)

(52) U.S. Cl.
CPC ........ *H05K 3/007* (2013.01); *H05K 2203/0548* (2013.01)

(58) Field of Classification Search
CPC .............................................. G01R 31/318547
USPC ...................... 714/729, 728; 438/780, 795, 99
See application file for complete search history.

(56) References Cited

U.S. PATENT DOCUMENTS

| 4,761,561 | A  * | 8/1988 | Fujiwara et al. | 250/548 |
| 6,600,561 | B2 * | 7/2003 | Tabei | 356/401 |
| 7,399,578 | B2 * | 7/2008 | Takahashi et al. | 430/311 |
| 7,462,560 | B2 * | 12/2008 | Chiang et al. | 438/685 |
| 7,521,094 | B1 | 4/2009 | Cheng et al. | |
| 7,790,350 | B2 | 9/2010 | Breyta et al. | |
| 8,088,551 | B2 | 1/2012 | Sills et al. | |
| 8,133,534 | B2 | 3/2012 | Stoykovich et al. | |
| 8,234,596 | B2 * | 7/2012 | Ogawa et al. | 716/50 |

(Continued)

FOREIGN PATENT DOCUMENTS

KR    100858223 B1    9/2008

OTHER PUBLICATIONS

Black, C.T., "Self-Aligned Self Assembly of Multi-Nanowire Silicon Field Effect Transistors" Applied Physics Letters (Oct. 13, 2005) pp. 163116-1-163116-3, vol. 87.

(Continued)

*Primary Examiner* — Fritz Alphonse
(74) *Attorney, Agent, or Firm* — Scully, Scott, Murphy & Presser, P.C.

(57) ABSTRACT

A chemical pattern layer including an orientation control material and a prepattern material is formed over a substrate. The chemical pattern layer includes alignment-conferring features and additional masking features. A self-assembling material is applied and self-aligned over the chemical pattern layer. The polymeric block components align to the alignment-conferring features, while the alignment is not altered by the additional masking features. A first polymeric block component is removed selective to a second polymeric block component by an etch to form second polymeric block component portions having a pattern. A composite pattern of the pattern of an etch-resistant material within the chemical pattern layer and the pattern of the second polymeric block component portions can be transferred into underlying material layers employing at least another etch.

26 Claims, 35 Drawing Sheets

(56) References Cited

U.S. PATENT DOCUMENTS

| | | | |
|---|---|---|---|
| 8,238,205 B2* | 8/2012 | Kondo et al. | 369/44.13 |
| 8,268,209 B2* | 9/2012 | Ogino et al. | 264/40.1 |
| 2007/0227383 A1 | 10/2007 | Decre et al. | |
| 2008/0265415 A1 | 10/2008 | Colburn et al. | |
| 2009/0191713 A1 | 7/2009 | Yoon et al. | |
| 2010/0124629 A1 | 5/2010 | Gopalan et al. | |
| 2010/0167214 A1 | 7/2010 | Yoon et al. | |
| 2010/0297847 A1 | 11/2010 | Cheng et al. | |
| 2011/0059299 A1 | 3/2011 | Kim et al. | |

OTHER PUBLICATIONS

Basker, V.S. et al., "A 0.063 μm2 FinFET SRAM cell demonstration with conventional lithography using a novel integration scheme with aggressively scaled fin and gate pitch" 2010 Symposium on VLSI Technology Digest of Technical Papers (Jun. 15-17, 2010) pp. 19-20.

Ruiz, R. et al., "Rectangular Patterns Using Block Copolymer Directed Assembly for High Bit Aspect Ratio Patterned Media" ACS Nano (2011) pp. 79-84, vol. 5, No. 1.

Liu, G. et al., "Integration of Density Multiplication in the Formation of Device-Oriented Structures by Directed Assembly of Block Copolymer—Homopolymer Blends." Advanced Functional Materials (Apr. 23, 2010) pp. 1251-1257, vol. 20, No. 8.

Stoykovich, M. P. et al., "Directed Self-Assembly of Block Copolymers for Nanolithography: Fabrication of Isolated Features and Essential Integrated Circuit Geometries" ACS Nano (Oct. 6, 2007) pp. 168-175, vol. 1, No. 3.

International Search Report and Written Opinion, PCT/US2013/069988, mailed Aug. 11, 2014.

* cited by examiner

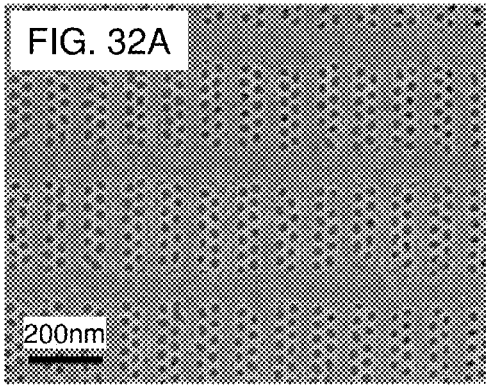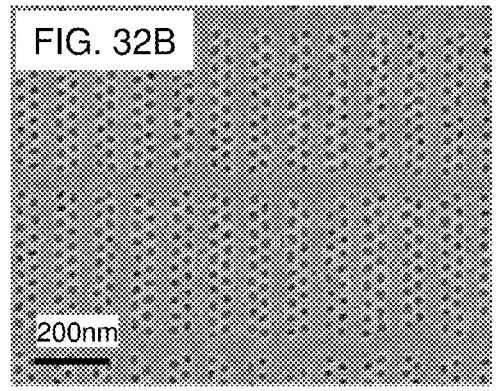

FORMATION OF A COMPOSITE PATTERN INCLUDING A PERIODIC PATTERN SELF-ALIGNED TO A PREPATTERN

STATEMENT REGARDING FEDERALLY SPONSORED RESEARCH OR DEVELOPMENT

This invention was made with Government support under FA8650-10-C-7038 awarded by the Defense Advanced Research Projects Agency (DARPA). The Government has certain rights in this invention.

BACKGROUND

The present disclosure relates generally to nanoscale structures, and more particularly to methods for generating a composite pattern including either a prepattern including masking features or the complement to a prepattern including masking features, and a pattern generated through directed self-assembly with frequency multiplication by the prepattern of a self-assembling material, and structures for effecting the same.

Decreasing the critical dimension (CD) and minimum pitch of features in a nanoscale pattern used to fabricate integrated circuits (ICs) increases the density of devices on a chip, which in turn decreases overall cost per device. The self-assembly of block copolymers, polymer blends, or similar self-assembling materials capable of self-assembling to form regular domains is a possible candidate for extending lithographic patterning to smaller CDs and pitches. The domains formed by these self-assembling materials are highly uniform and are intrinsically arranged periodically across at least two adjacent like domains with a spatial period referred to as the characteristic pitch.

Directing this self-assembly using lithographic features results in a denser pattern with greater spatial uniformity than the lithographic pattern used for direction. In chemical epitaxy, an approach to directed self-assembly (DSA) that enables registration of the self-assembled pattern to underlying lithographic layers, a critical requirement for IC fabrication, a self-assembling material is applied to a surface having a chemical pattern layer immediately beneath the self-assembling material composed of nanoscale regions with differing chemical affinity for at least one of the self-assembled domains. The preferred affinity between at least one portion of the pattern at the surface of the chemical pattern layer, the prepattern, and at least one self-assembled domain leads to alignment of the patterns formed by self-assembly according to the prepattern. Some domains with preferred affinity for the prepattern form over and align with features of the prepattern. Domains which do not form over features of the prepattern self-align to those domains that do form over prepattern features, resulting in a pattern of repeating sets of aligned domains in the self-assembling material. By subdividing the pitch of the prepattern features, the spatial frequency of the self-assembled pattern is a multiple of the spatial frequency of the prepattern, where spatial frequency is given by the number of repeating sets of features in a given length. Selective removal of some domains of the self-assembling material creates a mask by which a pattern can be transferred to the underlying substrate.

The resultant pattern that is to be transferred to the substrate possesses areas encompassing periodic features corresponding to individual self-assembled domains with dimensions (both pitch and CD) that may be significantly smaller than the resolution capable with state-of-the-art lithographic tools. However, IC designs include customized elements such as aperiodic, isolated, or discontinuous features. The most straightforward way to fabricate these using DSA is to trim the DSA-generated pattern using subsequent deposition, lithography, and etch steps. Unfortunately, modification of features corresponding to individual domains in the self-assembled pattern is very challenging given the limited resolution of available lithography tools. More critically, the size of individual self-assembled domains useful for patterning is approaching the scale of the overlay error associated with misalignment of the lithographic trim pattern to the self-assembled pattern. Patterning errors of such commensurate scale pose a severe detriment to device performance, reliability, and uniformity.

SUMMARY

The present disclosure provides a method for customizing patterns generated by direct self-assembly (DSA) such that additional overlay alignment steps can be avoided.

According to an aspect of the present disclosure, a method of forming a pattern on a substrate is provided. The method includes applying a solution of a self-assembling material to a chemical pattern layer on a substrate to form lamellae. The chemical pattern layer includes first regions and second regions that include chemically distinct first and second materials, respectively. One of the first and second materials includes an etch-resistant material such that the first and second materials possess substantially different etch resistances. The lamellae include alternating first and second domains composed of chemically distinct first and second polymeric block components, respectively. The first and second domains have a first width and a second width, respectively, and have a characteristic pitch that is equal to a sum of the first width and the second width. Physically exposed top surfaces of the first regions and the second regions complementarily overlie an entirety of the substrate. The first regions include a prepattern having alignment-conferring prepattern portions and at least one masking feature prepattern portion. The first regions have a preferential affinity for the first domains. The alignment-conferring prepattern portions include lengthwise strips having widths substantially equal to the first width of the first domains, and lengthwise center lines located at positions laterally separated from one another by distances substantially equal to integer multiples of a unit distance, the unit distance being substantially equal to the characteristic pitch. Each of the at least one masking feature prepattern portions has a width greater than the width of the first domains or has a lengthwise center line located at a position laterally separated from the lengthwise center line of an alignment-conferring prepattern portion by a distance different from an integer multiple of the unit distance. At least one of the first domains is formed over the alignment-conferring prepattern portions, and wherein the at least one first domain so formed are aligned to the alignment-conferring prepattern portions. Subsets of the first and second domains that are formed over the second regions or over the at least one masking feature prepattern portions self-align with a subset of the first domains that is formed over the alignment-conferring prepattern portions to form aligned lamellar structures oriented substantially perpendicular to the substrate. The method further includes selectively removing, by an etch process, the first domains or the second domains to form an etched self-assembled pattern. The method further includes transferring the etched self-assembled pattern selectively through either physically exposed portions of the first regions or physically exposed portions of the second regions of the chemical pattern layer into the substrate by at least one etch process to form a composite pattern including a union of the etched self-assembled pattern and the prepattern.

According to another aspect of the present disclosure, another method of forming a pattern on a substrate is provided. The method includes applying a solution of a self-assembling material to a chemical pattern layer on a substrate to form lamellae. The chemical pattern layer includes first regions and second regions that include chemically distinct first and second materials, respectively. One of the first and second materials includes an etch-resistant material such that the first and second materials possess substantially different etch resistances. The lamellae include alternating first and second domains composed of chemically distinct first and second polymeric block components, respectively. The first and second domains have a first width and a second width, respectively, and have a characteristic pitch that is equal to a sum of the first width and the second width. Physically exposed top surfaces of the first regions and second regions complementarily overlie an entirety of the substrate. The first regions include a prepattern having alignment-conferring prepattern portions and at least one masking feature prepattern portion. The first regions have a preferential affinity for the first domains. The alignment-conferring prepattern portions include lengthwise strips having widths substantially equal to one and a half times a unit distance and whose lengthwise center lines are located at positions laterally separated from one another by distances substantially equal to integer multiples of a unit distance, the unit distance being substantially equal to the characteristic pitch. Each of the at least one masking feature prepattern portions has a width different from the widths of the lengthwise strips or has a lengthwise center line located at a position laterally separated from the lengthwise center line of an alignment-conferring prepattern portion by a distance different from an integer multiple of the unit distance. At least one first domain and one second domain are formed over the alignment-conferring prepattern portions. The first domains and the second domains so formed are aligned to the alignment-conferring prepattern portions. Subsets of the first domains and the second domains that are formed over the second regions or over the at least one masking feature prepattern portions self-align with a subset of the first domains and the second domains formed over the alignment-conferring prepattern portions to form aligned lamellar structures oriented substantially perpendicular to the substrate. The method further includes selectively removing, by an etch process, the first domains or second domains to form an etched self-assembled pattern. The method further includes transferring the etched self-assembled pattern selectively through either physically exposed portions of the first regions or physically exposed portions of the second regions of the chemical pattern layer into the substrate by at least one etch process to form a composite pattern including a union of the etched self-assembled pattern and the prepattern.

According to yet another aspect of the present disclosure, yet another method of forming a pattern on a substrate is provided. The method includes applying a solution of a self-assembling material to a chemical pattern layer on a substrate to form cylindrical first domains in a matrix of a second domain. The chemical pattern layer includes first regions and second regions that include chemically distinct first and second materials, respectively. One of the first and second materials includes an etch-resistant material such that the first and second materials possess substantially different etch resistances. The cylindrical first domains and the second domain include chemically distinct first and second polymeric block components, respectively. The first domains have a characteristic diameter and a characteristic pitch that is equal to a spatial period between centers of the first domains. Physically exposed top surfaces of the first regions and the second regions complementarily overlie an entirety of the substrate. The first regions include a prepattern having a first axis in a plane parallel to the substrate and a second axis in the plane parallel to the substrate, and have alignment-conferring prepattern portions and at least one masking feature prepattern portion. The first regions have a preferential affinity for the first domains. The alignment-conferring prepattern portions include areas having widths substantially equal to the characteristic diameter and are arranged in an array such that centers of the areas are located at positions translated from one another by distances substantially equal to a combination of integer multiples of a unit distance along a direction of the first axis and integer multiples of the unit distance along a direction of the second axis, the unit distance being substantially equal to the characteristic pitch. Each of the at least one masking feature prepattern portion has a width greater than the characteristic diameter or has a center located at a position translated from a center of an alignment-conferring prepattern portion by a distance different from a combination of integer multiples of the unit distance along the direction of the first axis and integer multiples of the unit distance along the direction of the second axis. At least one of the first domains is formed over the alignment-conferring prepattern portions. A subset of the first domains that are formed over the second regions or over the at least one masking feature prepattern portions self-align with another subset of the first domains that is formed over the alignment-conferring prepattern portions so as to form an aligned array of cylinders oriented substantially perpendicular to the substrate. The method further includes selectively removing, by an etch process, the first domains or the second domain to form an etched self-assembled pattern. The method further includes transferring the etched self-assembled pattern selectively through either physically exposed portions of the first regions or physically exposed portions of the second regions of the chemical pattern layer into the substrate by at least one etch process to form a composite pattern including a union of the etched self-assembled pattern and the prepattern.

According to still another aspect of the present disclosure, a method of forming a pattern on a substrate is provided. The method includes applying a solution of a self-assembling material to a chemical pattern layer on a substrate to form cylindrical first domains in a matrix of a second domain. The chemical pattern layer includes first regions and second regions that include chemically distinct first and second materials, respectively. One of the first and second materials includes an etch-resistant material such that the first and second materials possess substantially different etch resistances. The cylindrical first domains and the second domain include chemically distinct first and second polymeric block components, respectively. The first domains have a characteristic diameter and a characteristic pitch that is equal to the spatial period between centers of first domains. Physically exposed top surfaces of the first and second regions complementarily overlie an entirety of the substrate. The first regions include a prepattern having alignment-conferring prepattern portions and at least one masking feature prepattern portion. The first regions have a preferential affinity for the first domains. The alignment-conferring prepattern portions include lengthwise strips having widths substantially equal to the characteristic diameter and whose lengthwise center lines are located at positions laterally separated from one another by distances substantially equal to integer multiples of a unit distance, the unit distance being in a range from 0.78 times the characteristic pitch to 0.95 times the characteristic pitch.

Each of the at least one masking feature prepattern portions has a width greater than the characteristic diameter or has a lengthwise center line located at a position laterally separated from the lengthwise center line of an alignment-conferring prepattern portion by a distance different from an integer multiple of the unit distance. At least one of the first domains is formed over the alignment-conferring prepattern portions. The at least one first domain so formed are aligned to the alignment-conferring prepattern portions. Subsets of the first domains that are formed over the second regions or over the at least one masking feature prepattern portions self-align with another subset of the first domains that are formed over the alignment-conferring prepattern portions to form an aligned array of cylinders oriented substantially perpendicular to the substrate. The method further includes selectively removing, by an etch process, the first domains or the second domains to form an etched self-assembled pattern. The method further includes transferring the etched self-assembled pattern selectively through either physically exposed portions of the first regions or physically exposed portions of the second regions of the chemical pattern layer into the substrate by at least one etch process to form a composite pattern including a union of the etched self-assembled pattern and the prepattern.

According to even another aspect of the present disclosure, a method of forming a pattern on a substrate is provided. A chemical pattern layer is formed on a substrate. The chemical pattern layer including a first material and a second material. One of the first material and the second material includes an etch-resistant material, on a substrate. Physically exposed top surfaces of the first material and physically exposed top surfaces of the second material complementarily overlie an entirety of the substrate. Regions in which top surfaces of the first material are physically exposed include a prepattern including alignment-conferring prepattern portions and at least one masking feature prepattern portion. A self-assembling material is applied over the chemical pattern layer. Self-alignment of periodically arranged chemically distinct polymeric block components of the self-assembling material to the alignment-conferring prepattern portions is induced. Portions of the self-assembling material over the at least one masking feature prepattern portions become self-aligned to the alignment-conferring prepattern portions. The method includes a step of removing at least one of the polymeric block components selective to the other of the polymeric block components and the etch-resistant material by an etch process to form an etched self-assembled pattern. The method further includes a step of transferring a pattern to the substrate by an etch process. The transferred pattern is a composite pattern including a union of the prepattern and the etched self-assembled pattern or a complement of the composite pattern.

BRIEF DESCRIPTION OF SEVERAL VIEWS OF THE DRAWINGS

FIG. 29B shows a second pattern after directed self-assembly (DSA) and an oxygen reactive ion etch (RIE) that removed first domains selective to second domains.

FIG. 29E is a magnified view of the first region of the first sample after transfer of a composite pattern into underlying material layers.

FIG. 30A shows a first pattern including an HSQ masking feature prepattern which a central area containing 90 nm×390 nm rectangular masking features that are not contiguous with any other prepattern portions.

FIG. 30B shows a second pattern after directed self-assembly (DSA) and an oxygen reactive ion etch (RIE) that removed first domains selective to second domains.

FIG. 31A shows customization with more complex masking features for the at least one masking feature prepattern portion. A HSQ masking feature prepattern includes a hat-shaped masking feature (267 nm wide by 84 nm long; "long" direction parallel to HSQ stripes) below a 267 nm wide by 80 nm long HSQ rectangle.

FIG. 31C was taken after an oxygen RIE that removed first domains selective to second domains.

FIG. 31D was taken after an oxygen RIE that removed first domains selective to second domains.

FIG. 31E shows a composite pattern transferred into the organic planarization layer.

FIG. 31F shows a composite pattern transferred into the organic planarization layer.

FIG. 32A is a SEM of a fourth sample manufactured according to methods of the present disclosure after formation of holes in an underlying material layer by a pattern transfer etch.

FIG. 32B is a SEM of a fifth sample manufactured according to methods of the present disclosure after formation of holes in an underlying material layer by a pattern transfer etch.

DETAILED DESCRIPTION

Figure 1:
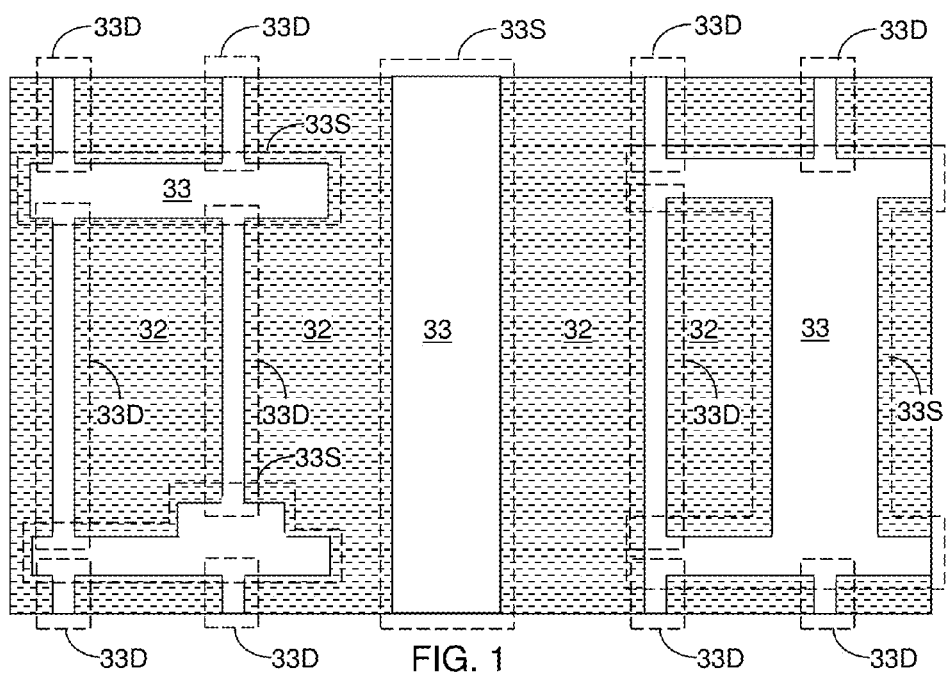
FIG. 1 is a top-down view of a first exemplary chemical pattern layer according to an embodiment of the present disclosure.

As stated above, the present disclosure relates to methods for generating a composite pattern including a masking feature prepattern and a pattern generated through directed self-assembly of a self-assembling material with frequency multiplication, and structures for effecting the same, which are now described in detail with accompanying figures. It is noted that like and corresponding elements are referred to by like reference numerals.

A "chemical pattern layer" refers to a pattern-including layer formed by at least two chemically different materials. Self-assembled pattern formation is initiated by applying a layer of self-assembling material that forms chemically distinct at least first and second domains by segregation of polymeric block components to a surface of a substrate having a chemical pattern layer thereon. The top surface of the chemical pattern layer includes first and second regions, the first and second regions in turn including first and second materials, respectively. The first regions, which possess preferential chemical affinity for one of the polymeric block components, are arranged in a pattern herein referred to as the "prepattern." Thus, the first regions are also referred to collectively herein as the prepattern. The first material, which possesses preferential chemical affinity for one of the polymeric block components on at least its top surface, is referred herein as the "prepattern material" and a layer of the first material is herein referred to as a "prepattern material layer." A prepattern includes a prepattern material region (or regions). The second regions occupying the remainder of the top surface of the chemical pattern layer in plan view, referred to herein as the "orientation control material regions," are occupied by a second material that is referred herein as the "orientation control material." Either the prepattern material or the orientation control material, but not both, may include a material resistant to the etch process used to selectively remove one set of domains in the self-assembled pattern. As used herein, a removal process that removes a material is "selective" if the removal process removes only the removed material and does not remove other material. As used herein, if a first material is removed without removing a second material in a removal process, the removal process for the first material is "selective to" the second material. This material resistant to the etch process used to selectively remove one set of domains in the self-assembled pattern, referred to herein as the "etch-resistant material," grants a substantial difference in etch resistance between the prepattern material regions and the orientation control material regions. As used herein, two material regions possess substantially different etch resistances for a given etch process if the relative etch rates allow for pattern transfer through one material region selective to the other material region. The prepattern, which includes portions of alignment-conferring features, i.e., alignment-conferring prepattern portions, aligns the self-assembled pattern directly above the chemical pattern layer to these alignment-conferring features through chemical epitaxy. Masking features including the same prepattern material but which do no not participate in aligning the overlying self-assembled pattern may also be included in the prepattern. Portions of the prepattern including at least one masking feature are also referred to herein as "at least one masking feature prepattern portions".

In one embodiment, customization of line-space patterns can be performed using DSA of lamellae-forming polymers. The methods of the present disclosure are not limited to lamellae forming copolymers, but may be applied broadly to any self-assembling material that is amenable to chemical epitaxy. This may include self-assembling materials with cylindrical, spherical, or other morphologies. For example, a prepattern may be used to align an array of hexagonally packed substrate-perpendicular cylinders through chemical epitaxy. Selective removal of the cylindrical domains creates a hole pattern that may be transferred selectively in either the prepattern material regions or the orientation control material regions.

The chemically distinct domains formed by a self-assembling material upon phase segregation, i.e., phase separation, of the polymeric block components are intrinsically arranged with an ordered spatial periodicity across at least two adjacent like domains, whereby the adjacent domains "self-align" with each other according to this intrinsic ordered spatial periodicity. The ordered spatial periodicity may be one, two, or three dimensional, depending on the morphology of the self-assembling material, where the dimensionality of the self-alignment is equivalent to the dimensionality of the ordered spatial periodicity. In portions of the self-assembled pattern where the spatial period changes or the direction of the ordered spatial periodicity changes, the self-alignment of the domains of the self-assembling material is broken, and thus the domains are not self-aligned in these portions. Furthermore, for self-alignment of the domains of a self-assembling material with each other on a substrate, the domains must maintain the same orientation with respect to the substrate normal direction. Therefore, the self-alignment of substrate-perpendicular domains is disrupted in portions of the self-assembled pattern where entire domains or portions of domains assume an orientation parallel with the substrate or an orientation that is intermediate between parallel and perpendicular orientation. The domains in these portions are not self-aligned with substrate-perpendicular domains in other portions. As used herein, a domain is oriented substantially perpendicular to the substrate if its interfaces with an adjacent domain or domains deviate from the direction perpendicular with the substrate by less than 15 degrees for the majority of the self-assembling material thickness.

In one embodiment, the methods of the present disclosure can be implemented in three stages. First, a chemical pattern layer including a prepattern material and an orientation control material, one of which includes an etch-resistant material, is formed. Second, directed self-assembly (DSA) of a self-assembling material is performed over the chemical pattern layer without formation of any horizontal interface between polymeric block components. Third, upon completion of one or more selective etch processes, a composite pattern of the prepattern and an etched self-assembled pattern created by removing one or more polymeric block components selectively to the other polymeric block components in the self-assembling material, also referred to herein as a "second pattern," is transferred into an underlying layer or the substrate employing the etch-resistant material and the polymeric block component as a composite mask. The composite pattern, or a complement to the composite pattern, transferred to an underlying layer or the substrate is also referred to herein as a "transferred pattern."

For the directed self-assembly step, a solution containing at least one self-assembling material is prepared. Additional block copolymers, random copolymers, homopolymers, surfactants, photoacid generators, or nanoparticles may be optionally added to enhance directed self-assembly or etch contrast between distinct domains. The solution is cast on the substrate with the chemical pattern layer to form well-aligned polymer domains with frequency multiplication. Additional annealing (including thermal annealing, thermal gradient annealing, solvent vapor annealing, or another gradient field) may optionally be performed.

In directed self-assembly as performed in the present disclosure, some domains with preferential chemical affinity for the prepattern material form over alignment conferring features and align with these features. Adjacent and subsequent domains including like and different polymeric block components self-align with the domains forming over and aligned with the alignment-conferring features, generating an aligned self-assembled pattern.

For the pattern transfer to the substrate, an etch process can be used to selectively remove one set of polymeric domains relative to another set of polymeric domains, creating a second pattern. The patterned etch-resistant material is substantially unaffected by this etch process. A subsequent etch process may be used to transfer the second pattern selectively into the etch-resistant material or in areas not underlying the etch-resistant material. A union of the prepattern and the second pattern forms a composite pattern, which is transferred into the underlying substrate. Pattern transfer may be facilitated by a material stack underneath the chemical pattern layer. In one embodiment, the material stack may include a hard mask layer, which is an etch-resistant inorganic layer located underneath the chemical pattern layer and above an organic planarization layer (OPL). In one embodiment, the material stack may include an OPL directly underneath the chemical pattern layer. In one embodiment, the material stack can provide etch selectivity needed to transfer the composite pattern into underlying layers.

In certain cases, it may be desirable to invert the transferred pattern, which may be accomplished in a variety of ways. In an illustrative example, cavities formed by transfer of the pattern into the OPL may be filled with a fill material, such as a spin-on dielectric (SOD) material, having etch selectivity relative to the OPL in an etch. Optionally, the fill material may be treated to promote cross-linking or hardening. The OPL may be removed selective to the fill material to form a complementary pattern including fill material portions.

In the methods of the present disclosure, masking features are set directly in the prepattern. The alignment and orientation of self-assembling material domains above masking features has no effect in the fidelity of the composite pattern transferred into underlying layers due to the substantially different etch resistance between the prepattern material regions and the orientation control material regions.

FIG. 1 depicts a first exemplary chemical pattern layer in a plan view, according to an embodiment of the present disclosure. The prepattern material region 33 includes alignment-conferring prepattern portions 33D and at least one masking feature prepattern portion 33S. Regions not occupied by the prepattern and its associated material are occupied by regions of the top surface of the orientation control material portion 32. As used herein, "orientation control material portion" refers to the orientation control material regions collectively. Either the prepattern material or the orientation control material, but not both, includes an etch-resistant material.

In one embodiment, the alignment-conferring prepattern portions 33D include a set of parallel lengthwise strips having a uniform width. The center lines along the lengthwise direction of the lengthwise strips of the alignment-conferring prepattern portions 33D are located at positions laterally separated from one another by distances substantially equal to integer multiples of a unit distance. As used herein, the distance of lateral separation between lengthwise strips of the alignment-conferring prepattern portions are substantially the same, i.e., substantially equal, to an integer multiple of the unit distance if one of the two dimensions differs by less than 10% relative to another of the two dimensions. In one embodiment, the uniform width of the lengthwise strips of the alignment-conferring prepattern portions 33D can be from 0.7 to 1.3 times the width of the domains for which they have preferential chemical affinity. As used herein, the uniform width of the lengthwise strips of the alignment-conferring prepattern portion 33D is substantially equal to the width of the domains for which they have preferential affinity if one of the two dimensions differs by less than 30% relative to another of the two dimensions. In another embodiment, the uniform width of the lengthwise strips of the alignment-conferring prepattern portions 30D can be from 1.05 to 1.95 times the unit distance. As used herein, the uniform width of the lengthwise strips of the alignment-conferring prepattern portion 33D is substantially equal to one and a half times the unit distance if one of the two dimensions differs by less than 30% relative to another of the two dimensions.

The centers of alignment-conferring features can be located at positions laterally separated from one another by the same integer multiple (e.g., three times) of the unit distance, or by different integer multiples (e.g., twice, three times, four times, and/or five times) of the unit distance. For example, the lengthwise center lines of the strips in the alignment-conferring prepattern portion 33D as illustrated in FIG. 1 can be located at positions laterally separated from a lengthwise center line of a neighboring strip, from left to right, by four times the unit distance, by ten times the unit distance, and by four times the unit distance, respectively.

The unit distance is determined by the distance of periodicity of self-aligned self-assembling material domains. In one embodiment, the unit distance is selected to be substantially the same as the characteristic pitch. As used herein, the unit distance and the characteristic pitch are substantially the same, i.e., substantially equal, if one of the two dimensions differs by less than 10% relative to another of the two dimensions. The unit distance can be from 2 nm to 50 nm, although lesser and greater unit distances can also be employed.

The characteristic pitch of the self-assembling material may be defined in different ways. In one embodiment, the characteristic pitch is equal to the sum of the widths of two alternating domains. In another embodiment, the characteristic pitch is equal to the average minimum distance between the centers of like domains of a self-assembling material. In one embodiment, the characteristic pitch is equal to the periodicity of domains in a self-assembling material possessing two or more block components, where the basis for the periodicity may be determined by one or more chemically distinct domains.

In one embodiment, the lengthwise strips of the alignment-conferring prepattern portions can be non-contiguous along their lengthwise direction. The non-contiguous lengthwise strips are not limited in their aspect ratio. It is noted that the integer multiple of the unit distance of the distance of lateral separation between the lengthwise center lines of two strips of the alignment-conferring prepattern portions 33D can include zero. Thus, two strips with lengthwise centerlines laterally separated by an integer multiple of the unit distance equal to zero effectively share the same lengthwise center line. Strips of the alignment-conferring prepattern portion 33D may be separated from each other along the lengthwise direction of the alignment-conferring prepattern portion 33D by a variety of distances provided the alignment-conferring qualities of the prepattern are maintained.

Masking features in the masking-feature prepattern portions 33S enable the transfer of features unlike those in the self-assembled pattern alongside the self-assembled pattern, either by serving as a mask for pattern transfer by etching processes into material layers underneath the chemical pattern layer (32, 33) and/or the substrate, or by allowing this same pattern transfer regardless of the overlying self-assembled pattern. Masking features do not confer alignment to domains in a self-assembling material applied to the chemical pattern, nor do they disrupt alignment conferred by other features in the prepattern in at least the areas occupied by the orientation control material. Given the fact that masking features, as portions of the prepattern, include the same material as alignment-conferring features, the non-alignment-conferring character of masking features arises from constraints in their width or position. For example, a masking feature can have with a width greater than the widths of individual domains with selective affinity for the prepattern material, making it infeasible for a single domain to form on the masking feature and be so aligned with the masking feature. In another example, a masking feature is patterned so that its center is a distance from centers of the nearest alignment-conferring prepattern features that cannot be subdivided by the unit distance to be substantially equal to integer values.

In one embodiment, the at least one masking feature prepattern portions 33S include areas of the prepattern having a width greater than the width of domains for which the prepattern material has preferential chemical affinity. As used herein, the widths of areas of the at least one masking feature prepattern portions 33S are greater than the width of domains for which the prepattern material has preferential chemical affinity if the at least one masking feature prepattern portion area widths are more than 30% larger. In cases where this criterion is not met, the center lines along the lengthwise direction of the at least one masking feature prepattern portions 33S are located at positions laterally separated from the lengthwise center lines of alignment-conferring prepattern portions by a distance different from an integer multiples of the unit distance. As used herein, the distance between lengthwise center lines of at least one masking feature prepattern portions 33S and the lengthwise center lines of the lengthwise strips of the alignment-conferring prepattern portions 33D are different from an integer multiple of the unit distance if one of the two dimensions differs by more than 10% relative to another of the two dimensions. In one embodiment, widths of the at least one masking feature prepattern portions 33S can be different from the uniform width of the lengthwise strips of the alignment-conferring prepattern portions 33D. As used herein, the widths of areas of the at least one masking feature prepattern portions 33S are different from the uniform width of the lengthwise strips of the alignment-conferring prepattern portions 33D if one of the two dimensions differs by more than 30% relative to another of the two dimensions.

In one embodiment, the at least one masking feature prepattern portions 33S include areas of the prepattern that have a width greater than the width of domains for which the prepattern material has preferential chemical affinity, or which have lengthwise center lines substantially underlying the lengthwise center lines of domains for which the prepattern material does not have preferential affinity. In another embodiment, the at least one masking feature prepattern portions 33S include areas of the prepattern that have a width different from the uniform width of the lengthwise strips of the alignment-conferring prepattern portions 33D, or which have lengthwise center lines substantially underlying the lengthwise center lines of domains for which the prepattern material has preferential affinity. As used herein, the lengthwise center line of an area of the at least one masking feature prepattern portions 33S underlies the lengthwise center line of a domain of the self-assembling material if the lateral distance between the two center lines is less than half the width of the overlying domain.

At least the top surface of the prepattern material has a preferential chemical affinity for one of the polymeric block components. The prepattern material can be organic or inorganic and may include, but is not limited to, the following materials: a cross linked polymer including an epoxy-based homopolymer or copolymer; a surface modified homopolymer or copolymer; a self-assembled monolayer, a polymer brush-modified layer, or a cross-linked organosilicate; polymer or copolymer brushes, cross-linked copolymers, or mixtures of polymer brushes or cross-linked polymers; some ARC materials; or any combination of the foregoing materials. In one embodiment, this material includes an etch-resistant material. In this case, the prepattern material can include any material that is included in an etch-resistant material, and a prepattern material including an etch-resistant material that is formed on a substrate can be applied by any suitable method in which an etch-resistant material is applied.

A prepattern material layer formed on the substrate can be applied by any suitable method and is not particularly limited.

Where the prepattern material is soluble in solutions, the application of prepattern material layers to a surface of the substrate can be accomplished by a process including, for example, spin-casting, dip-coating, doctor blading, spray dispense, or other suitable coating method, which is compatible with the processes and equipment used in microelectronics fabrication assembly lines. Exemplary casting solvents include, but are not limited to: toluene, propylene glycol monomethyl ether acetate (PGMEA), propylene glycol monomethyl ether (PGME), ethoxyethyl propionate, anisole, ethyl lactate, 2-heptanone, cyclohexanone, amyl acetate, n-butyl acetate, γ-butyrolactone (GBL), aqueous solutions, acetone, or a combination of the foregoing casting solvents.

The orientation control material portion 32 can include, for example, a thin dielectric material having a thickness from 1 nm to 20 nm. In one embodiment, the orientation control material portion 32 includes a material having substantially the same affinity to two different polymeric block components within a self-assembling material layer to be subsequently applied thereupon. In one embodiment, the orientation control material portion 32 can include random polymers, i.e., polymers that obtained by polymerization of random sequences of different types of monomers. In one embodiment, the orientation control material portion 32 includes an etch-resistant material.

The orientation control material portion 32 includes a material having an orientation control surface that allows the domains of a self-assembling material to be subsequently applied thereupon to orient in a set direction with respect to the substrate. This direction may be substantially perpendicular to the substrate, but in some cases may be parallel, depending on the material selected for the orientation control material portion 32, or the annealing method used.

The mechanism for the orientation control by the orientation control material portion 32 in any specific context is contestable. Without wishing to be bound by any specific theory, the mechanism for the orientation control by the orientation control material portion 32 may depend on net surface energy, wetting characteristics, surface energy distribution, hydrogen bonding, net dipole moments, dipole moment density, or even composition. Materials creating the right characteristics for the orientation control material portion 32 may include: A cross linked organic polymer including an epoxy-based homopolymer or copolymer; a surface modified organic homopolymer or copolymer; a self-assembled monolayer, a polymer brush-modified layer, or a cross-linked organosilicate; random copolymer brushes, random cross-linked copolymers, or mixtures of polymer brushes or cross-linked polymers; some ARC materials, or even a properly and precisely oxidized silicon surface.

Polymer brushes can provide an orientation control surface, in which the surface is reactively modified to the desired thickness and surface properties using polymeric brush precursors with a desired composition, often followed by an additional rinse step to remove non-bound material. The composition of a random copolymer brush layer is tuned to afford the desired orientation control surface. This can be accomplished in some instances by randomly copolymerizing two monomers, for example the same monomers used in the self-assembling material (for the self-assembling material assembly), in a precise ratio. In instances where otherwise useful self-assembling materials (i.e., those that can form domains) exist for which it is unfeasible to synthesize random copolymers of repeating units of each polymeric block components (such as where different polymerization mechanisms would be required), end-group functionalization or incorporation of reactive-group containing monomers can be used to functionalize a polymers to provide grafting sites. [See e.g., P. Mansky, Y. Liu, E. Huang, T. P. Russell, C. Hawker, "Controlling polymer surface interaction with random copolymer brushes," *Science*, 275, 1458, (1997).] Thermally crosslinkable underlayers based on, for example, vinyl benzocyclobutene, may also be used. [See e.g., Du Yeol Ryu, Kyusoon Shin, Eric Drockenmuller, Craig J. Hawker, and Thomas P. Russell, "A generalized approach to modification of solid surfaces" *Science*, 308, 236, (2005)]. Photopatternable underlayers, based on random copolymers of the monomers of the self-assembling material with an appropriate functional monomer, for example, monomers having azide, glycidyl or acryloyl groups, may also be used. [See e.g., Joona Bang, Joonwon Bae, Peter Löwenhielm, Christian Spiessberger, Susan A. Given-Beck, Thomas P. Russell, and Craig J. Hawker, "Facile routes to patterned surface neutralization layers for block copolymer lithography," *Advanced Materials*, vol. 19, p. 4552 (2007)].

The orientation control surface can also be provided by use of a coating of a crosslinked epoxy-containing polymer prepared from monomers including glycidyl (meth)acrylate, 2,3-epoxycyclohexyl (meth)acrylate, (2,3-epoxycyclohexyl)methyl (meth)acrylate, 5,6-epoxynorbornene (meth)acrylate, epoxydicyclopentadienyl (meth)acrylate, and combinations including at least one of the foregoing. Herein, where "(meth) acrylate" is used, either an acrylate or methacrylate is contemplated unless otherwise specified. In some embodiments for example, specifically useful monomers include glycidyl methacrylate and epoxydicyclopentadienyl methacrylate.

Epoxy-containing polymers also include copolymers or terpolymers further containing at least one additional monomer in addition to the epoxy-containing monomer. Exemplary additional monomers include methyl (meth)acrylate, ethyl (meth)acrylate, butyl (meth)acrylate, hexyl (meth)acrylate, cyclohexyl (meth)acrylate, benzyl (meth)acrylate, ethylcyclopentyl (meth)acrylate, methylcyclopentyl (meth) acrylate, dicyclopentyl (meth)acrylate, 2-hydroxy ethyl (meth)acrylate, 2-hydroxy propyl (meth)acrylate, hydroxyadamantyl (meth)acrylate, adamantyl (meth)acrylate, methyladamantyl (meth)acrylate, ethyladamantyl (meth)acrylate, phenyladamantyl (meth)acrylate, hydroxyadamantyl (meth) acrylate, isobornyl (meth)acrylate, benzyl (meth)acrylate, gamma-butyrolactone (meth)acrylate, 5-methacryloxy-2,6-norbornane carbolactone, 5-acryloxy-2,6-norbornane carbolactone, 2,2,2-trifluoroethyl (meth)acrylate, 1,1,1,3,3,3-hexafluoroisopropyl (meth)acrylate, styrene, 4-methyl styrene, α-methyl styrene, 4-hydroxy styrene, 4-acetoxy styrene, ethylene, propylene, 1-butene, 1,3-butadiene, vinyl acetate, dihydropyran, norbornene, maleic anhydride, or a combination including at least one of the foregoing additional monomers. The composition of the epoxy-containing polymer can be adjusted by varying the ratios and identities of the comonomers and/or by selecting the structure and/or functionality of the pendant group(s) on the (meth)acrylates.

Useful exemplary glycidyl methacrylate polymers are described by Gopalan et. al. [Eungnak Han, Insik In, Sang-Min Park, Young-Hye La, Yao Wang, Paul F. Nealey, and Padma Gopalan, "Photopatternable imaging layers for controlling block copolymer microdomain orientation," *Advanced Materials*, vol. 19, pp. 4448 (2007).]. In an embodiment, specifically useful epoxy-containing polymers include poly(epoxydicyclopentadienyl methacrylate) homopolymer or poly(styrene-ran-epoxydicyclopentadienyl methacrylate), a random copolymer of styrene and epoxydicyclopentadienyl methacrylate.

Organosilicate or silicon oxide-based coatings on the substrate can also be used to provide the orientation control surface. In an embodiment, useful surfaces may be provided by deposition of silicon dioxide or organosilicate as a vapor-deposited layer, or as a spin-on layer (organic spin-on glass, abbreviated OSG). Organosilicones, organo- or hydridosilsesquioxanes, or hybrid systems of these materials may be used to provide the orientation control surface, where such organosilicate coatings are advantageously crosslinkable to form a solid orientation control surface. Useful organosilicates include those derived from the hydrolytic condensation, catalyzed by acid or base, of hydridotrialkoxysilanes, alkyltrialkoxysilanes, alkyltrihalosilanes, dialkyldialkoxysilanes, dialkyldihalosilanes, tetraalkoxysilanes, bis(alkylenetrialkoxysilanes), and the like. Exemplary alkoxysilanes useful for preparing organosilicates include hydridotrimethoxysilane, hydridotriethoxysilane, dimethyldimethoxysilane, dimethyldiethoxysilane, methyltrimethoxysilane, ethyltrimethoxysilane, ethyltriethoxysilane propyltrimethoxysilane, propyltriethoxysilane, cyclohexyltriethoxysilane, phenyltriethoxysilane, tetramethoxysilane, tetraethoxysilane (TEOS), 1,2-ethylene bis(triethoxysilane), vinyltrimethoxysilane, vinyltriethoxysilane, glycidoxypropyltrimethoxysilane, epoxycyclohexylethyltriethoxysilane, (meth)acryloxypropyltrimethoxypropylsilane, (meth)acryloxypropyltriethoxypropylsilane, combinations of these, and the like.

An orientation control material layer formed on the substrate can be applied by any suitable method and is not particularly limited. Where polymer-based orientation control material are desired, the application of such layers to a surface of the substrate can be accomplished by a process including, for example, spin-casting, dip-coating, doctor blading, spray dispense, or other suitable coating method, which is compatible with the processes and equipment used in microelectronics fabrication assembly lines.

Solvents that can be used to deposit polymeric coatings for the orientation control material layer vary with the solubility requirements of these materials. Exemplary casting solvents include, but are not limited to: toluene, propylene glycol monomethyl ether acetate (PGMEA), propylene glycol monomethyl ether (PGME), ethoxyethyl propionate, anisole, ethyl lactate, 2-heptanone, cyclohexanone, amyl acetate, n-butyl acetate, γ-butyrolactone (GBL), and acetone.

The surface energy or composition required for the orientation control material portion 32 depends on the application. For example, in order to form polystyrene (PS)-poly(methyl methacrylate) (PMMA) perpendicular lamellae, a PS-PMMA random copolymer layer may be employed as the orientation control material portion 32 in order to make the lamellae stand up with substantially vertical interfaces thereamongst. In one embodiment, for an unpatterned surface, the brush composition may be from 57% PS to 70% PS. However, if the orientation control material is formed alongside a prepattern material region including PS guiding lines, the optimal value is estimated to be about 43% styrene, and if formed alongside a prepattern to be subsequently formed and including PMMA guiding lines, the optimal value is estimated to be around 73% PS. Both are outside the window that is optimal for unpatterned surfaces. The ideal surface will also be different for perpendicular cylinders rather than lamellae, and also depends on the multiplication factor for spatial frequency multiplication. The multiplication factor for spatial frequency multiplication refers to the ratio of the pitch of the substantially parallel guide lines that are alignment-conferring prepattern portions to the periodicity of a self-assembling material.

For a given orientation control material portion 32, the efficacy of the orientation control at a particular composition can depend on the thickness of the orientation control material layer. The molecular architecture of the orientation control material can have an effect. For example, a polymer brush orientation control material may have a different composition range than for a cross-linked orientation control material due to difference in mobility of the brush. For the same reason, a higher molecular weight brush may act differently from a lower molecular weight brush. Similar changes in the efficacy of orientation control may be observed for cross-linked orientation control materials having the same composition but different molecular weights. The efficacy of orientation control may also depend on the thickness of the self-assembly material layer above the orientation control material layer according to the relative difference in surface free energies among the polymeric block components. The exact orientation of polymer domains at the air interface or the polymer/orientation control interface may not be perpendicular to the substrate, even if the majority of each polymer domain is. The orientation-control material may still function even when it is weakly preferential. In some embodiments, the orientation control material may not cause polymer domains not to stand perpendicular to the substrate. For example, spheres or parallel cylinders may be employed as shapes of a phase-separated polymeric component in order to subsequently create hole patterns or line patterns.

The etch-resistant material includes a material that is resistant to another etch chemistry to be subsequently employed to etch a polymeric block component selective to another polymeric block component within a self-assembling material to be subsequently employed.

If the self-assembling material to be subsequently employed includes a first polymeric block component and a second polymeric block component, the etch-resistant material can include a material having a greater chemical affinity for the first polymeric block component than the second polymeric block component, or a greater chemical affinity for the second polymeric block component than the first polymeric block component.

The etch-resistant material can include, but is not limited to, a material selected from hydrogen silsesquioxane, methyl silsesquioxane, an alkyl silsesquioxane, an alkene silsesquioxane, an aryl silsesquioxane, an arylene silsesquioxane, a silicon-based resist, an inorganic resist, a silicon-based ARC, a metal-based ARC, silicon oxide, a silicon oxynitride, a silicon-based spin-on-dielectric, a metal, a metal oxide, a metal nitride, a metal oxynitride, and a metal carbide, provided that a suitable etch chemistry exists for removing some domains of a self-assembling material selectively to other domains and the etch-resistant material, and provided that another suitable etch chemistry exists for removing the material of the orientation control material layer 32 or the prepattern material 33 selective to the material of the etch-resistant material. In one embodiment, the etch-resistant material can include hydrogen silsesquioxane.

A layer of etch-resistant material formed on the substrate can be deposited by any suitable method and is not particularly limited. Where the etch-resistant material is soluble in solutions, the application of an etch-resistant material layer to a surface of the substrate can be accomplished by a process including, for example, spin-casting, dip-coating, doctor blading, spray dispense, or other suitable coating method, which is compatible with the processes and equipment used in microelectronics fabrication assembly lines. Exemplary casting solvents include, but are not limited to: toluene, propylene glycol monomethyl ether acetate (PGMEA), propylene glycol monomethyl ether (PGME), ethoxyethyl propionate, anisole, ethyl lactate, 2-heptanone, cyclohexanone, amyl acetate, n-butyl acetate, γ-butyrolactone (GBL), aqueous solutions, acetone, or a combination of the foregoing casting solvents.

In another example, the etch-resistant material can be deposited from the vapor phase by a process including, chemical vapor deposition (CVD), plasma enhanced CVD, atomic layer deposition (ALD), sputtering, thermal evaporation, electron beam evaporation, pulsed laser deposition, or other suitable deposition method that is compatible with the processes and equipment used in microelectronics fabrication.

Figure 2A:
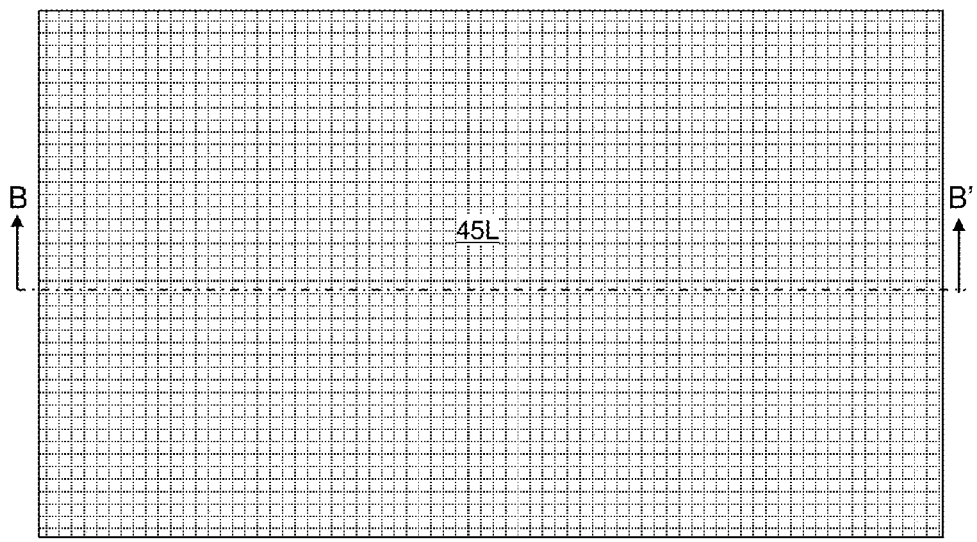
FIG. 2A is a top-down view of a first exemplary structure after application of a self-assembling material according to an embodiment of the present disclosure.
Figure 2B:
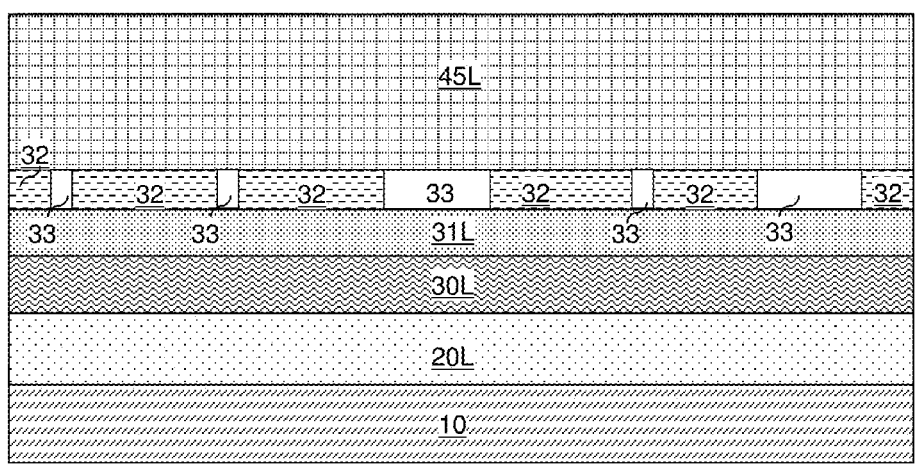
FIG. 2B is a vertical cross-sectional view of the first exemplary structure along the vertical plane B-B' of FIG. 2A.

Referring to FIGS. 2A and 2B, a self-assembling material is applied over the chemical pattern layer (32, 33) including the orientation control material portion 32 and the prepattern material region 33 to form a self-assembling material layer 45L. The material layers underneath the chemical pattern layer (32, 33) include a stack, from bottom to top, of a substrate 10, a material layer 20L, an organic planarization layer (OPL) 30L, and a hard mask layer 31L. This stack, including the chemical pattern layer, makes up a first exemplary structure according to an embodiment of the present disclosure. The self-assembling material can be applied, for example, by spin coating. The self-assembling material includes but is not limited to block copolymers, block terpolymers, homopolymers, and blends of these polymers, and is capable of self-organizing into nanometer-scale patterns. The self-assembling material includes at least a first polymeric block component and a second polymeric block component that are immiscible with each other. The self-assembling material may be self-planarizing. In one embodiment, the material of the hard mask layer 31L may be an etch-resistant material. In one embodiment, the material included by the hard mask layer 31L may be the same material as the orientation control material portion 32 or the material included by the prepattern material region 33, but not both.

The substrate 10 can be a semiconductor substrate, a dielectric substrate, a conductive material substrate, or a combination thereof. In one embodiment, the substrate 10 can include a bulk semiconductor substrate or a semiconductor-on-insulator (SOI) substrate as known in the art. The substrate 10 can optionally include a metal interconnect structure including at least one dielectric material layer and metal lines and/or metal via structures embedded therein. The top surface of the substrate 10 can be planar, or can have a non-planar topography.

The material layer 20L can be a conductive material layer, a dielectric material layer, a semiconductor material layer, or a stack thereof. The material layer 20L is a layer to be subsequently patterned by transferring a composite pattern of the prepattern and the second pattern. In one embodiment, the material layer 20L can be a dielectric hard mask layer such as a silicon nitride layer or a silicon oxide layer. The thickness of the material layer 20L can be from 5 nm to 100 nm, although lesser and greater thicknesses can also be employed. The material layer 20L may have the same thickness throughout, or may include a preexisting pattern (not shown). The top surface of the material layer 20L may be planar, or may include topographic features (i.e., include a non-planar surface).

The OPL 30L includes an organic planarizing material. As used herein, an organic planarizing material is an organic material such as a polymer that is applied with a surface having topography to provide a smooth and planar top surface. The material OPL 30L can include, but is not limited to, a material selected from organic resists, amorphous carbon, or proprietary organic hard mask materials. Exemplary organic hard mask materials include JSR HM8500 and JSR HM8016. In one embodiment, the material of the OPL 30L may flow at ambient temperature and pressure (20° C. and 1 atm) or at an elevated temperature less than 500° C. The formulation of the OPL 30L can be selected to provide sufficiently low viscosity so that a top surface of the OPL 30L is planar over any underlying topographic features. The OPL 30L be applied by any suitable method and is not particularly limited. Where polymer-based OPL 30L layers are desired, the application of such layers to a surface of the substrate can be accomplished by a process including, for example, spin-casting or another suitable coating method, which is compatible with the processes and equipment used in microelectronics fabrication assembly lines. OPL 30L layers may also be deposited from the vapor phase by processes including, for example, chemical vapor deposition. The OPL 30L may be optionally annealed to promote cross-linking and improve its mechanical stability during and after transfer by an etch process of patterns to the OPL layer 30L. In one embodiment, cross-linking may be promoted by a thermal anneal performed, for example, at an elevated temperature from about 200° C. to about 500° C. for a duration from 30 seconds to about 5 minutes. In one embodiment, the self-planarizing material of the OPL 30L can be an amorphous carbon layer. The thickness of the OPL 30L can be from 10 nm to 300 nm, although lesser and greater thicknesses can also be employed.

The hard mask layer 31L is formed on top of the OPL 30L. The hard mask layer 31L includes a hard mask material such as silicon oxide, silicon nitride, silicon oxynitride, a silicon-titanium- or tungsten-based anti-reflective coating (ARC) material as known in the art, or combinations thereof. The hard mask layer 31L can be formed, for example, by chemical vapor deposition (CVD), atomic layer deposition (ALD), or spin-coating. The thickness of the hard mask layer 31L can be from 1 nm to 20 nm, although lesser and greater thicknesses can also be formed. The hard mask layer 31L can be employed to reduce structural or compositional damage to the OPL 30L during removal of domains at a subsequent processing step.

The self-assembling material layer 45L can include at least a first polymer material, i.e., a first polymeric block component, and a second polymer material, i.e., a second polymeric block component; additional polymeric block components can also be included. At least two polymeric block components in the self-assembling material are structurally, compositionally, or both compositionally and structurally non-identical. The distinct polymeric block component are selected such that a self-aligned self-assembled structure of distinct at least first and second chemical domains, each domain including its respective polymeric block component, can be subsequently formed upon phase separation of the polymeric block components.

The self-assembly material layers 45L that may be used include diblock copolymers, triblock copolymers or terpolymers, or multiblock copolymers or terpolymers. The block components themselves can be homopolymers or copolymers. Different kinds of block copolymers can be included in the self-assembling material, including an amphiphilic organic block copolymer, amphiphilic inorganic block copolymer, organic diblock copolymer, organic multi-block copolymer, inorganic-containing diblock copolymer, inorganic-containing multi-block copolymer, linear block copolymer, star block copolymer, dendritic block copolymer, hyperbranched block copolymer, graft block copolymer, or a combination including at least one of the foregoing block copolymers. In an embodiment, the self-assembling material is a diblock copolymer.

Where used, inorganic constituents of inorganic-containing polymers, including inorganic-containing homopolymers, copolymers, and block copolymers, and inorganic-containing monomers, molecules, and additives include, for example, those based on silicon, germanium, iron, titanium, aluminum, or the like. Exemplary silicon- and germanium-containing monomers and polymers can include those disclosed by H. Ito in "Chemical Amplification Resists for Microlithography" *Adv. Polym. Sci.*, vol. 172, pp. 37-245 (2005); exemplary metal containing monomers and polymers include those disclosed by Ian Manners in "Synthetic Metal-containing Polymers," Wiley-VCH, 2004; exemplary silicon-containing molecules and additives such as organosilicates include those disclosed by E. M. Freer, L. E. Krupp, W. D. Hinsberg, P. M. Rice, J. L. Hedrick, J. N. Cha, R. D. Miller, and H. C. Kim in "Oriented mesoporous organosilicate thin films," *Nano Letters*, vol. 5, 2014 (2005); and exemplary metal-containing molecules and additives include those disclosed by Jinan Chai, Dong Wang, Xiangning Fan, and Jillian M. Buriak, "Assembly of aligned linear metallic patterns on silicon," *Nature Nanotechnology*, vol. 2, p. 500, (2007).

Exemplary materials for the first polymeric block component and the second polymeric block component are described in U.S. Pat. No. 7,605,081 to Yang et al., issued on Oct. 20, 2009, the contents of which are incorporated herein by reference. Specific examples of self-assembling block copolymers may include, but are not limited to: polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA). Other exemplary block copolymers that are contemplated for use in the present method include diblock or triblock copolymers such as, poly(styrene-b-alkenyl aromatics), poly(styrene-b-(ethylene-propylene)), poly(ethylene oxide-b-caprolactone), poly(styrene-b-t-butyl (meth)acrylate), poly (methyl methacrylate-b-t-butyl methacrylate), poly(ethylene oxide-b-propylene oxide), poly(styrene-b-tetrahydrofuran), poly(styrene-b-dimethylsiloxane), poly(vinyl pyridine-b-dimethylsiloxane), poly(ethylene oxide-b-dimethylsiloxane), poly(methyl methacrylate-b-dimethylsiloxane), poly(isoprene-b-dimethylsiloxane), poly(isoprene-b-vinyl pyridine), partially epoxidized poly(styrene-b-isoprene) poly (butadiene-b-vinyl pyridine), poly(trimethylsilyl styrene-b-lactic acid), poly(styrene-b-lactic acid), poly(styrene-b-hydroxystyrene), poly(styrene-b-acrylic acid), poly(ethylene oxide-b-hydroxystyrene), poly(methyl methacrylate-b-vinyl pyridine), poly(ethylene oxide-b-methyl methacrylate-b-styrene), poly(styrene-b-isoprene-b-ethylene oxide), poly(methyl methacrylate-b-styrene-b-methyl methacrylate), poly (isoprene-b-styrene-b-ferrocenyldimethylsilane), poly (styrene-b-trimethylsilyl styrene-b-styrene) or a combination including at least one of the foregoing block copolymers.

The self-assembling material is first dissolved in a suitable solvent system to form a self-assembling material solution, which is then applied over the chemical pattern layer (32, 33) to form the self-assembling material layer 45L. The solvent system used for dissolving the self-assembling material and forming the self-assembling material solution may include any suitable solvent, which can include, but is not limited to: toluene, propylene glycol monomethyl ether acetate (PGMEA), propylene glycol monomethyl ether (PGME), ethoxyethyl propionate, anisole, ethyl lactate, 2-heptanone, cyclohexanone, amyl acetate, n-butyl acetate, γ-butyrolactone (GBL), and acetone. The self-assembling material is not a conventional photoresist that may be developed upon exposure to ultraviolet light or optical light. Also, the self-assembling material layer 45L is not a conventional low-k dielectric material.

Figure 3A:
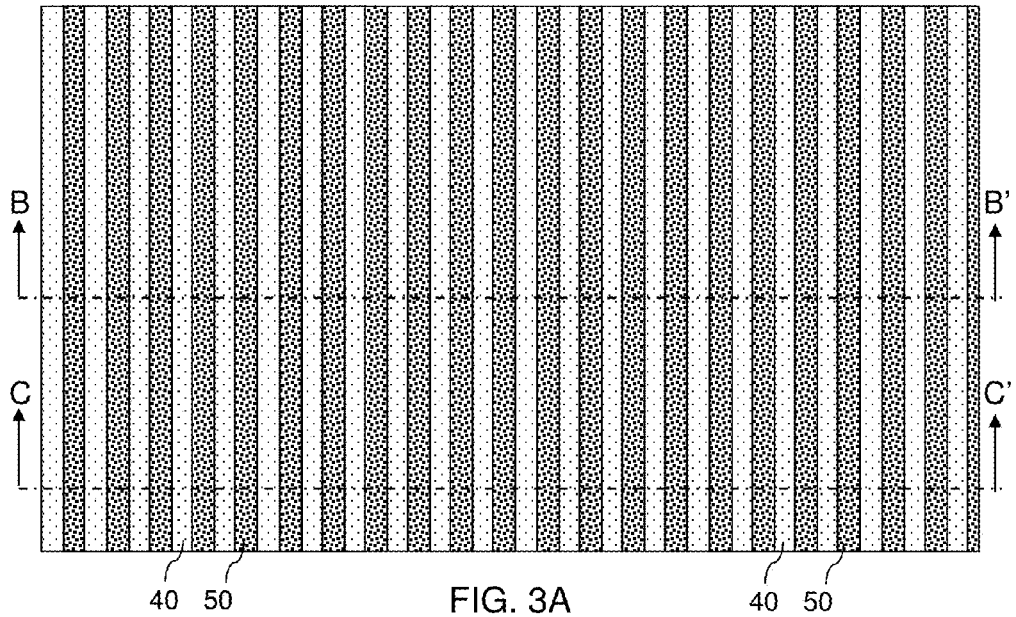
FIG. 3A is a top-down view of the first exemplary structure after directed self-assembly of the self-assembling material according to an embodiment of the present disclosure.
Figure 3B:
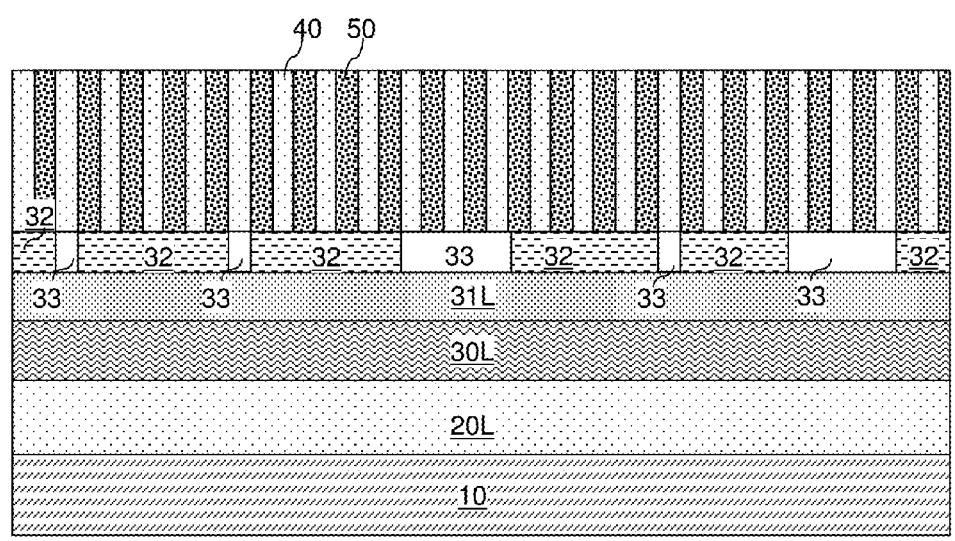
FIG. 3B is a vertical cross-sectional view of the first exemplary structure along the vertical plane B-B' of FIG. 3A.
Figure 3C:
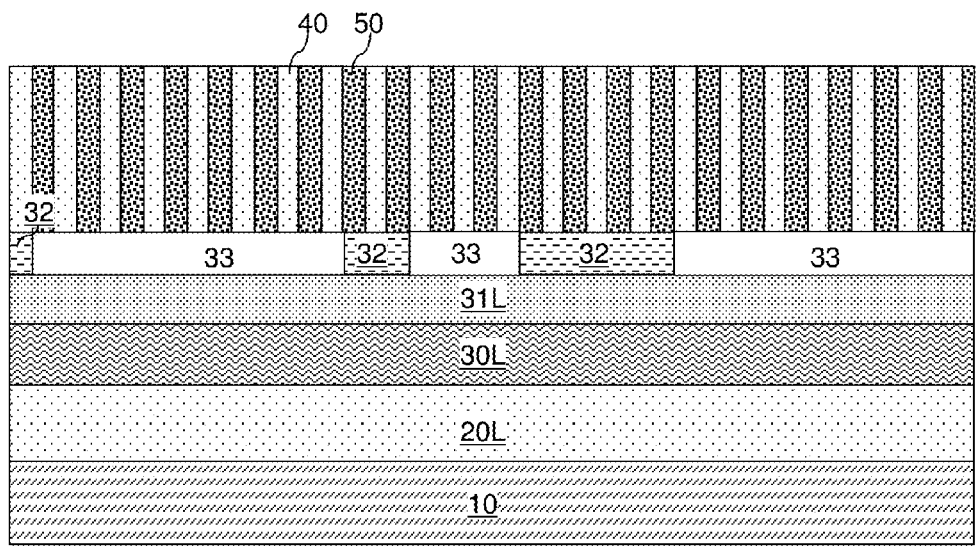
FIG. 3C is a vertical cross-sectional view of the first exemplary structure along the vertical plane C-C' of FIG. 3A.

Referring to FIGS. 3A, 3B, 3C, a nanoscale self-assembled self-aligned structure is formed over chemical pattern layer (32, 33) by phase separation of the first and second polymeric block components. The phase separation of the polymeric block components can be achieved, for example, by annealing at an elevated temperature. Through chemical epitaxy, self-alignment of first and second domains of the self-assembling material to the alignment-conferring prepattern portions can be induced. The nanoscale self-assembled self-aligned structure is aligned to the alignment-conferring prepattern portions 33D, and is herein referred to as a "self-aligned assembly."

In one embodiment, the self-assembling layer 45L is annealed by flash lamp, laser spike annealing, microwave annealing, or thermal annealing at an elevated temperature to form first domains 40 including the first polymeric block component and second domains 50 including the second polymeric block component. The anneal may be performed, for example, at an elevated temperature from about 50° C. to about 300° C. for a duration from 30 seconds to about 48 hours. The self-assembling layer 45L can also be annealed by exposure to solvent vapors at a controlled vapor pressure at room temperature or elevated temperature, also known as solvent vapor annealing, to form first domains 40 including the first polymeric block component and second domains 50 including the second polymeric block component. The anneal may be performed, for example, between temperatures ranging from 10° C. to about 100° C. for a duration from 30 seconds to about 48 hours. In one embodiment, the solvent anneal may be performed in which the self-assembling material is simultaneously subjected to microwave radiation.

Specifically, the nanoscale self-assembled self-aligned structure is self-aligned to the alignment-conferring prepattern portions 33D (See FIG. 1). The size and density of the at least one masking feature prepattern portions 33S (See FIG. 1) can be selected such that the at least one masking feature prepattern portions 33S do not substantially interfere with the alignment of the first domains 40 and the second domains 50 to the alignment-conferring prepattern portions 33D. Thus, portions of the self-assembling material over the at least one masking feature prepattern portions 33S self-align to the domains aligned with the alignment-conferring prepattern portions 33D.

In one embodiment, the chemical composition of the self-assembling material layer 45L can be such that the immiscibility of the first and second polymeric block components enable self assembly of the first polymeric block component into primary lamellar structures of the first domains 40 and the second polymeric block component assembles into complementary lamellar structures of the second domains 50. The first domains 40 constitute the primary lamellar structures including the first polymeric block component, and the second domains 50 constitute the complementary lamellar structures including the second polymeric block component.

In one embodiment, the first polymeric block component can be poly(methyl methacrylate) (PMMA), and the second polymeric block component can be polystyrene (PS). In this case, the sum of the first uniform width of the primary lamellar structures and the second uniform width of the complementary lamellar structures can be about 25 nm.

In one embodiment, each domain in the self-aligned assembly (40, 50) can be substantially perpendicular to the top surface of the orientation control material portion 32. Without such an orientation control material, the domains of the polymeric block components tend to orient parallel to the top surface of an underlying material layer (31L, 30L, 20L, or 10).

In one embodiment, the first and second polymeric block components form lamellar structures having substantially vertical interfaces thereamongst that are parallel to lengthwise direction of the alignment-conferring prepattern portions 33D after alignment. In other words, each of the first domains 40 and the second domains 50 can be a lamellar structure perpendicular to the substrate surface.

In one embodiment, the first and second polymeric block components can form alternating chemically distinct domains having a first width and a second width, respectively. In other words, the first domains 40 can have the first width, and the second domains can have the second width. In this case, the characteristic pitch can be the sum of the first width and the second width. The first and second polymeric block components can be repeated at least twice with the characteristic pitch along a horizontal direction perpendicular to substantially vertical interfaces between the chemically distinct domains.

In one embodiment, the prepattern includes a material having a greater affinity to one of the first or second polymeric block components than to the other of the first or second polymeric block components. In one embodiment, the prepattern includes a material having a greater affinity to the first polymeric block components than to the second polymeric block component. In another embodiment, the prepattern includes a material having a greater affinity to the second polymeric block components than to the first polymeric block component.

In one embodiment, the uniform width of some of the alignment-conferring prepattern portions 33D can be in a range from 0.7 times the width of the domain that overlies each center portion of such alignment-conferring prepattern portions 33D to 1.3 times the width of the domain that overlies each center portion of such alignment-conferring prepattern portions 33D. Thus, the uniform width of a set of alignment-conferring prepattern portions 33D can be in a range from 0.7 times a width of a chemically distinct domain of the one of the first polymeric block components or the second polymeric block components to 1.3 times the width of the chemically distinct domain of the one of the first polymeric block components or the second polymeric block components.

In one embodiment, the uniform width of the alignment-conferring prepattern portions 33D can be in a range from 1.05 times the unit distance to 1.95 times the unit distance. In such cases, the center of the domain not possessing preferential chemical affinity for the prepattern substantially overlies the center of the alignment-conferring prepattern portions 33D.

In one embodiment, the interface between the first domains 40 and the second domains 40 can be substantially vertical, i.e., perpendicular to the plane of the top surface of the orientation control material portion 32. Because the at least one masking feature prepattern portions 33S of the prepattern material region 33 do not substantially affect the self-assembly of the self-assembling material, and the alignment-conferring prepattern portions 33D predominantly determine the self-alignment of the self-assembling material upon phase separation, the interfaces between the first domains 40 and the second domains 50 can be substantially vertical over the at least one masking feature prepattern portions 33S. In this case, substantially vertical interfaces between the first domains 40 and the second domains 50 can straddle one or more of the at least one masking feature prepattern portion 33S.

In one embodiment, some first domains 40 and some second domains 50 overlying the at least one masking feature prepattern portions 33S do not self-align with the domains aligned with alignment-conferring prepattern portions 33D. Portions of these domains not self-aligned with the domains aligned with alignment-conferring prepattern portions 33D may be substantially perpendicular to the substrate but not parallel with the lengthwise direction of the alignment-conferring prepattern portions 33D. Other portions of these domains not self-aligned with the domains aligned with alignment-conferring prepattern portions 33D may be oriented such that interfaces between the first domains 40 and the second domains 50 are not substantially vertical, or in other words perpendicular to the substrate. The orientation with respect to the substrate of these portions may be parallel or may be intermediate between parallel and perpendicular orientations. Thus, these domains are not self-aligned to the perpendicular domains aligned with the alignment-conferring prepattern portions 33D. In some cases, both the aforementioned portions not self-aligned with the domains aligned with alignment-conferring prepattern portions 33D may coexist overlying at least one masking feature prepattern portions 33S.

In one embodiment, the first width of the first domains 40 can be in a range from 1 nm to 25 nm, and the second width of the second domains 50 can be in a range from 1 nm to 25 nm. In one embodiment, the sum of the first width and the second width can be in a range from 2 nm to 50 nm.

Figure 4A:
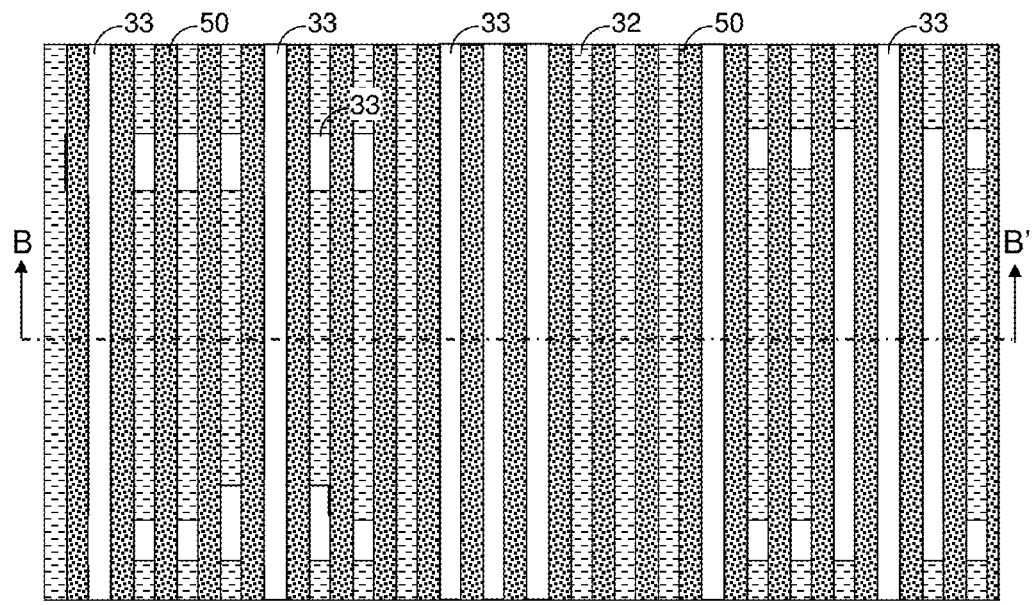
FIG. 4A is a top-down view of the first exemplary structure after selective removal of a first polymeric block component selective to a second polymeric block component without substantially etching the chemical pattern layer according to an embodiment of the present disclosure.
Figure 4B:
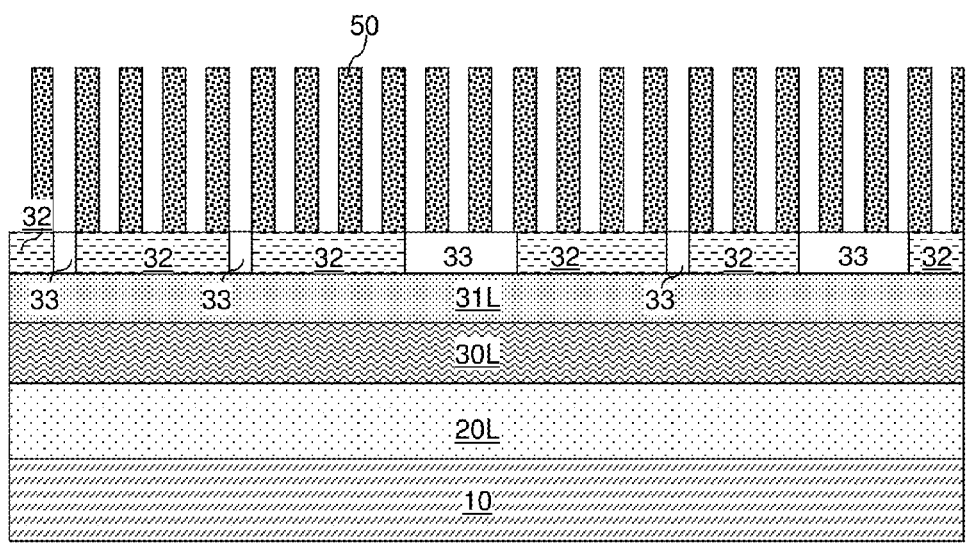
FIG. 4B is a vertical cross-sectional view of the first exemplary structure along the vertical plane B-B' of FIG. 4A.

Referring to FIGS. 4A and 4B, one type of domains is removed selective to the other type of domains. For example, the first domains 40 can be removed selective to second domains 50. In this case, the first polymeric block component is removed selective to the second polymeric block component without substantially etching the chemical pattern layer (32, 33) including the prepattern material region 33 and the orientation control material portion 32. The removal of the first domains 40 selective to the second domains 50 can be performed, for example, by an anisotropic etch that removes the first polymeric block component selective to the second polymeric block component. In one embodiment, the second domains 50 can be removed selective to first domains 40. In this case, the second polymeric block component is removed selective to the first polymeric block component without substantially etching the chemical pattern layer (32, 33) including the prepattern material region 33 and the orientation control material portion 32. The removal of the second domains 50 selective to the first domains 40 can be performed, for example, by an anisotropic etch that removes the second polymeric block component selective to the first polymeric block component.

A second pattern including the second domains 50 is formed over the chemical pattern layer (32, 33) including the prepattern material regions 33 and the orientation control material regions 32. The second domains 50 constitute a set of protruding structures that protrude above the top surface of the chemical pattern layer (32, 33). The areas in which the second domains 50 are present, or the areas in which the second domains 50 are absent, but not both, define the area of the second pattern. The prepattern and the second pattern can have a non-zero overlapping area. In other words, the intersection of the area of the prepattern and the area of the second pattern is non-zero, and corresponds to the areas in which portions of the second pattern overlie portions of the prepattern material region 33.

Figure 5A:
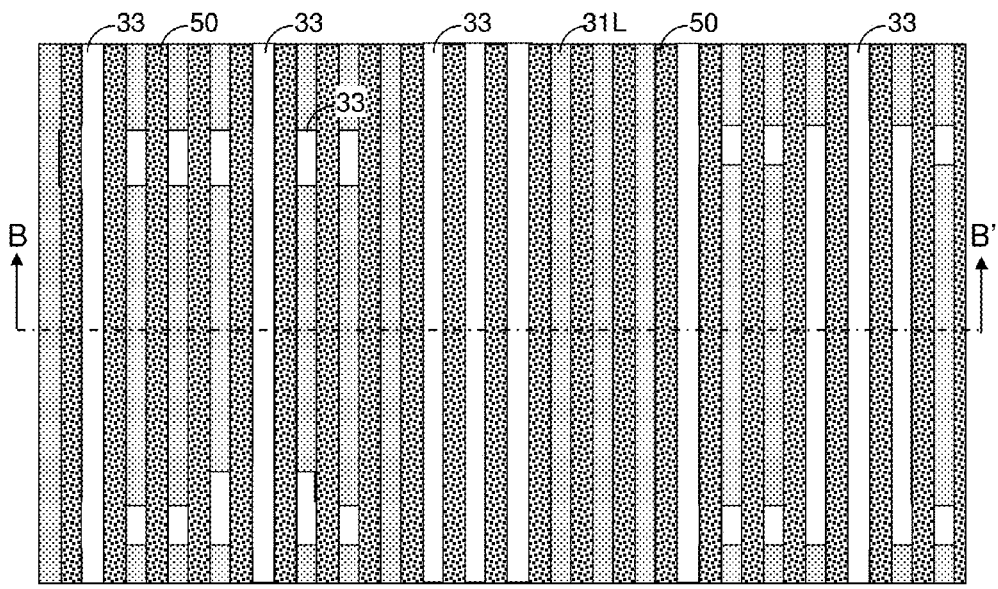
FIG. 5A is a top-down view of the first exemplary structure after transfer of a second pattern in the second polymeric block component into the orientation control material according to an embodiment of the present disclosure.
Figure 5B:
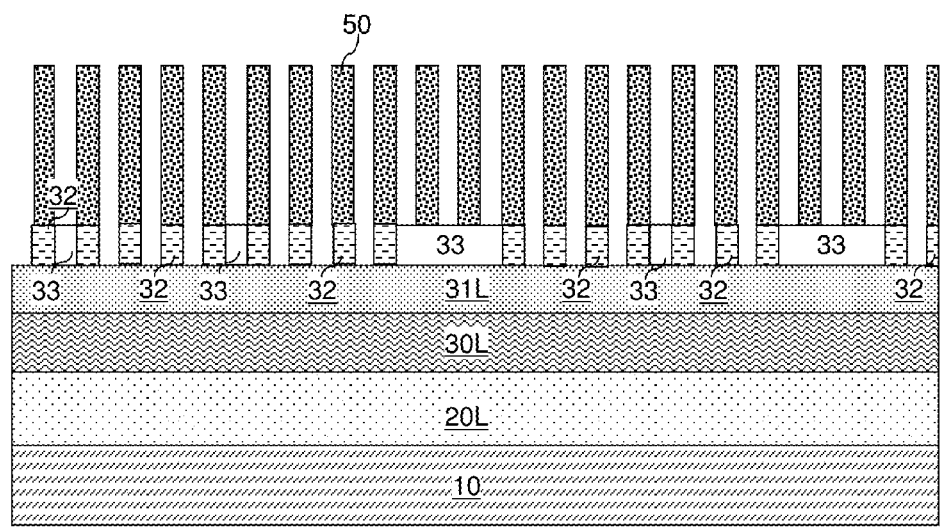
FIG. 5B is a vertical cross-sectional view of the first exemplary structure along the vertical plane B-B' of FIG. 5A.

FIGS. 5A and 5B refer to an embodiment of the present disclosure in which the prepattern material includes an etch-resistant material. This prepattern including etch-resistant material is herein referred to as the "etch-resistant prepattern." Portions of the second pattern not intersecting the prepattern can be transferred into the orientation control material portion 32, for example, by an anisotropic etch to form a patterned orientation control material portion 32. Specifically, the orientation control material portion 32 can be etched employing the second polymeric block components as an etch mask. The etch used to transfer the second pattern into the orientation control material portion 32 can be the same etch used to selectively remove the first domains 40, or may be a subsequent etch. The union of the patterned orientation control material portion 32 and the prepattern include the composite pattern.

Figure 6A:
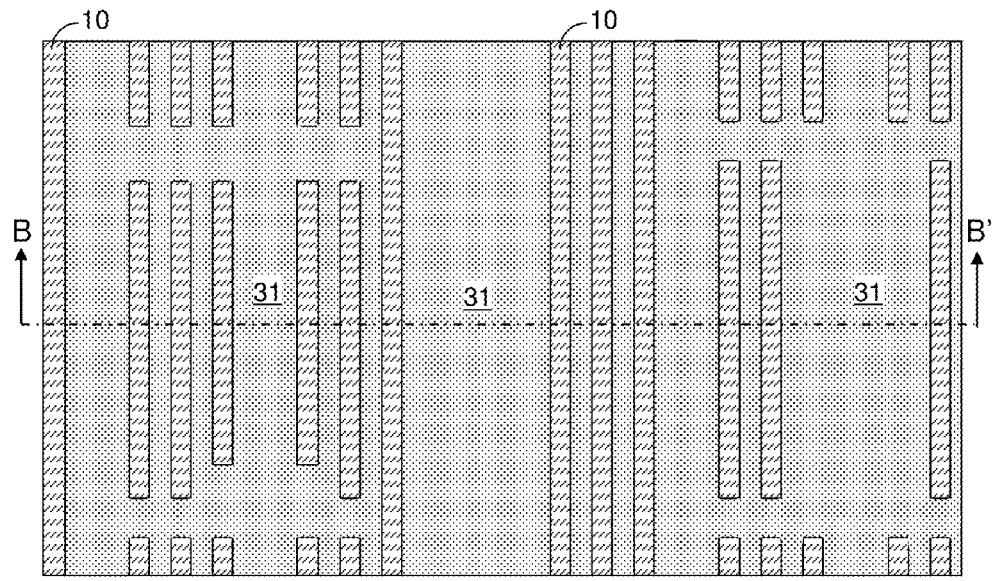
FIG. 6A is a top-down view of the first exemplary structure after transfer of the composite pattern of the prepattern and the second pattern into a hard mask layer, an organic planarization layer (OPL), and a material layer according to an embodiment of the present disclosure.
Figure 6B:
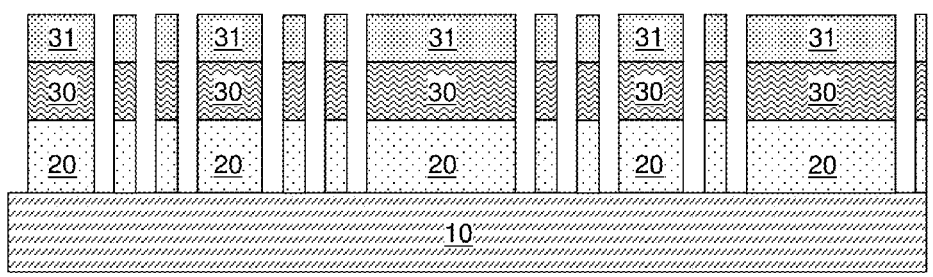
FIG. 6B is a vertical cross-sectional view of the first exemplary structure along the vertical plane B-B' of FIG. 6A.

Referring to FIGS. 6A and 6B, the composite pattern can be transferred into the hard mask layer 31L, the organic planarization layer (OPL) 30L, and the material layer 20L by at least one anisotropic etch. A patterned hard mask layer 31, a patterned OPL 30, and a patterned material layer 20 may be formed. The second block polymers 50, the etch-resistant prepattern material region 33, and the orientation control material portion 32 can be removed during the at least one anisotropic etch, or may be removed selective to the patterned hard mask layer 31 after patterning the hard mask layer 31L. In one embodiment, the patterned orientation control material portion 32 and/or the hard mask layer 31L may be consumed during the at least one anisotropic etch.

Figure 7A:
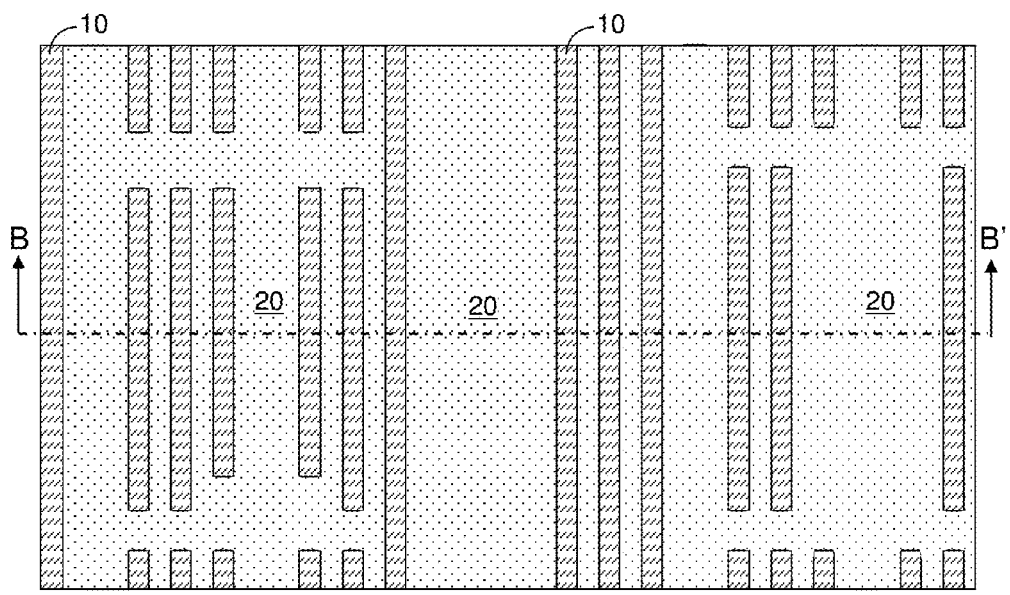
FIG. 7A is a top-down view of the first exemplary structure after removal of the hard mask layer and the OPL according to an embodiment of the present disclosure.
Figure 7B:
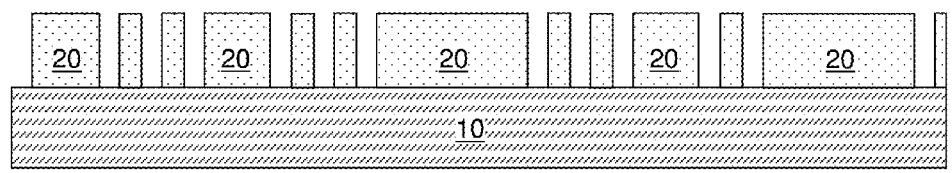
FIG. 7B is a vertical cross-sectional view of the first exemplary structure along the vertical plane B-B' of FIG. 7A.

Referring to FIGS. 7A and 7B, the patterned hard mask layer 31 and/or the patterned OPL 30 may be removed, for example, during the at least one anisotropic etch or during at least one subsequent etch. In one embodiment, the at least one subsequent etch can include a wet etch that dissolves the material of the patterned OPL 30. The area of the patterned material layer 20 corresponds to the area of the composite pattern.

Figure 8A:
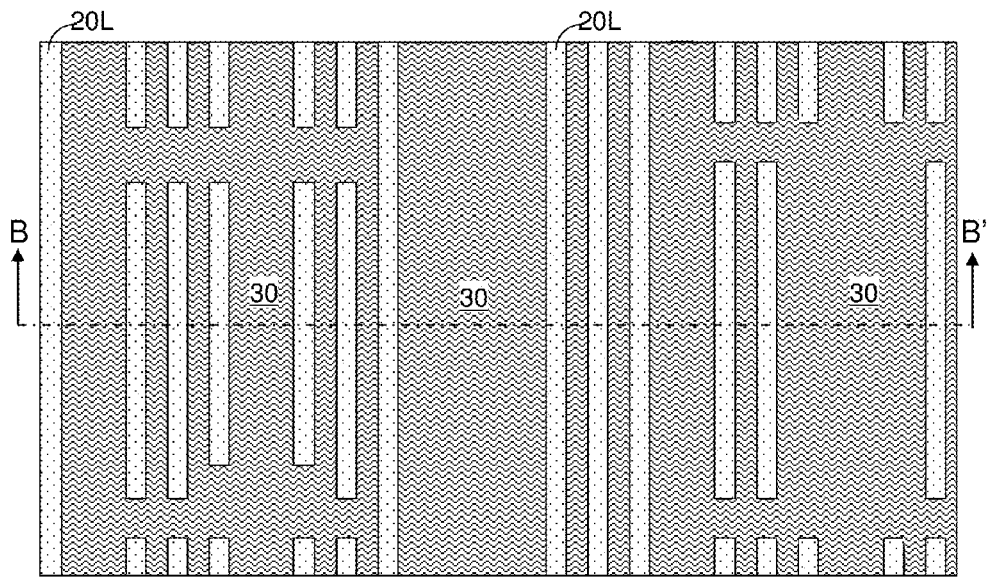
FIG. 8A is a top-down view of a second exemplary structure after transfer of the composite pattern into an organic planarization layer (OPL) and removal of a hard mask layer according to an embodiment of the present disclosure.
Figure 8B:
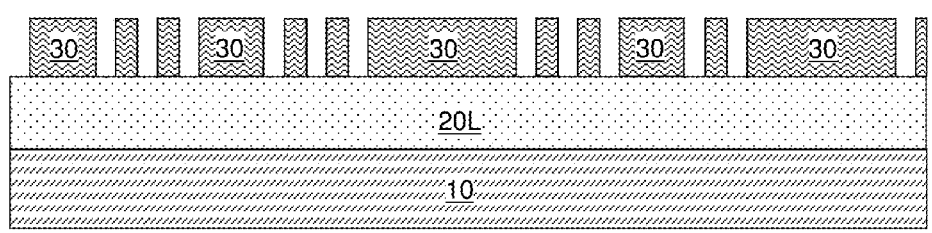
FIG. 8B is a vertical cross-sectional view of the second exemplary structure along the vertical plane B-B' of FIG. 8A.

Referring to FIGS. 8A and 8B, a second exemplary structure according to an embodiment of the present disclosure can be derived from the first exemplary structure of FIGS. 5A and 5B by transferring the composite pattern through the hard mask layer 31L and the OPL 30L without transferring the composite pattern into the material layer 20L, and by subsequently removing any remaining portions of the second block polymers 50, the etch-resistant prepattern material region 33, the orientation control material portion 32, and the patterned hard mask layer 31. The etch chemistry employed for removal of the patterned hard mask layer 31 can be selected such that the patterned hard mask layer 31 is removed selective to the patterned OPL 30.

Figure 9A:
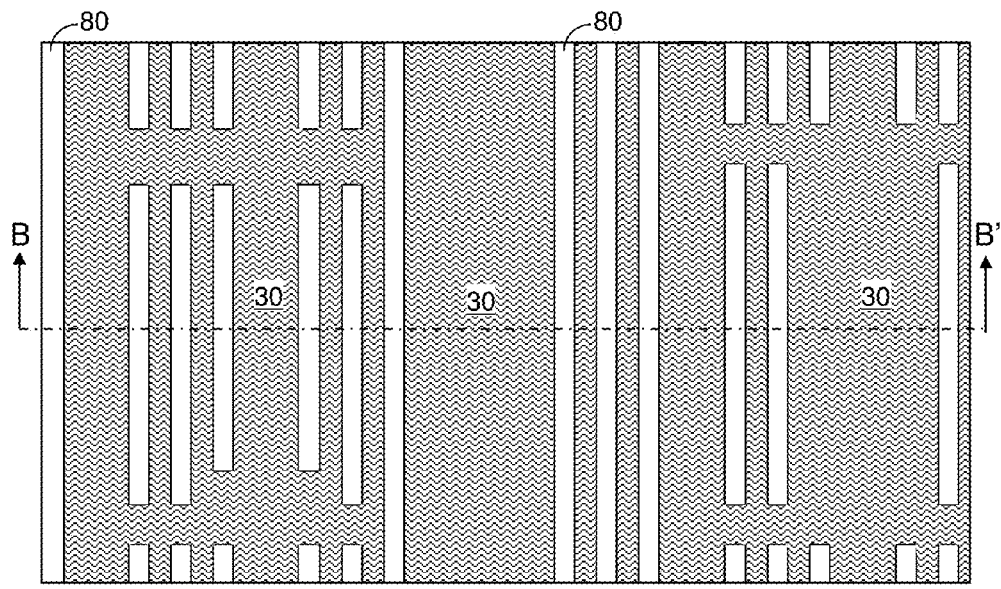
FIG. 9A is a top-down view of the second exemplary structure after formation of fill material portions in a complementary pattern according to an embodiment of the present disclosure.
Figure 9B:
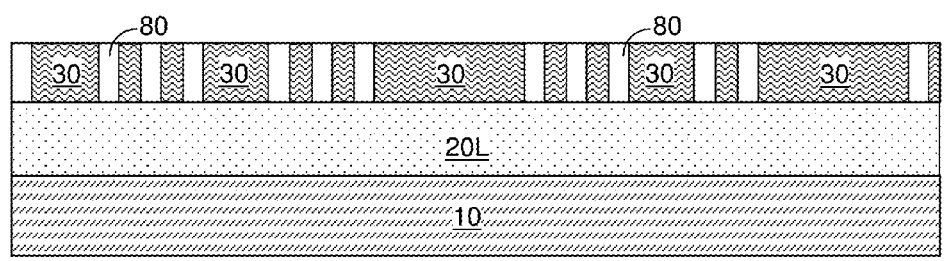
FIG. 9B is a vertical cross-sectional view of the second exemplary structure along the vertical plane B-B' of FIG. 9A.

Referring to FIGS. 9A and 9B, a complementary pattern layer 80 is formed by depositing a fill material in the trenches within the patterned OPL 30. The fill material is inorganic or material otherwise resistant to etch chemistry effective in etching the OPL 30. The complementary pattern layer 80 includes fill material portions, which can include, for example, a spin-on dielectric (SOD) material, an inorganic resist, an inorganic ARC, or a sol-gel containing inorganic material that is applied into the trenches in the patterned OPL 30. The fill material can be any material that is primarily inorganic or can be converted to a primarily inorganic material and can be applied by spin-coating as known in the art. In one embodiment, the fill material is JSR NFC IRM-007-6. The fill material can be applied to a height that does not exceed the topmost surface of the patterned OPL 30. In one embodiment, the height of the top surface of the fill material portions can be coplanar with the top surface of the hard mask portions 31. In another embodiment, the height of the top surface of the fill material portions can be located at a horizontal plane that is lower than the top surface of the hard mask portions. In another embodiment, the height of the top surface of the fill material may be located at a horizontal plane that is higher than the topmost surface of the OPL 30 and subsequently reduced to not exceed the height of the topmost surface of the patterned OPL 30.

The fill material portions of the complementary pattern layer 80 include a pattern that is the complementary pattern of the composite pattern. In other words, the area of the complementary pattern layer 80 is the complement of the area in which the composite pattern is present as seen in a top-down view. It is understood that the complement of the composite pattern is defined within the area of the OPL 30L as originally formed on the substrate 10.

The complementary pattern layer 80 and the patterned OPL 30 collectively constitute a pattern-containing layer (80, 30), which can overlie the entirety of the material layer 20L. The pattern-containing layer (80, 30) is complementarily filled with a matrix of the patterned OPL 30 and the fill material portions that are embedded therein.

Figure 10A:
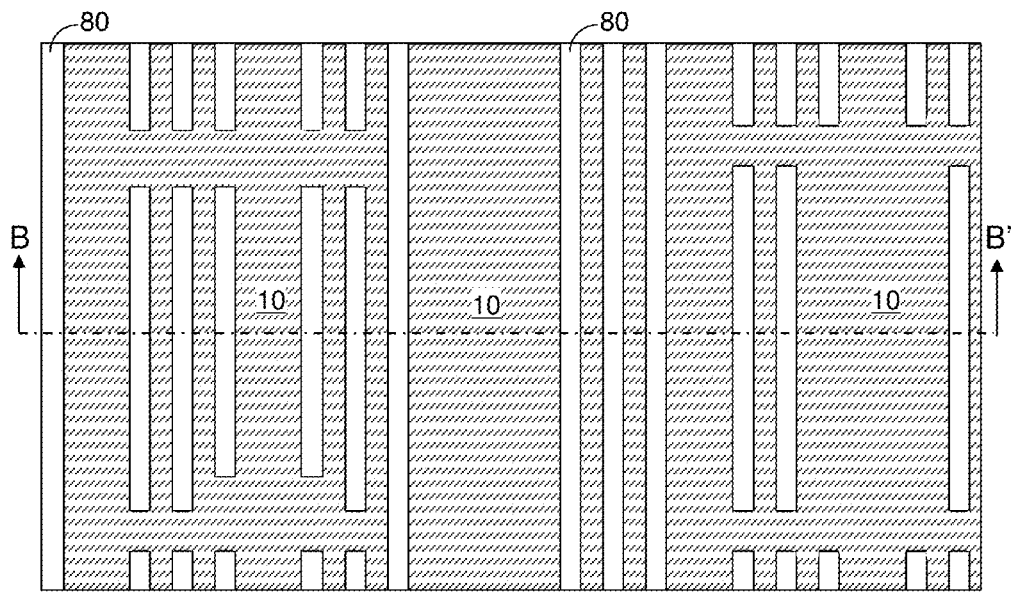
FIG. 10A is a top-down view of the second exemplary structure after transfer of the complementary pattern into a material layer by an etch according to an embodiment of the present disclosure.
Figure 10B:
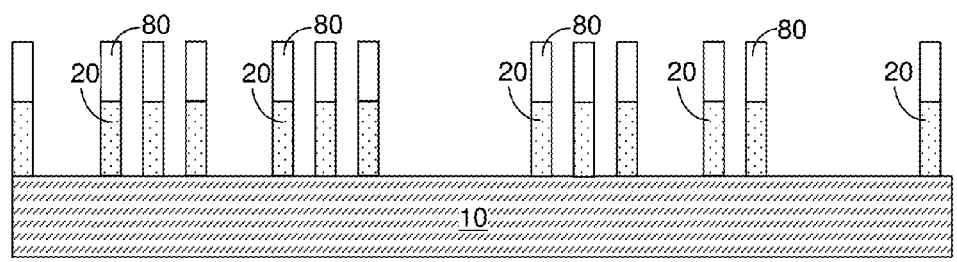
FIG. 10B is a vertical cross-sectional view of the second exemplary structure along the vertical plane B-B' of FIG. 10A.

Referring to FIGS. 10A and 10B, the patterned OPL 30 is removed selective to the complementary pattern layer 80, for example, by a wet etch. In one embodiment, the patterned OPL 30 is removed selectively to the complementary pattern layer 80 by an anisotropic dry etch. Subsequently, the complementary pattern in the complementary pattern layer 80 can be transferred into the material layer 20L by an etch to form a patterned material layer 20. The etch can be an anisotropic etch. The pattern in the patterned material layer 20 is the complementary pattern, i.e., the area of the patterned material layer 20 can be the same as the area of the complementary pattern in the complementary pattern layer.

Figure 11A:
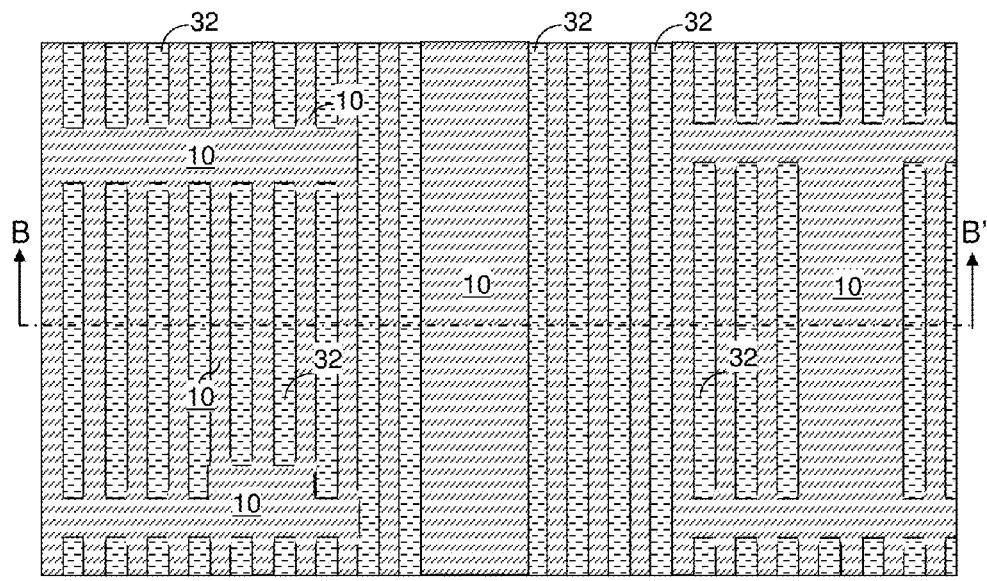
FIG. 11A is a top-down view of a variation of the first exemplary structure after transfer of a variant composite pattern of the prepattern and a variant second pattern into an organic planarization layer (OPL) and a material layer according to an embodiment of the present disclosure.
Figure 11B:
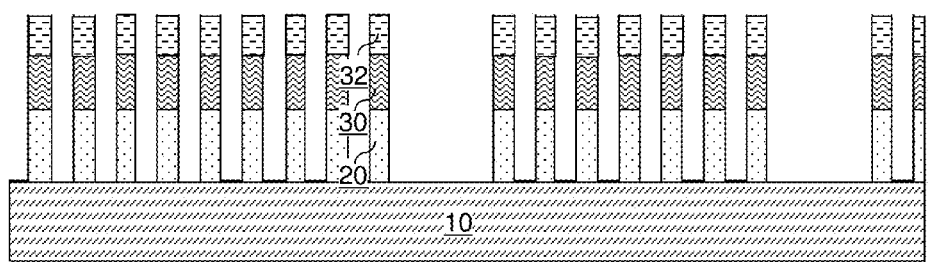
FIG. 11B is a vertical cross-sectional view of the variation of the first exemplary structure along the vertical plane B-B' of FIG. 11A.

FIGS. 11A and 11B refer to a variant composite pattern that can be transferred into orientation control material portion 32, the organic planarization layer (OPL) 30L and the material layer 20L by at least one anisotropic etch. The variant composite pattern can be derived from a variation of the first exemplary structure in FIGS. 5A and 5B according to an embodiment of the present disclosure. In this embodiment, the orientation control material includes an etch-resistant material, and the hard mask layer 31L is not present. This orientation control material including an etch-resistant material is herein referred to as the "etch-resistant orientation control material." A patterned etch-resistant orientation control material portion 32, a patterned OPL 30, and a patterned material layer 20 may be formed. The etch-resistant orientation control material can be patterned by an etch that is different from the etch used to remove the first block polymers 40. The prepattern material regions 33 can be partially or completely removed during the etch used to remove the first block polymers 40. The second block polymers 50 and the prepattern material region 33 can be removed during the at least one anisotropic etch, or may be removed selective to the patterned etch-resistant orientation control material portion 32 after patterning the etch-resistant orientation control material portion 32. The trenches occupying areas where the first domains 40 were removed according to the process steps of FIGS. 4A and 4B can include a variant second pattern. The pattern of trenches in the orientation control material portion 32, the OPL 30, and the patterned material layer 20, is a variant composite pattern including the union of the prepattern and the variant second pattern. In one embodiment, the patterned etch-resistant orientation control material portion 32 may be consumed during the at least one anisotropic etch.

Figure 12A:
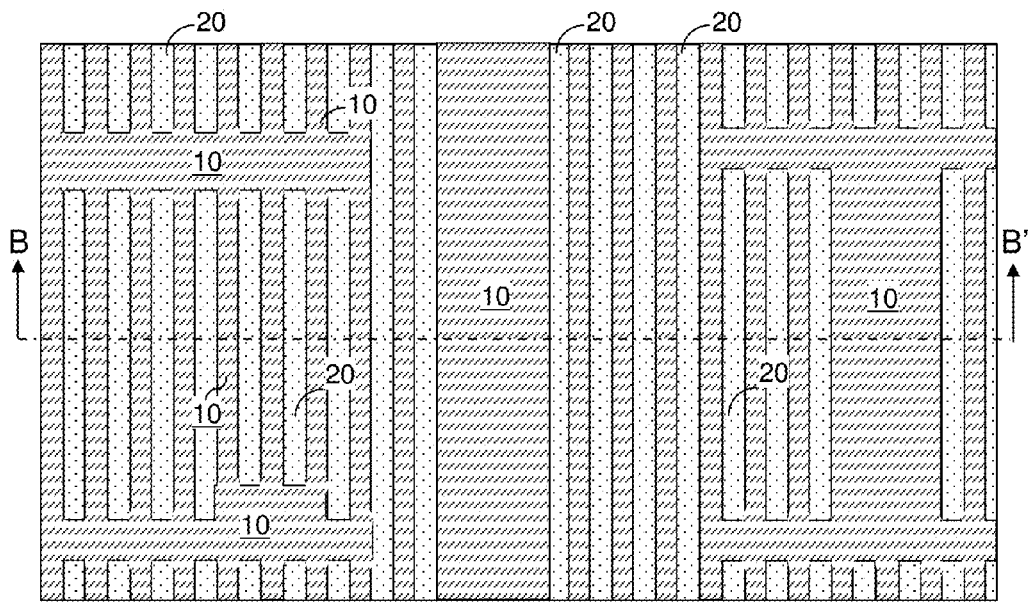
FIG. 12A is a top-down view of the variation of the first exemplary structure after removal of the chemical pattern layer and an OPL according to an embodiment of the present disclosure.
Figure 12B:
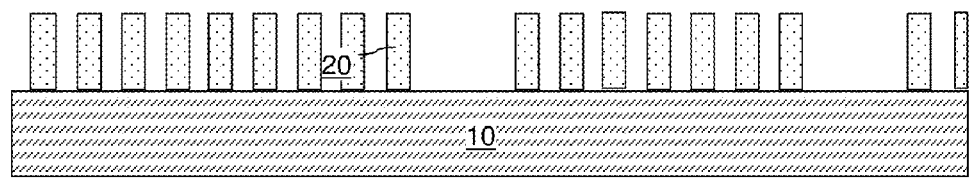
FIG. 12B is a vertical cross-sectional view of the variation of the first exemplary structure along the vertical plane B-B' of FIG. 12A.

Referring to FIGS. 12A and 12B, the patterned etch-resistant orientation control material and/or the patterned OPL 30 may be removed, for example, during the at least one anisotropic etch or during at least one subsequent etch. In one embodiment, the at least one subsequent etch can include a wet etch that dissolves the material of the patterned OPL 30. The pattern of trenches in the patterned material layer 20 corresponds to the variant composite pattern.

In one embodiment, customization of hole or post patterns can be performed using DSA of self-assembling materials forming hexagonally-packed substrate-perpendicular cylindrical first domains having a characteristic diameter in a second polymeric matrix domain. A prepattern may be used to align this array of cylinders through chemical epitaxy. Selective removal of the cylindrical domains creates a hole pattern that may be transferred selectively in either the prepattern material regions or the orientation control material regions. Alternatively, selective removal of the polymer matrix not including the perpendicular cylinders creates a post pattern that may be transferred selectively in either the prepattern material regions or the orientation control material regions.

Figure 13:
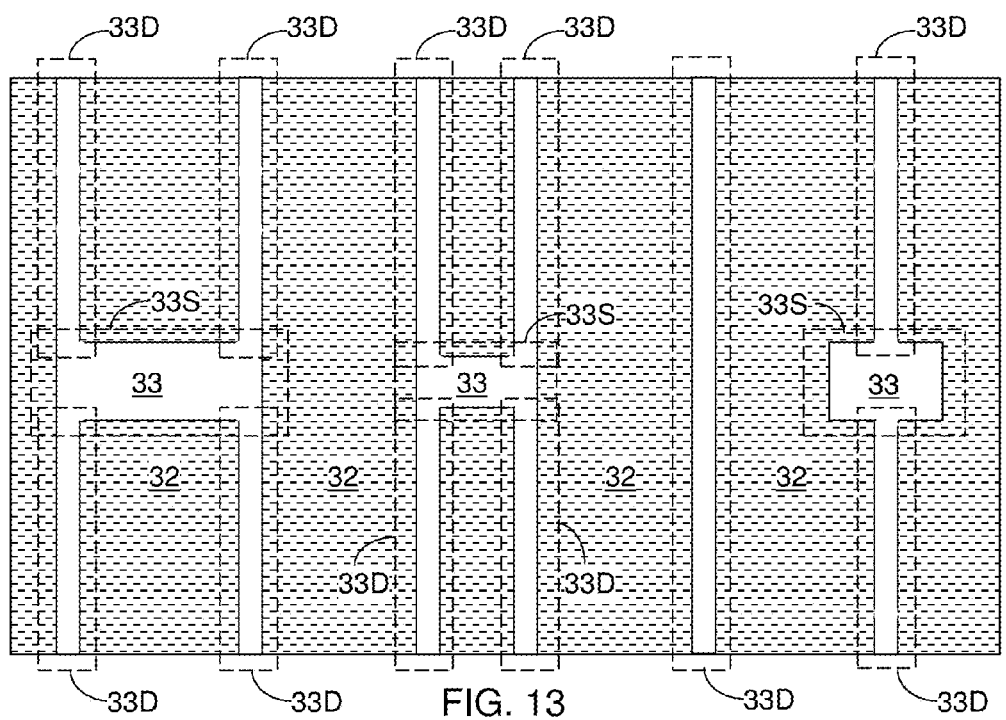
FIG. 13 is a top-down view of a second exemplary chemical pattern layer according to an embodiment of the present disclosure.

FIG. 13 depicts a second exemplary chemical pattern layer (32, 33) in plan view, according to an embodiment of the present disclosure. The prepattern 33 includes alignment-conferring prepattern portions 33D and at least one masking feature prepattern portion 33S. Regions not occupied by the prepattern material are occupied by regions of the top surface of the orientation control material portion 32. Either the prepattern material or the orientation control material, but not both, includes an etch-resistant material. This prepattern material may be used, for example, in the DSA of substrate-perpendicular cylindrical domains in a second matrix domain.

In one embodiment, the alignment-conferring prepattern portions 33D include parallel lengthwise strips having a uniform width and having lengthwise center lines located at positions laterally separated from one another by integer multiples of the unit distance. In one embodiment, the uniform width of the lengthwise strips of the alignment-conferring prepattern portions can be from 0.7 to 1.3 times the characteristic diameter of the cylindrical domains which have preferential chemical affinity for the prepattern material. As used herein, the uniform width of the lengthwise strips of the alignment-conferring prepattern portion 33D is substantially equal to the characteristic diameter of the domains for which they have preferential affinity if one of the two dimensions differs by less than 30% relative to another of the two dimensions.

The lengthwise center lines of the strips of the alignment-conferring features can be located at positions laterally separated from one another by the same integer multiple (e.g., three times) of a unit distance, or by different integer multiples (e.g., twice, three times, four times, and/or five times) of the unit distance. For example, the center lines of the strips in the alignment-conferring prepattern portions 33D as illustrated in FIG. 13 can be located at positions laterally separated from a center line of a neighboring strip, from left to right, by four times the unit distance, by four times the unit distance, by two times the unit distance, by four times the unit distance, and by four times the unit distance, respectively.

In one embodiment, the lengthwise strips of the alignment-conferring prepattern portions can be non-contiguous along their lengthwise direction. The non-contiguous lengthwise strips are not limited in their aspect ratio. It is noted that the integer multiple of the unit distance of the distance of lateral separation between the lengthwise center lines of two strips of the alignment-conferring prepattern portions 33D can include zero. Thus, two strips with lengthwise centerlines laterally separated by an integer multiple of the unit distance equal to zero effectively share the same lengthwise center line. Strips of the alignment-conferring prepattern portion 33D may be separated from each other along the lengthwise direction of the alignment-conferring prepattern portion 33D by a variety of distances provided the alignment-conferring qualities of the prepattern are maintained.

In one embodiment, the at least one masking feature prepattern portions 33S include areas of the prepattern having a width greater than the characteristic diameter of the domains for which the prepattern material has preferential chemical affinity. In cases where this criterion is not met, the center lines along the lengthwise direction of the at least one masking feature prepattern portions 33S are located at positions laterally separated from the lengthwise center lines of alignment-conferring prepattern portions by a distance different from an integer multiple of the unit distance.

In one embodiment, the at least one masking feature prepattern portions 33S include areas of the prepattern having a width greater than the characteristic diameter of the domains for which the prepattern material has preferential chemical affinity. In cases where this criterion is not met, the center lines along the lengthwise direction of the at least one masking feature prepattern portions 33S underlie the second matrix domain of the self-assembling material. That is, the lengthwise center lines of the at least one masking feature prepattern portions 33S do not underlie the cylindrical domains for which the prepattern material has preferential chemical affinity.

In another embodiment, the prepattern possesses a first axis in a plane parallel to the substrate and a second axis in the same plane parallel to the substrate. Alignment-conferring prepattern portions 33D include areas having widths substantially equal to the characteristic diameter of the cylindrical domains that have preferential chemical affinity for the prepattern material. These areas can have various shapes, including for example circles, ellipses, squares, rectangles, or polygons, and can be non-contiguous with each other. As used herein, the width of an area of the alignment-conferring prepattern portions 33D is the minimum dimension of the area in a plane parallel to the substrate surface that passes through the center point of the area. The centers of these prepattern areas are located at positions translated from each other by distances substantially equal to a combination of integer multiples of the unit distance along the direction of the first axis and integer multiples of the unit distance along the direction of the second axis. Thus, the center of an area of the alignment-conferring prepattern portions 33D can be translated from the center of another area of the alignment-conferring prepattern portions 33D by an integer multiple of the unit distance along the direction of the first axis and by an integer multiple of the unit distance along the direction of the second axis. In one embodiment the distance between centers of areas of the alignment-conferring prepattern portions can be from 0.9 to 1.1 times a combination of integer multiples of the unit distance along the direction of the first axis and integer multiples of the unit distance along the direction of the second axis. As used herein, the distance between centers of areas of the alignment-conferring prepattern portions are substantially equal to a combination of integer multiples of the unit distance along the direction of the first axis and integer multiples of the unit distance along the direction of the second axis if one of the two dimensions differs by less than 10% relative to another of the two dimensions. In one embodiment, the widths of the areas of the alignment-conferring prepattern portions 33D can be from 0.7 to 1.3 times the characteristic diameter of the cylindrical domains which have preferential chemical affinity for the prepattern material. As used herein, the width of the areas of the alignment-conferring prepattern portion 33D is substantially equal to the characteristic diameter of the domains for which they have preferential affinity if one of the two dimensions differs by less than 30% relative to another of the two dimensions. In one embodiment, the angle between the first and second axes can be from 54 to 66 degrees. As used herein, the angle between the first and second axes is substantially equal to 60 degrees if one of the two dimensions differs by less than 10% relative to another of the two dimensions. In one embodiment, the angle between the first and second axes can be from 114 to 126 degrees. As used herein, the angle between the first and second axes is substantially equal to 120 degrees if one of the two dimensions differs by less than 5% relative to another of the two dimensions.

In one embodiment, the at least one masking feature prepattern portions 33S include areas of the prepattern having a width greater than the characteristic diameter of the domains for which the prepattern material has preferential chemical affinity. As used herein, the widths of areas of the at least one masking feature prepattern portions 33S are greater than the characteristic diameter of domains for which the prepattern material has preferential chemical affinity if the at least one masking feature prepattern portion area widths are more than 30% larger. In cases where this criterion is not met, the centers of the at least one masking feature prepattern portions 33S are located at positions translated from alignment-conferring prepattern portions 33D by distances different from a combination of integer multiples of the unit distance along the direction of the first axis and integer multiples of the unit distance along the direction of the second axis. As used herein, the distance between centers of at least one masking feature prepattern portions 33S and centers of alignment-conferring prepattern portions 33D are different from a combination of integer multiples of the unit distance along the direction of the first axis and integer multiples of the unit distance along the direction of the second axis if one of the two dimensions differs by more than 10% relative to another of the two dimensions.

In one embodiment, the at least one masking feature prepattern portions 33S include areas of the prepattern having a width greater than the characteristic diameter of the domains for which the prepattern material has preferential chemical affinity. In cases where this criterion is not met, the centers of the at least one masking feature prepattern portions 33S underlie the second matrix domain of the self-assembling material. That is, the centers of the at least one masking feature prepattern portions 33S do not underlie the cylindrical domains for which the prepattern material has preferential chemical affinity.

The unit distance is determined by the distance of periodicity of self-aligned, self-assembling material domains. In one embodiment, the unit distance is selected to be substantially the same as the characteristic pitch. In another embodiment, the unit distance is selected to be in a range from 0.78 to 0.95 times the characteristic pitch. In another embodiment, the unit distance is selected to be in a range from 0.45 to 0.55 times the characteristic pitch. The unit distance can be from 2 nm to 50 nm, although lesser and greater unit distances can also be employed.

Figure 14A:
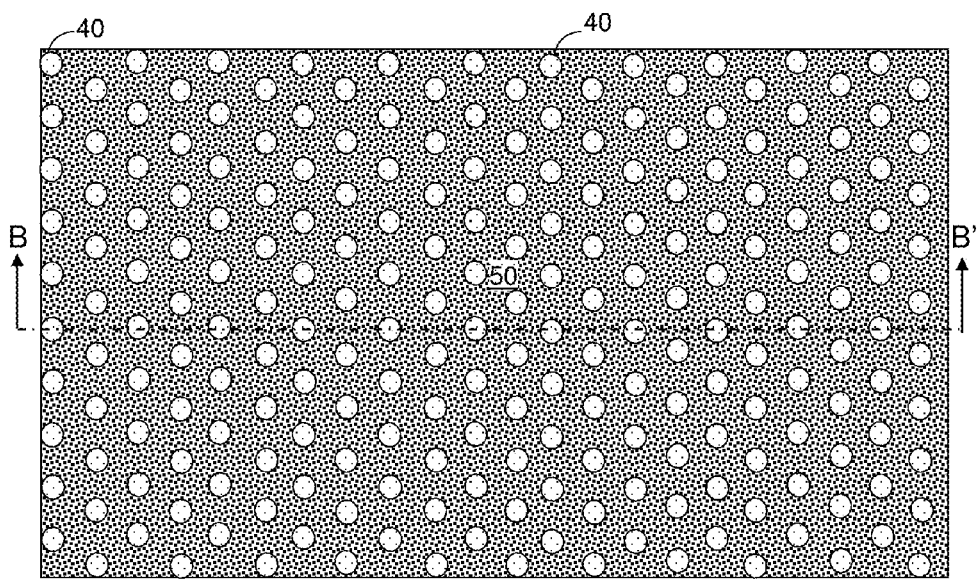
FIG. 14A is a top-down view of a third exemplary structure after directed self-assembly of the self-assembling material according to an embodiment of the present disclosure.
Figure 14B:
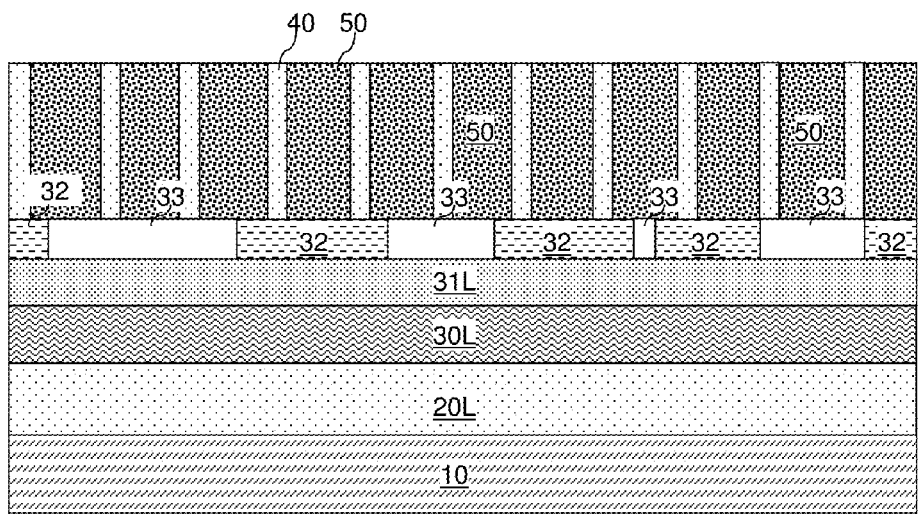
FIG. 14B is a vertical cross-sectional view of the third exemplary structure along the vertical plane B-B' of FIG. 14A.

Referring to FIGS. 14A and 14B, the processing steps of FIGS. 2A, 2B, 3A, 3B, and 3C are performed upon the second exemplary chemical pattern layer (32, 33) in FIG. 13. The material layers underneath the chemical pattern layer (32, 33), include a stack, from bottom to top, of a substrate 10, a material layer 20L, an organic planarization layer (OPL) 30L, a hard mask layer 31L. This stack, including the chemical pattern layer (32, 33), makes up a third exemplary structure according to an embodiment of the present disclosure. Any known self-assembling material can be employed provided that a first polymeric block component of the self-assembling material forms cylindrical domains and a second polymeric block component of the self-assembling material forms a polymeric matrix embedding the cylindrical domains.

In one embodiment, the prepattern material region 33 can include a material having a greater affinity to one of the first and second polymeric block components than to the other of the first and second polymeric block components. In one embodiment, the prepattern material region 33 can include a material having a greater affinity to the first polymeric block component than to the second polymeric block component. In this case, first block polymers 40 can be over the surfaces of the prepattern material region 33 as illustrated in FIGS. 14A and 14B. A second block polymer 50 can be the polymeric matrix embedding the first block polymers 40. In another embodiment, the prepattern material region 33 can include a material having a greater affinity to the second polymeric block component than to the first polymeric block component.

In one embodiment, interfaces between the cylindrical structures and the polymeric matrix can be substantially vertical, i.e., perpendicular to the plane of the top surface of the orientation control material portion 32.

In one embodiment, the cylindrical first domains 40 and the second matrix domain 50 form a hexagonally-packed cylindrical structures having substantially vertical interfaces thereamongst, where cylindrical domains repeat along the lengthwise direction of the alignment-conferring prepattern portions 33D with a spatial period given by the characteristic pitch after alignment. In other words, each of the first domains 40 can be a cylindrical structure perpendicular to the substrate surface. In another embodiment, the cylindrical first domains 40 and the second matrix domain 50 form a hexagonally-packed cylindrical structures having substantially vertical interfaces thereamongst, where cylindrical domains repeat along the direction perpendicular to the lengthwise direction of the alignment-conferring prepattern portions 33D in a plane parallel to the substrate with a spatial period given by twice the unit distance after alignment. In other words, each of the first domains 40 can be a cylindrical structure perpendicular to the substrate surface.

In another embodiment, the cylindrical first domains 40 and the second matrix domain 50 form a hexagonally-packed cylindrical structures having substantially vertical interfaces thereamongst, where cylindrical domains repeat along the direction of the first axis of the prepattern with a spatial period given by the unit distance after alignment, and cylindrical domains also repeat along the direction of the second axis of the prepattern with a spatial period given by the unit distance after alignment. In other words, each of the first domains 40 can be a cylindrical structure perpendicular to the substrate surface.

The processing steps of FIGS. 4A and 4B are performed to remove one type of domains selective to the other type of domains. The pattern formed by remaining self-assembled domains includes a second pattern. In one embodiment, the first domains 40 are removed selective to the second polymer matrix 50. In this case, the first domains are removed selective to the second polymer matrix without substantially etching the chemical pattern layer (32, 33) including the prepattern material region 33 and the orientation control material portion 32. The removal of the first domains 40 selective to the second polymer matrix 50 can be performed, for example, by an anisotropic etch that removes the first domains selective to the second polymer matrix. The second polymer portion 50 can include a second pattern. In another embodiment, the second polymer matrix 50 is removed selective to the first domains 40. In this case, the second polymer matrix is removed selective to the first domains without substantially etching the chemical pattern layer (32, 33) including the prepattern material region 33 and the orientation control material portion 32. The removal of the second polymer matrix 50 selective to the first domains 40 can be performed, for example, by an anisotropic etch that the second polymer matrix selective to the first domains. The first domains 40 can include a variant second pattern.

Subsequently, according to an embodiment of the present disclosure in which the prepattern of FIG. 13 is an etch-resistant prepattern, the processing steps of FIGS. 5A, 6A, 6B, 7A, and 7B are performed to provide the third exemplary structure illustrated in FIGS. 15A and 15B.

Figure 15A:
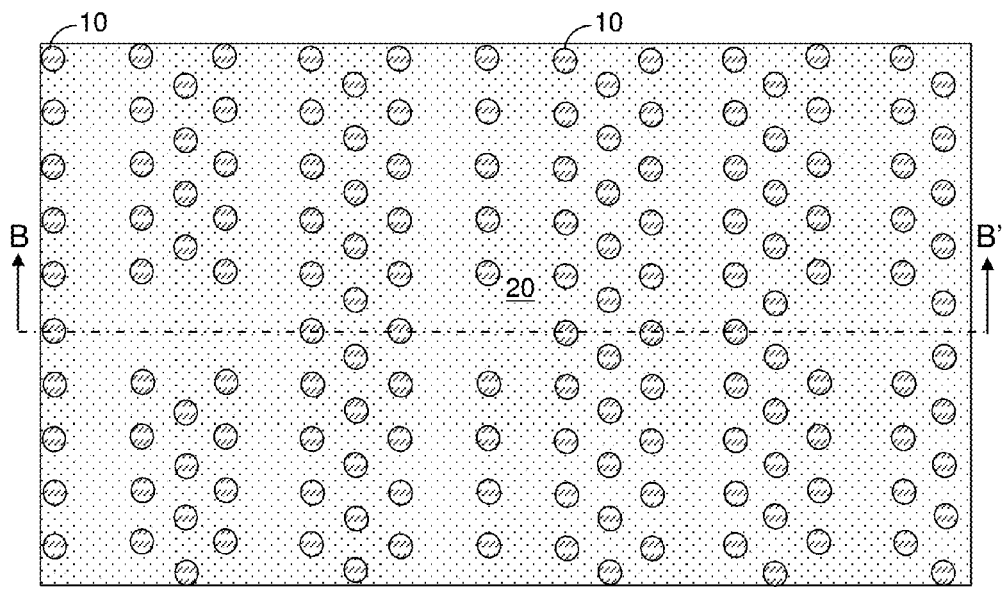
FIG. 15A is a top-down view of the third exemplary structure after transfer of a composite pattern of the prepattern and a second pattern in the second polymeric block component into a material layer located underneath according to an embodiment of the present disclosure.
Figure 15B:
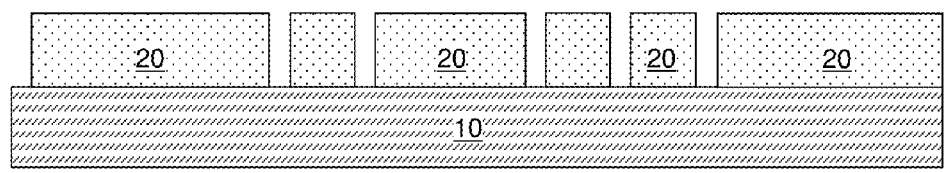
FIG. 15B is a vertical cross-sectional view of the third exemplary structure along the vertical plane B-B' of FIG. 15A.
Figure 16A:
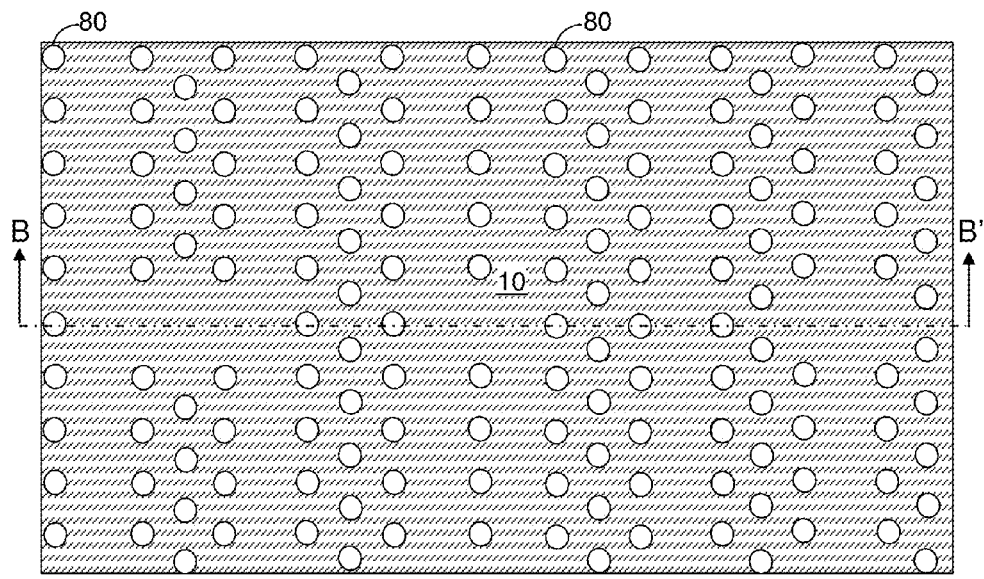
FIG. 16A is a top-down view of a fourth exemplary structure after transfer of a complementary pattern into a material layer located underneath according to an embodiment of the present disclosure.
Figure 16B:
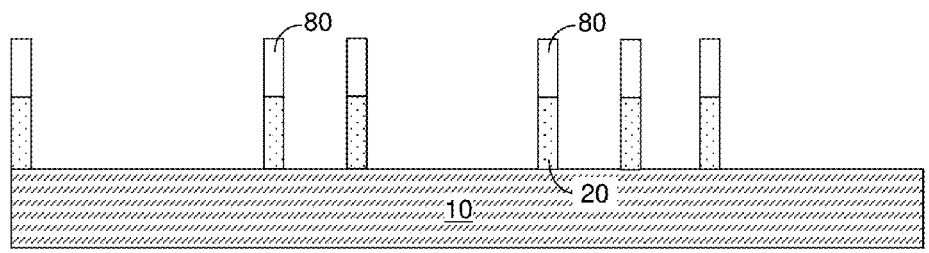
FIG. 16B is a vertical cross-sectional view of the fourth exemplary structure along the vertical plane B-B' of FIG. 16A.

Referring to FIGS. 16A and 16B, the processing steps employed to form the third exemplary structure of FIGS. 15A and 15B are modified to include the processing steps employed to form the second exemplary structure. For example, the processing steps of FIGS. 9A, 9B, 10A, and 10B can be performed to invert the composite pattern obtained by a union of the prepattern and the second pattern, generating a complementary pattern of the composite pattern. The complementary pattern is transferred into the material layer 20L to form a patterned material layer 20 including the complementary pattern.

A chemical pattern layer (32, 33), such as the examples of FIG. 1 or 13, may be formed in various ways. In one embodiment, an orientation control material layer is prepared, which has an orientation control surface. The orientation control material layer can be formed, for example, by grafting or cross-linking an appropriate polymeric material for the purpose on the substrate or another material layer. Then, a thin layer of a prepattern material including an etch-resistant material can be deposited and patterned to create the etch-resistant prepattern. Masking features may be incorporated into the etch-resistant prepattern in the same patterning step, or in subsequent patterning steps. The orientation-controlling aspects of the underlayer including the orientation control material are not compromised by the patterning process employed to pattern the layer of etch-resistant prepattern material. The thickness of the layer of etch-resistant prepattern material is selected such that competing topographical effects in chemoepitaxy DSA are avoided, and at the same time function as a suitable etch mask during an etch that transfers a pattern in one polymeric block component into underlying material layers. The combination of the etch-resistant prepattern and the orientation control material layer make up the chemical pattern layer.

In one embodiment, a layer of a prepattern material is prepared. This layer of prepattern material can be formed, for instance, by grafting or cross-linking an appropriate polymeric material for the purpose on the substrate or another material layer. Then, a thin etch-resistant material layer can be deposited and patterned. This thin etch-resistant material possesses an orientation control surface so that a patterned orientation control material including an etch-resistant material is formed. In another embodiment, the thin etch-resistant material top surface may be selectively modified by a thin polymeric material presenting an orientation control surface, so that a patterned orientation control material including an etch-resistant material is formed. A complementary pattern including the absence of etch-resistant material exposes the surface of layer of the prepattern material, and thus this complementary pattern serves as the prepattern. Masking features may be incorporated into the prepattern in the same patterning step, or in subsequent patterning steps. The preferential chemical affinity of one of the polymeric block components for the prepattern material regions is not compromised by the patterning process employed to pattern the layer of etch-resistant orientation control material. The thickness of the layer of etch-resistant orientation control material is selected such that competing topographical effects in chemoepitaxy DSA are avoided, and at the same time function as a suitable etch mask during an etch that transfers a pattern in one polymeric block component into underlying material layers. The chemical pattern layer (32, 33) so formed includes the combination of the layer of prepattern material and the patterned etch-resistant orientation control material.

In one embodiment, a layer of a prepattern material or orientation control material is prepared. A patterned resist layer is formed above this layer. As used herein, the "resist" refers to a radiation-sensitive material that may be patterned by removal of the resist after exposure to radiation for which it is sensitive in either exposed or unexposed regions, depending on the pattern development procedure. In one embodiment the resist can be a photoresist. The layer underlying the patterned resist layer is partially or completely removed in areas not protected by the patterned resist layer. Masking features may be incorporated in the same patterning and material removal steps, or in subsequent patterning and material removal steps. Then an orientation control material or a prepattern material, being the other of the two materials that may be selected for layer underlying the patterned resist, is formed in those areas not protected by patterned resist. The patterned resist layer is then removed to uncover the surface material formerly underlying the patterned resist. In this way, prepattern material regions and orientation control material regions complementary overlie an entirety of the substrate in plan view. At least the orientation control material or the prepattern material, but not both, includes an etch-resistant material. The orientation control material layer or the prepattern material layer can be formed by grafting or cross-linking an appropriate polymeric material for the purpose on the substrate or another material layer. The height difference between the top surface of the orientation control material and the top surface of the prepattern material is selected such that competing topographical effects in chemoepitaxy DSA are avoided, while at the same time the thickness of the layer of etch-resistant material is sufficient so that it functions as a suitable etch mask during an etch that transfers a pattern in one polymeric block component into underlying material layers.

Figure 17A:
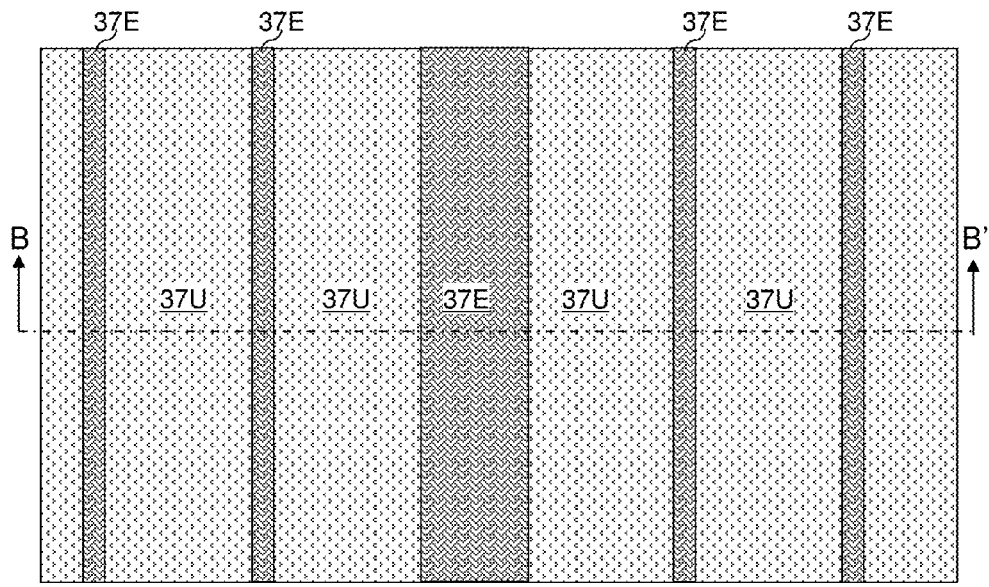
FIG. 17A is a top-down view of the first exemplary structure after application of a resist layer and a first lithographic exposure according to an embodiment of the present disclosure.
Figure 17B:
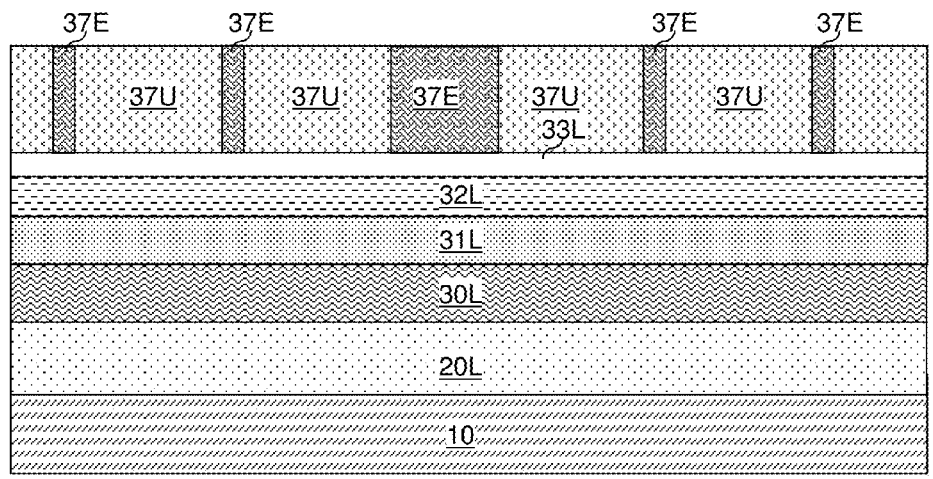
FIG. 17B is a vertical cross-sectional view of the first exemplary structure along the vertical plane B-B' of FIG. 17A.

Referring to FIGS. 17A and 17B, a resist layer, i.e., can be applied over the first exemplary structure prior to formation of the chemical pattern layer (32, 33). An orientation control material layer 32L underlies a prepattern material layer 33L. A first lithographic exposure can be performed on the resist layer. The lithographic exposure of the resist layer can be performed, for example, by deep ultraviolet (DUV) lithography, mid-ultraviolet (MUV) lithography, extreme ultraviolet (EUV) lithography, X-ray lithography, nanoimprint lithography, thermal nanoprobe lithography, dip-pen lithography, polymer pen lithography, plasmonic lithography, ion beam lithography, or electron beam lithography. The lithographically exposed portions of the resist layer become lithographically exposed portions 37E, and the portions of the resist layer that is not lithographically exposed are herein referred to as lithographically unexposed portions 37U.

Figure 18A:
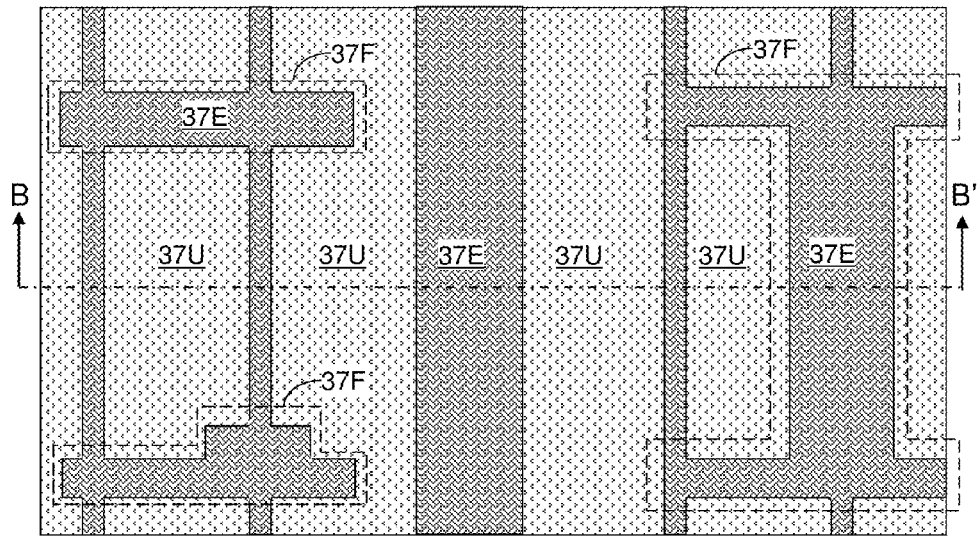
FIG. 18A is a top-down view of the first exemplary structure after a second lithographic exposure according to an embodiment of the present disclosure.
Figure 18B:
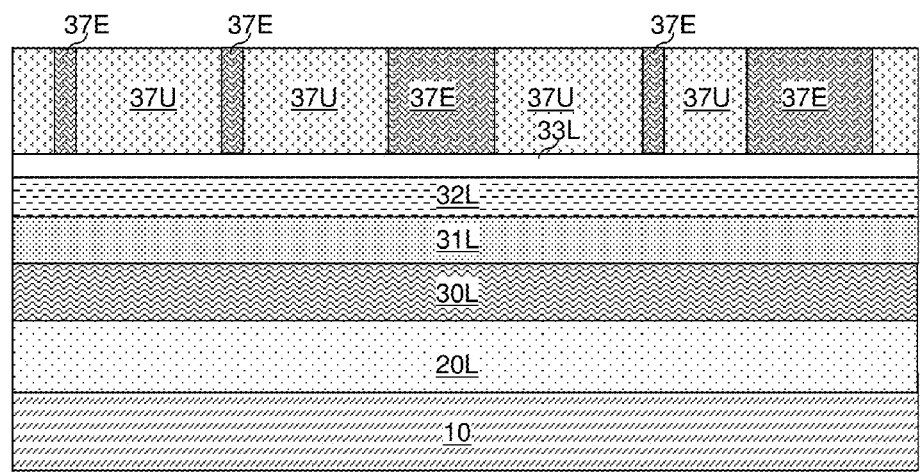
FIG. 18B is a vertical cross-sectional view of the first exemplary structure along the vertical plane B-B' of FIG. 18A.

Referring to FIGS. 18A and 18B, a second lithographic exposure can be performed on the resist layer (37E, 37U) to expose additional portions of the resist layer. The additionally exposed portions of the resist layer include a masking feature 37F, i.e., a shape that is subsequently employed to mask a portion of an underlying layer. Thus, a subset of the lithographically unexposed portions 37U becomes lithographically exposed, and is added to the preexisting lithographically exposed portions 37E. The combination of patterns of the first and second lithographic exposures includes a first pattern.

While the present disclosure is described employing an embodiment in which two separate lithographic exposures are employed to form the first pattern, embodiments in which a single lithographic exposure or more than two lithographic exposures are employed can also be employed. Further, positive resists or negative resists can be employed depending on the scheme employed for lithographic exposure and development.

Figure 19A:
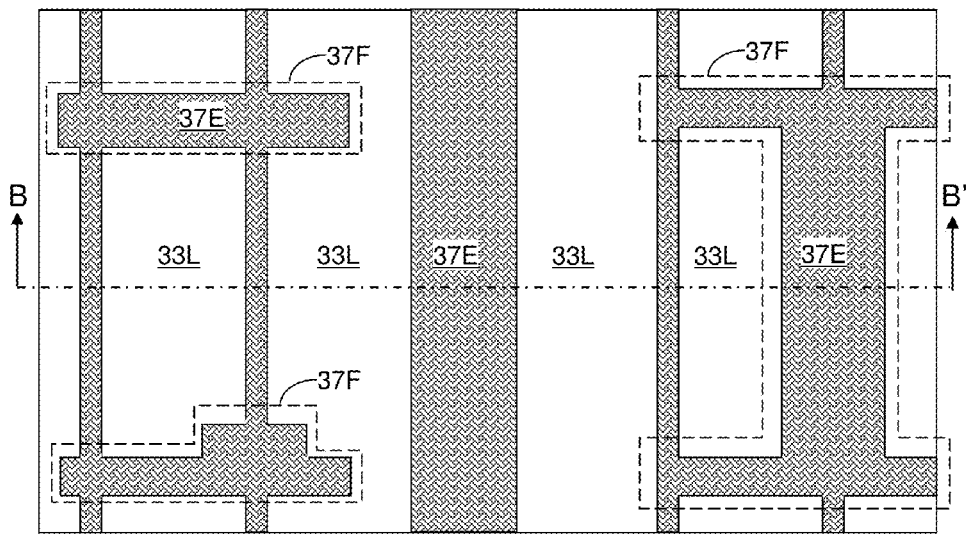
FIG. 19A is a top-down view of the first exemplary structure after development of the resist layer according to an embodiment of the present disclosure.
Figure 19B:
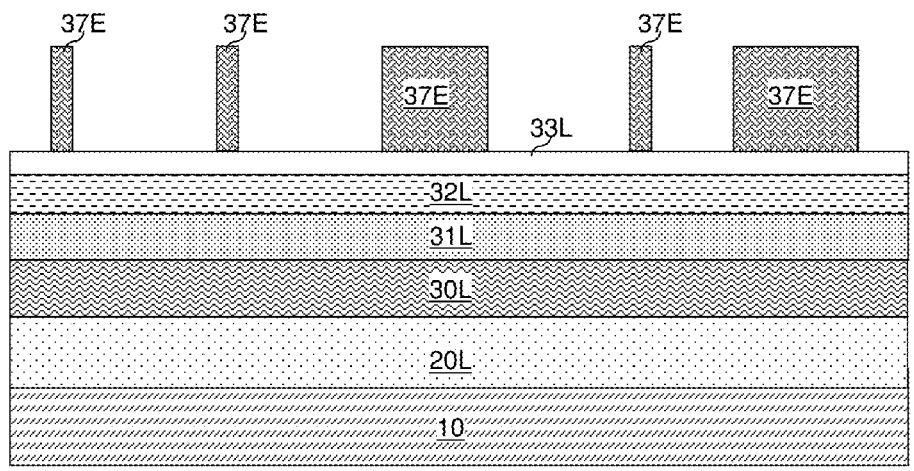
FIG. 19B is a vertical cross-sectional view of the first exemplary structure along the vertical plane B-B' of FIG. 19A.

Referring to FIGS. 19A and 19B, the resist layer is developed to remove lithographically unexposed portions 37U selective to the lithographically exposed portions (37E, 37F). The pattern in the remaining patterned portions of the resist layer, i.e., the first sub-pattern of the strips of lithographically exposed portions 37E and the second sub-pattern of features 37F, is the first pattern.

Figure 20A:
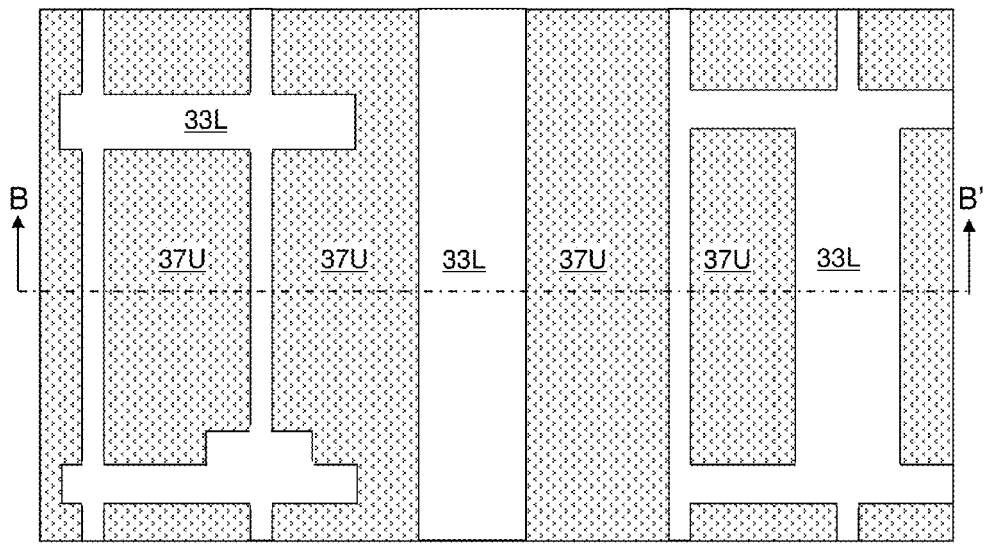
FIG. 20A is a top-down view of a variation of the first exemplary structure after development of the resist layer in exposed regions according to an embodiment of the present disclosure.
Figure 20B:
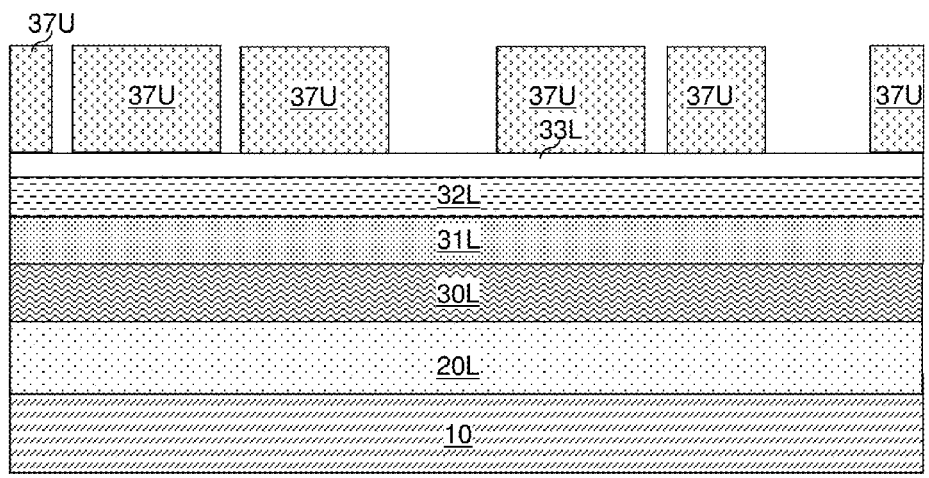
FIG. 20B is a vertical cross-sectional view of the variation of the first exemplary structure along the vertical plane B-B' of FIG. 20A.

Referring to FIGS. 20A and 20B, an alternate embodiment is shown in which the resist layer is developed to remove lithographically exposed portions (37E, 37F) selective to the unexposed portions of the resist layer 37U. In this alternate embodiment, the pattern in the remaining resist layer, i.e., 37U, is complementary to the first pattern.

Figure 21A:
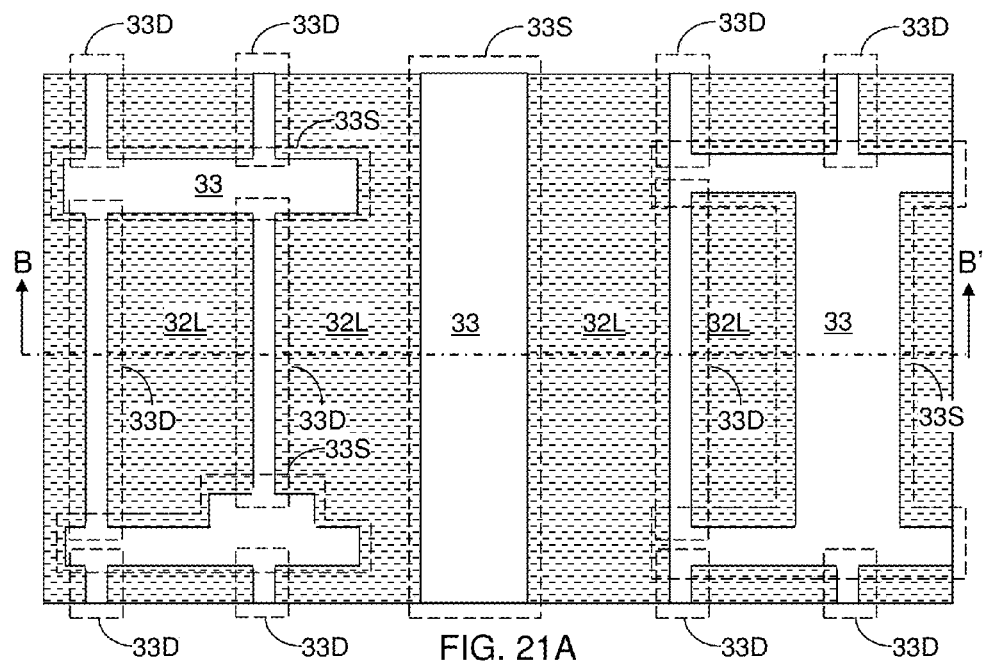
FIG. 21A is a top-down view of another variation of the first exemplary structure after development of the resist layer according to an embodiment of the present disclosure.
Figure 21B:
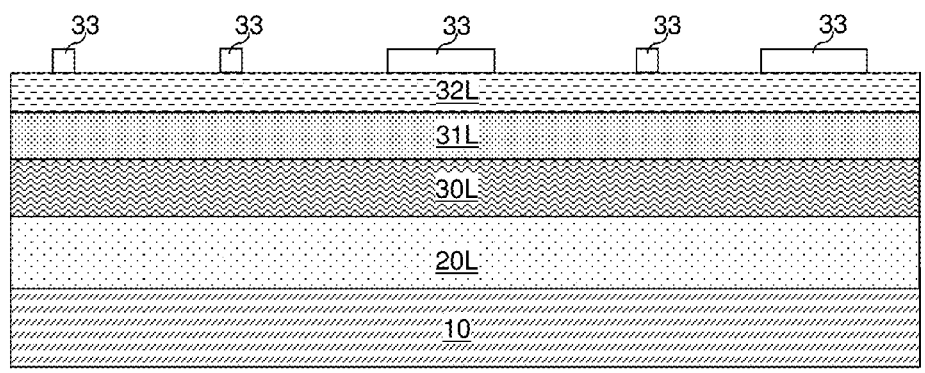
FIG. 21B is a vertical cross-sectional view of the variation of the first exemplary structure along the vertical plane B-B' of FIG. 21A.

Referring to FIGS. 21A and 21B, a chemical pattern layer (32, 33) is derived from the first exemplary structure prior to formation of a chemical pattern layer (32, 33) in FIGS. 19A and 19B. The first pattern is transferred into the prepattern material region 33 by an etch, which can be an anisotropic etch such as a reactive ion etch. The patterned resist layer including lithographically exposed portions (37E, 37F) in FIGS. 19A and 19B can be employed as an etch mask for the etch. In one embodiment, the etch can be selective for the prepattern material. The etch can be an end-pointed etch that terminates upon detection of physically exposed surfaces of the orientation control material layer 32L. In another embodiment, the etch can be a timed etch that terminates without any substantial overetch into the orientation control material layer 32L. The etch can also be an isotropic or anisotropic wet etch selective for the prepattern material layer 33L, which does not adversely affect the orientation controlling properties of the orientation control material layer 32L. In one embodiment, the wet etch is timed to control the amount of undercut etch underneath the lithographically exposed portions (37E, 37F) that act as an etch mask. After the etch of the prepattern material region 33, the patterned resist layer may be removed, by for example solvent development or by using standard developers. In one embodiment, the patterned resist layer is consumed during the etch of the prepattern material region 33. The remaining portions of the prepattern material layer include the prepattern material region 33, which includes the first pattern, i.e., the pattern in the lithographically exposed portions (37E, 37F). The resulting chemical pattern layer (32, 33) includes a combination of the prepattern material region 33 and the underlying orientation control material layer 32L.

In another embodiment, a chemical pattern layer (32, 33) is derived from the first exemplary structure prior to formation of a chemical pattern in FIGS. 19A and 19B in which the prepattern material is also a resist. Lithographic exposures can be performed on the prepattern material layer 33L directly without the resist layer 37, but in the same pattern as the exposed portions (37E, 37F) of the resist layer 37. The prepattern material layer 33L is subsequently developed to remove the unexposed portions in the pattern of 37U selectively to the pattern of exposed portions (37E, 37F), thereby producing the prepattern material region 33 in the exemplary chemical pattern layer (32, 33) depicted in FIGS. 21A and 21B without the proceeding through steps resulting in the exemplary structures depicted in FIGS. 17A, 17B, 18A, 18B, 19A, and 19B.

In an additional embodiment, a chemical pattern layer (32, 33) is derived from the exemplary structures of FIGS. 17A, 17B, 18A, 18B, 20A, and 20B but without forming the prepattern material layer 33L. The prepattern material is deposited onto the orientation control material layer 32L not covered by the patterned resist layer patterned as a complement to the first pattern 37U, or onto both the uncovered orientation control material layer 32L and the patterned resist layer patterned as a complement to the first pattern 37U. Removal of the patterned resist layer 37U by, for example, a solvent dissolution process, leaves behind the prepattern material region 33 over the orientation control material layer 32L in the exemplary structure depicted in FIGS. 21A and 21B. The combination of the prepattern and the underlying orientation control material are the chemical pattern layer (32, 33).

In one embodiment the prepattern material includes an etch-resistant material.

Figure 22A:
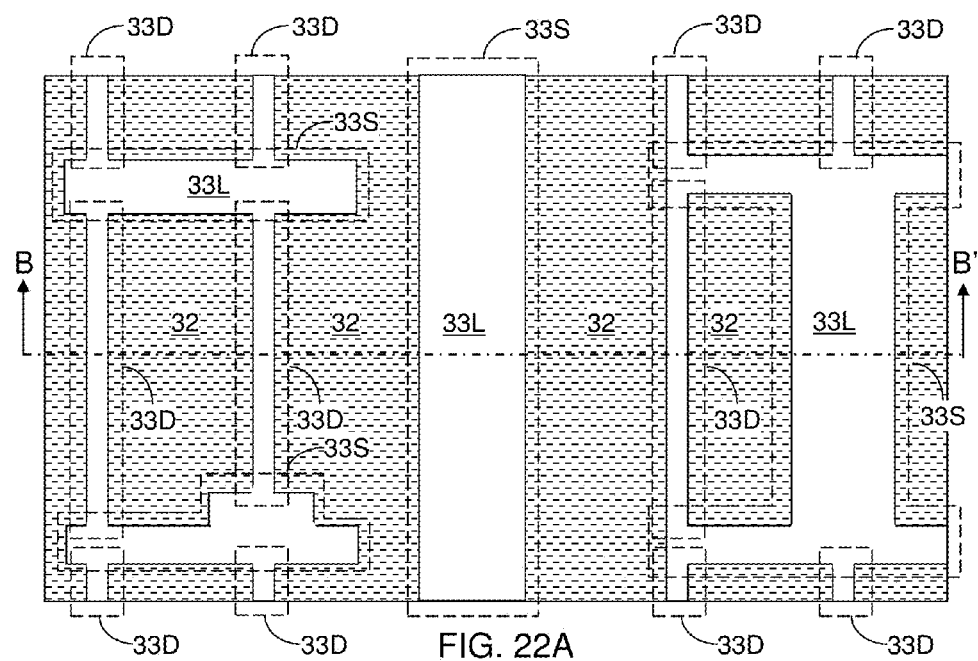
FIG. 22A is a top-down view of yet another variation of the first exemplary structure after development of the resist layer in exposed regions according to an embodiment of the present disclosure.
Figure 22B:
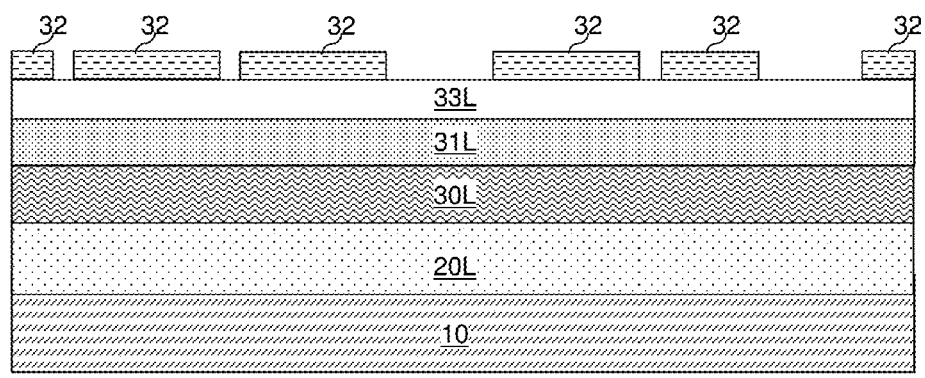
FIG. 22B is a vertical cross-sectional view of the variation of the first exemplary structure along the vertical plane B-B' of FIG. 22A.

Referring to FIGS. 22A and 22B, a chemical pattern layer (32, 33) is derived from a variation first exemplary structure prior to formation of a chemical pattern in FIGS. 20A and 20B, in which the orientation control material layer 32L overlies the prepattern material layer 33L. The pattern complementary to the first pattern is transferred into the orientation control material portion 32 by an etch, which can be an anisotropic etch such as a reactive ion etch. The patterned resist layer including lithographically unexposed portions 37U in FIGS. 20A and 20B can be employed as an etch mask for the etch. In one embodiment, the etch can be selective for the orientation control material. The etch can be an end-pointed etch that terminates upon detection of physically exposed surfaces of the prepattern material layer 33L. In another embodiment, the etch can be a timed etch that terminates without any substantial overetch into the prepattern material layer. The etch can also be an isotropic or anisotropic wet etch selective for the orientation control material layer 32L, which does not adversely affect the preferential chemical affinity for one of the polymeric block components of the prepattern material layer 33L. In one embodiment, the wet etch is timed to control the amount of undercut etch underneath the lithographically unexposed portions 37U that act as an etch mask. The regions where the top surface of the prepattern material layer 33L is physically exposed include the area of the prepattern, which is also the area of the first pattern, i.e., the pattern of the lithographically exposed portions (37E, 37F). The combination of the patterned orientation control material portion 32 and the underlying prepattern material layer 33L are the chemical pattern layer (32, 33).

In another embodiment, a chemical pattern layer (32, 33) is derived from a variation first exemplary structure prior to formation of a chemical pattern in FIGS. 20A and 20B, in which a layer of orientation control material portion 32L overlies the prepattern material layer 33L, and the orientation control material is also a resist. Lithographic exposures can be performed on the orientation control material layer 32L directly without the resist layer 37, but in the same pattern as the unexposed portions 37U of the resist layer 37. The orientation control material layer 32L is subsequently developed to remove the exposed portions in the pattern of 37E, 37F selectively to the pattern of unexposed portions 37U, leaving behind the exposed orientation control material portion 32. The regions where the top surface of the prepattern material layer 33L is physically exposed include the prepattern, which is also the first pattern, i.e., the pattern of the lithographically exposed portions (37E, 37F). Thus, the exemplary chemical pattern layer (32, 33) depicted in FIGS. 22A and 22B is produced without the proceeding through steps resulting in the exemplary structures depicted in FIGS. 17A, 17B, 18A, 18B, 20A, and 20B.

In an additional embodiment, a chemical pattern layer (32, 33) is derived from the exemplary structures of FIGS. 17A, 17B, 18A, 18B, 19A, and 19B but without forming the orientation control material layer 32L. The orientation control material is deposited onto the prepattern material layer 33L not covered by the lithographically exposed portions of the patterned resist layer having the first pattern (37E,37F) or onto both the uncovered prepattern material layer 33L and the lithographically exposed portions of the patterned resist layer (37E,37F). Removal of the patterned resist pattern (37E,37F) leaves behind the orientation control material portion 32 overlying the prepattern material layer 33L in the exemplary structure depicted in FIGS. 22A and 22B. The combination of the orientation control material portion 32 and the underlying prepattern material layer 33L are the chemical pattern layer (32, 33).

In one embodiment, the orientation control material includes an etch-resistant material. The orientation control surface of this etch-resistant material may be intrinsic to the etch-resistant material, or it can be formed by grafting or cross-linking an appropriate thin polymeric material for the purpose on the top surface of the etch-resistant material.

The height of the top surface of the prepattern material region 33 is selected such that alignment of phase-separated polymeric block components to be subsequently formed by directed self-assembly of self-assembling material is not substantially affected by the height difference between the top surface of the prepattern material region 33 and the top surface of the orientation control material portion 32, but is predominantly determined by the geometrical features of patterned portions of the prepattern material region 33 as seen in a top-down view. In one embodiment, the height difference between the top surface of the prepattern material region 33 and the top surface of the orientation control material portion 32 can be a value selected from a range from 0 nm to 15 nm.

The chemical pattern layer (32, 33) including a combination of the orientation control material portion 32 and the prepattern material region 33 is formed on a substrate. The chemical pattern layer (32, 33) can be formed over a variety of material layers, including for example a hard mask layer 31L, or an OPL 30L. Physically exposed top surfaces of the orientation control material portion 32 and physically exposed top surfaces of the prepattern material region 33 complementarily overlie the entirety of the substrate.

The orientation control material layer 32L and the prepattern material layer 33L include an orientation control material and a prepattern material, respectively. Orientation control materials or prepattern materials deposited in a single material layer are also referred to herein as "coating materials". Thus a layer of coating material can include an orientation control material layer 32L or a prepattern material layer 33L.

Figure 23A:
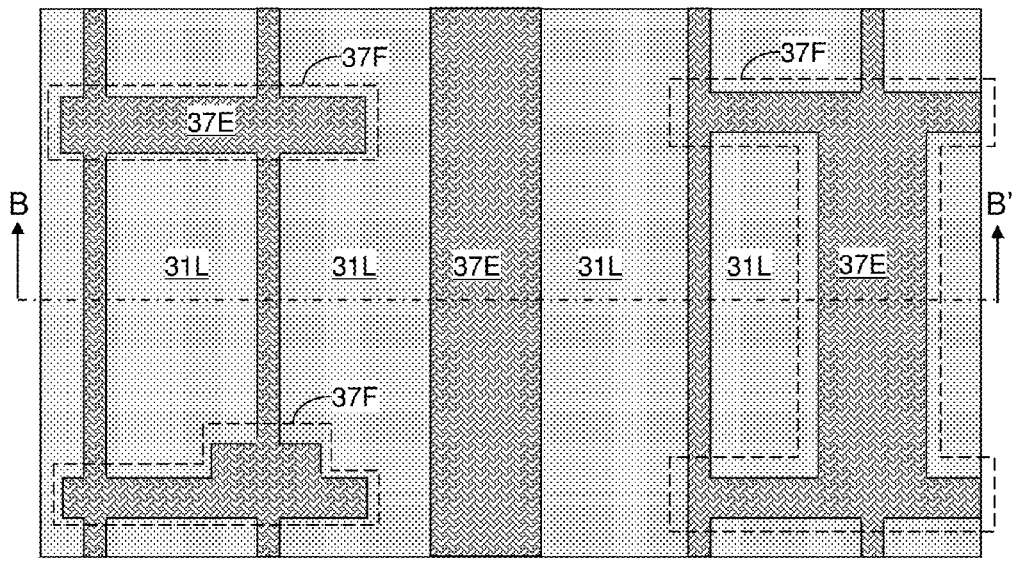
FIG. 23A is a top-down view of a fifth exemplary structure after patterning of a prepattern material layer according to an embodiment of the present disclosure.
Figure 23B:
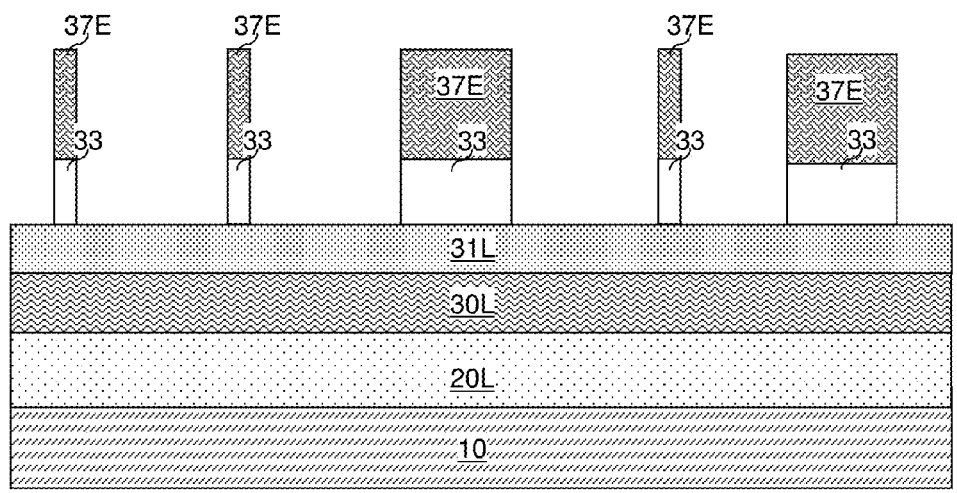
FIG. 23B is a vertical cross-sectional view of the fifth exemplary structure along the vertical plane B-B' of FIG. 23A.

Referring to FIGS. 23A and 23B, a fifth exemplary structure is derived from the first exemplary structure of FIGS. 4A and 4B by not forming an orientation control material layer and by forming an prepattern material layer 33L directly on the hard mask layer 31L. The prepattern material layer 33L can be patterned to form the patterned prepattern material region 33 in the same manner as illustrated in FIGS. 17A, 17B, 18A, 18B, 19A, 19B, 21A, and 21B, but without removing the patterned resist.

Figure 24A:
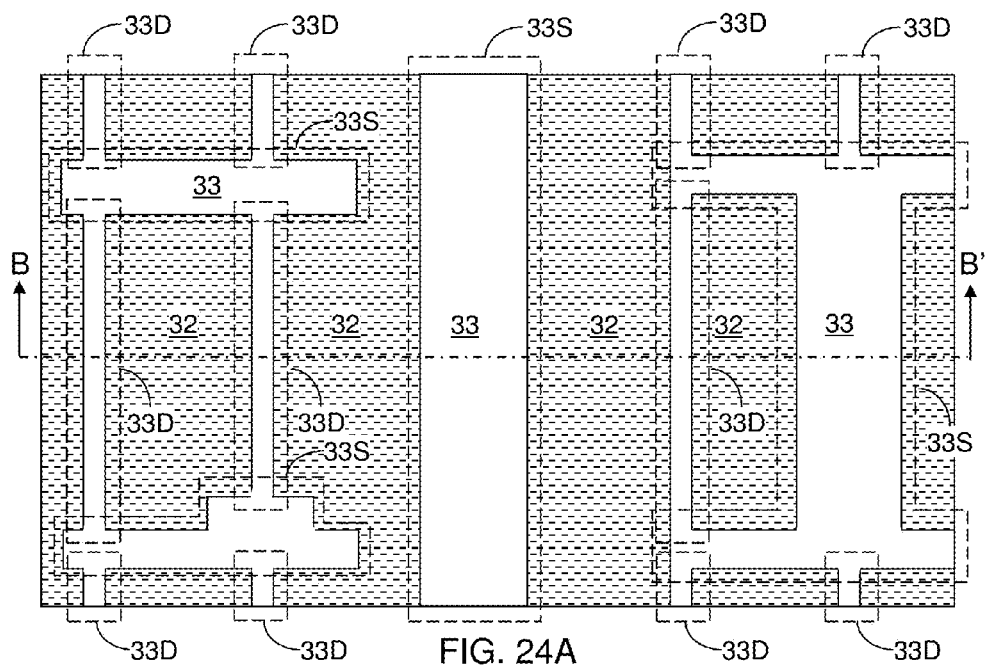
FIG. 24A is a top-down view of the fifth exemplary structure after formation of an orientation control material according to an embodiment of the present disclosure.
Figure 24B:
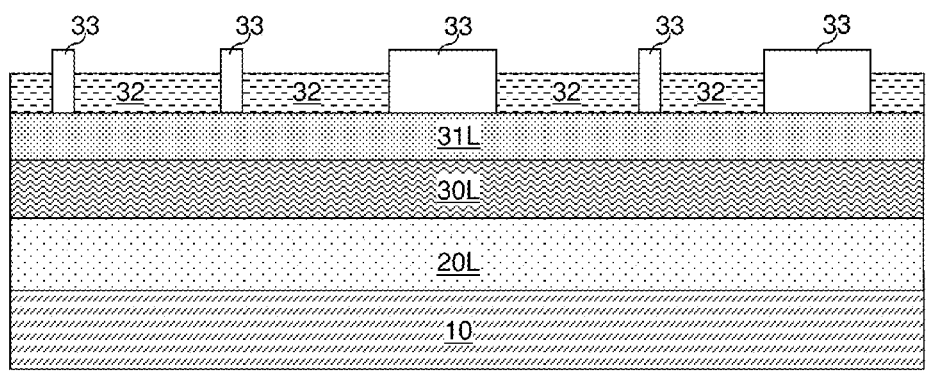
FIG. 24B is a vertical cross-sectional view of the fifth exemplary structure along the vertical plane B-B' of FIG. 24A.

Referring to FIGS. 24A and 24B, an orientation control material portion 32 is formed in areas not occupied by the prepattern material region 33, by spin-coating for example, onto the fifth exemplary structure of FIGS. 23A and 23B. Special care must be taken to prevent dissolution of the patterned resist layer in the solvents used to cast the orientation control material portion 32. This may be accomplished by, for example hardening the resist through thermal, chemical, or radiation treatment, or a combination of these. Cross-linked resists may also be used. The orientation control material portion 32 can include the same material in the first exemplary structure. The amount of the material applied over the prepattern material region 33 can be controlled such that the top surface of the orientation control material portion 32 is not raised above the top surface of the prepattern material region 33.

Thus, a chemical pattern layer (32, 33) including a combination of an orientation control material portion 32 and a prepattern material region 33 is formed on a substrate. The chemical pattern layer (32, 33) can be formed directly on the top surface of the hard mask layer 31L. Physically exposed top surfaces of the orientation control material portion 32 and physically exposed top surfaces of the prepattern material region 33 complementarily overlie the entirety of the substrate.

Figure 25A:
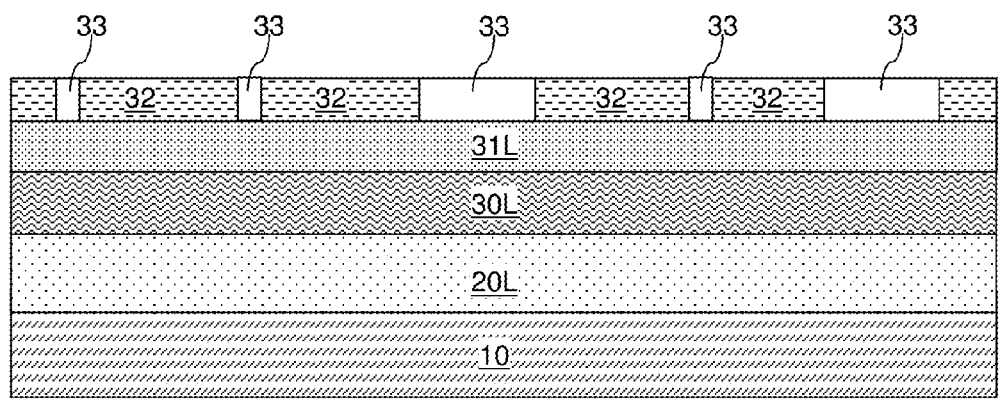
FIG. 25A is a vertical cross-sectional view of a first variation of the fifth exemplary structure according to an embodiment of the present disclosure.

Referring to FIG. 25A a first variation of the fifth exemplary structure can be made by recessing the top surface of the prepattern material region 33 relative to the top surface of the orientation control material portion 32. In one embodiment, the top surface of the prepattern material region 33 can be at a height that is substantially the same as the height of the top surface of the orientation control material portion 32.

Figure 25B:
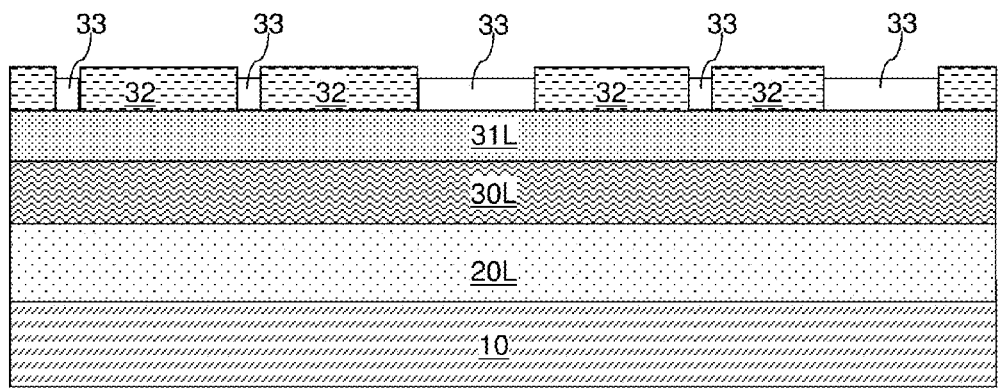
FIG. 25B is a vertical cross-sectional view of a second variation of the fifth exemplary structure according to an embodiment of the present disclosure.

Referring to FIG. 25B a second variation of the fifth exemplary structure can be made by recessing the top surface of prepattern material region 33 relative to the top surface of the orientation control material portion 32. In one embodiment, the top surface of the prepattern material region 33 can be recessed to a height that is lower than the top surface of the orientation control material portion 32.

Figure 26A:
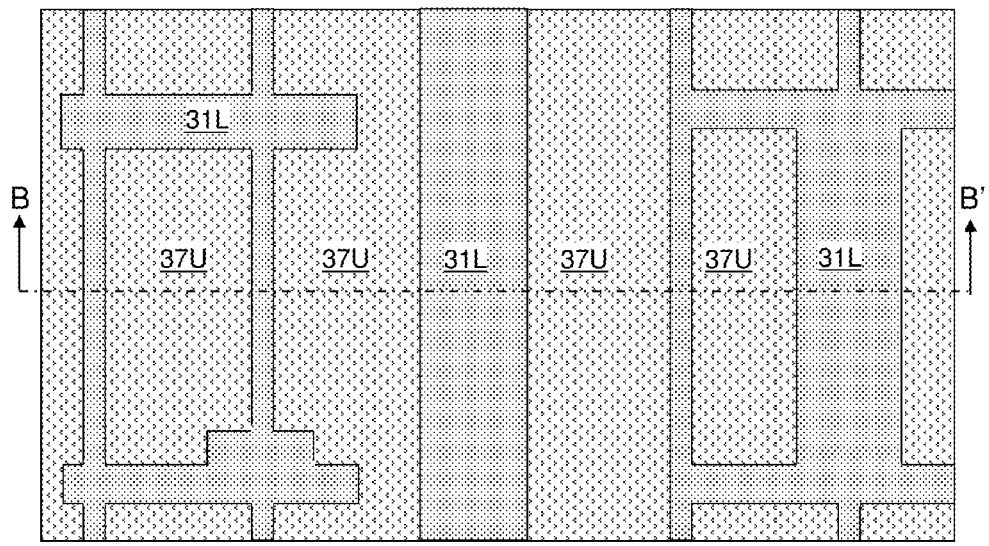
FIG. 26A is a top-down view of a sixth exemplary structure after patterning of an orientation control material layer according to an embodiment of the present disclosure.
Figure 26B:
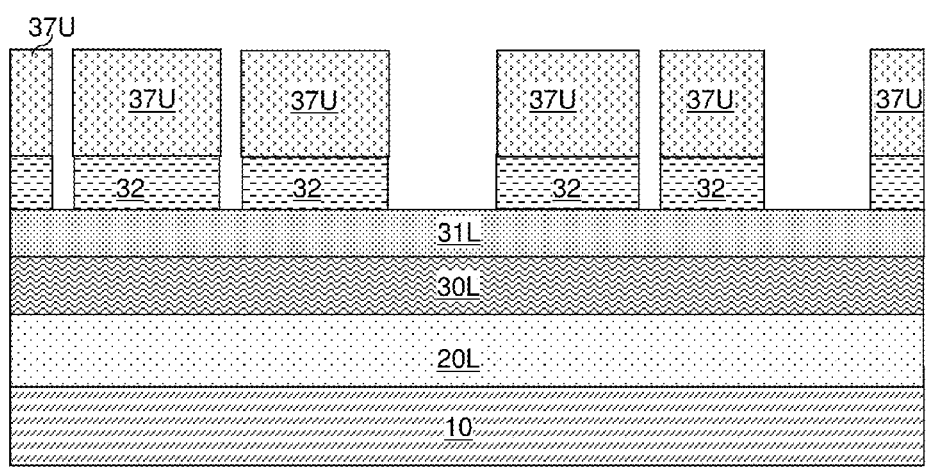
FIG. 26B is a vertical cross-sectional view of the sixth exemplary structure along the vertical plane B-B' of FIG. 26A.

Referring to FIGS. 26A and 26B, a sixth exemplary structure is derived from the first exemplary structure of FIGS. 20A and 20B by patterning an orientation control material portion 32 prior to forming a prepattern material layer 33L. The patterned orientation control material portion 32 can be formed by depositing and patterning at least one resist layer, and transferring the pattern(s) in the at least one resist layer into the orientation control material layer, for example, by an etch, which can be an anisotropic etch such as a reactive ion etch. The trenches formed within the orientation control material portion 32 can include any and/or each of the patterns in the prepattern material region 33 as illustrated in FIG. 1.

Figure 27A:
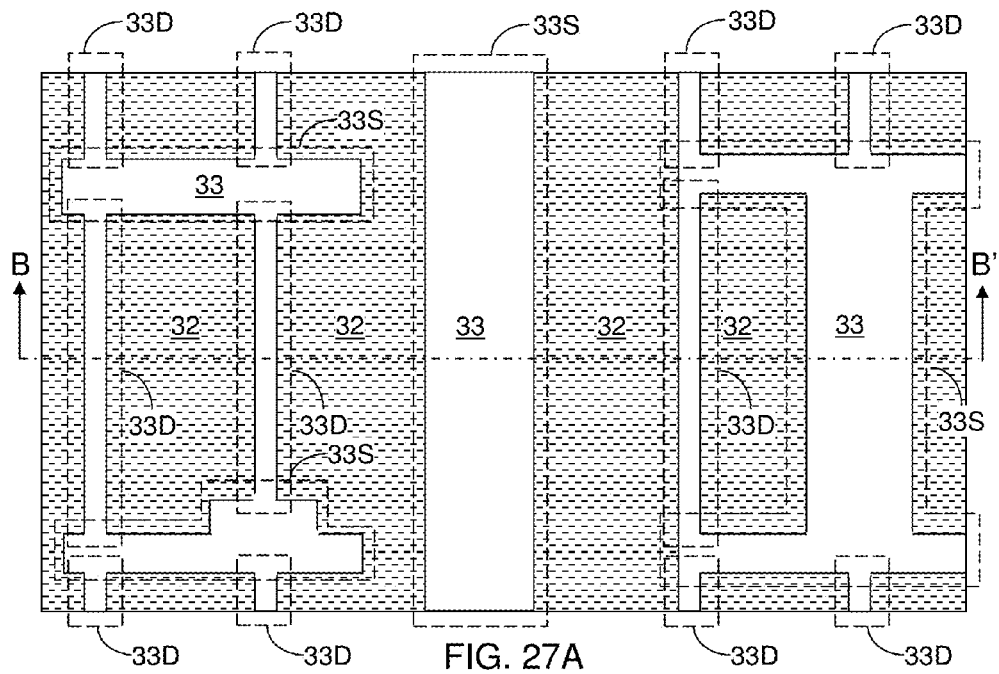
FIG. 27A is a top-down view of the sixth exemplary structure after formation of a prepattern material according to an embodiment of the present disclosure.
Figure 27B:
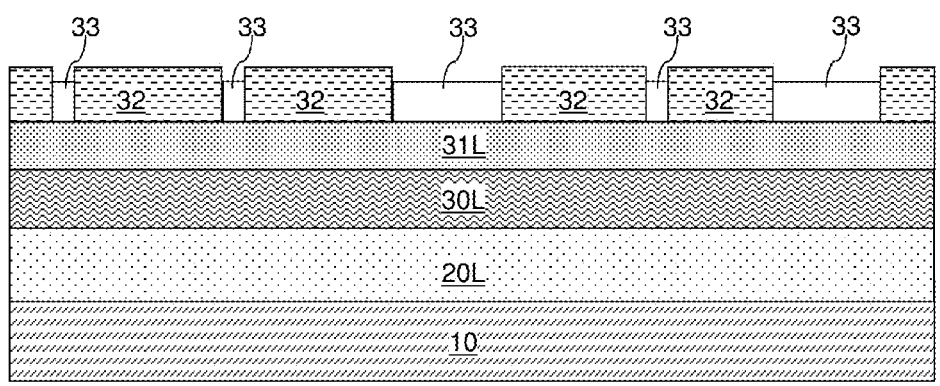
FIG. 27B is a vertical cross-sectional view of the sixth exemplary structure along the vertical plane B-B' of FIG. 27A.

Referring to FIGS. 27A and 27B, a prepattern material region 33 is formed in areas not occupied by the orientation control material portion 32. The prepattern material region 33 can be deposited by any of the same methods that may be used to deposit the prepattern material region 33 including, for example, by spin-coating. The prepattern material region 33 can include the same material in the first exemplary structure. The amount of the material applied over the orientation control material portion 32 can be controlled such that the top surface of the prepattern material region 33 is not raised above the top surface of the orientation control material portion 32.

Thus, chemical pattern layer (32, 33) including a combination of the prepattern material region 33 and the orientation control material portion 32 is formed on a substrate. The chemical pattern layer can be formed directly on the top surface of the hard mask layer 31L. Physically exposed top surfaces of the prepattern material region 33 and physically exposed top surfaces of the orientation control material portion 32 complementarily overlie the entirety of the substrate.

Figure 28A:
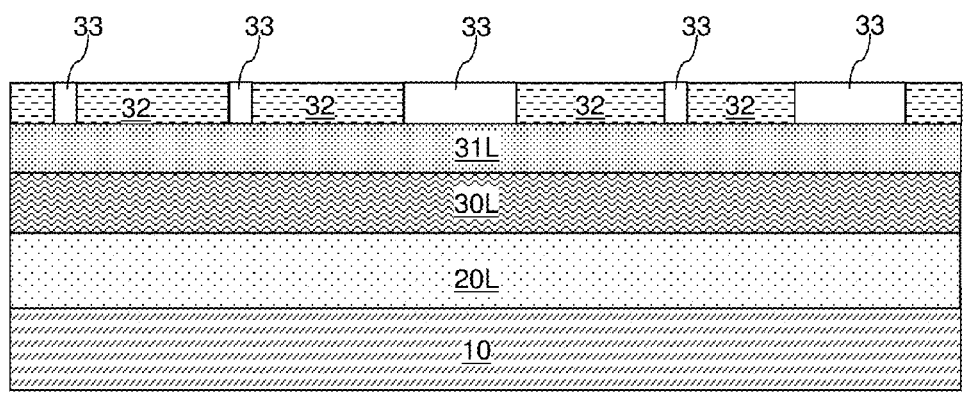
FIG. 28A is a vertical cross-sectional view of a first variation of the sixth exemplary structure according to an embodiment of the present disclosure.

Referring to FIG. 28A a first variation of the sixth exemplary structure can be made by recessing the top surface of the orientation control material portion 32 relative to the top surface of the prepattern material region 33. In one embodiment, the top surface of the orientation control material portion 32 can be at a height that is substantially the same as the height of the top surface of the prepattern material region 33.

Figure 28B:
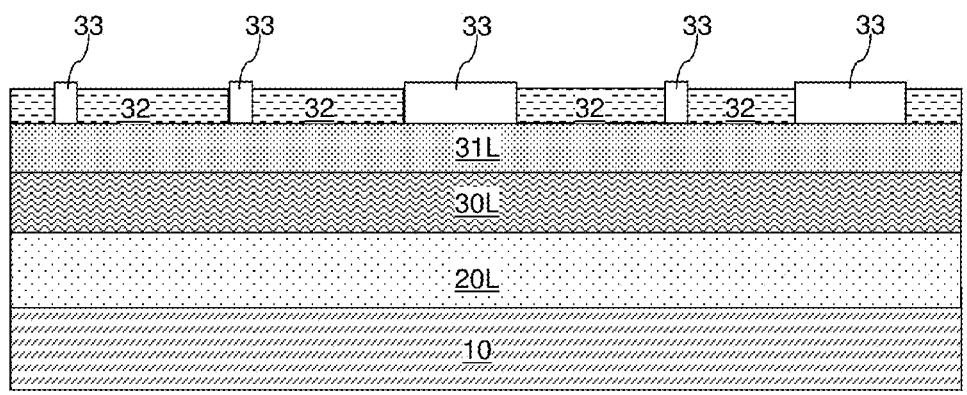
FIG. 28B is a vertical cross-sectional view of a second variation of the sixth exemplary structure according to an embodiment of the present disclosure.

Referring to FIG. 28B a second variation of the sixth exemplary structure can be made by recessing the top surface of the orientation control material portion 32 relative to the top surface of the prepattern material region 33. In one embodiment, the top surface of the orientation control material portion 32 can be recessed to a height that is lower than the top surface of the prepattern material region 33.

EXAMPLES

Example 1

Figure 29A:
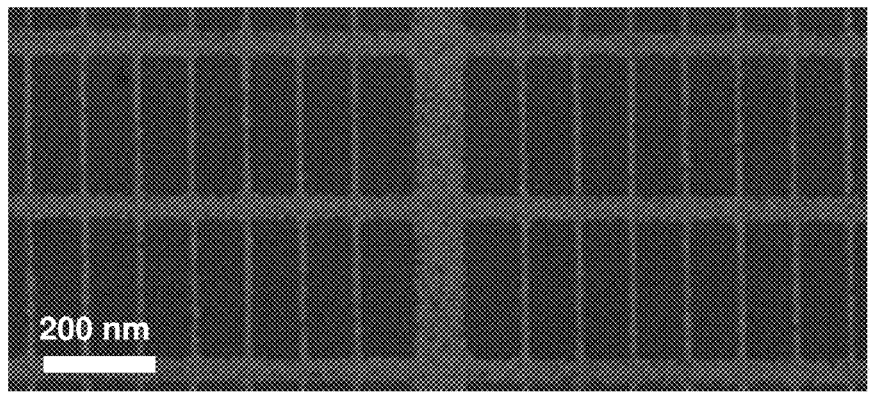
FIG. 29A is a SEM of a first sample manufactured according to methods of the present disclosure after formation of an etch-resistant prepattern.
Figure 29B:
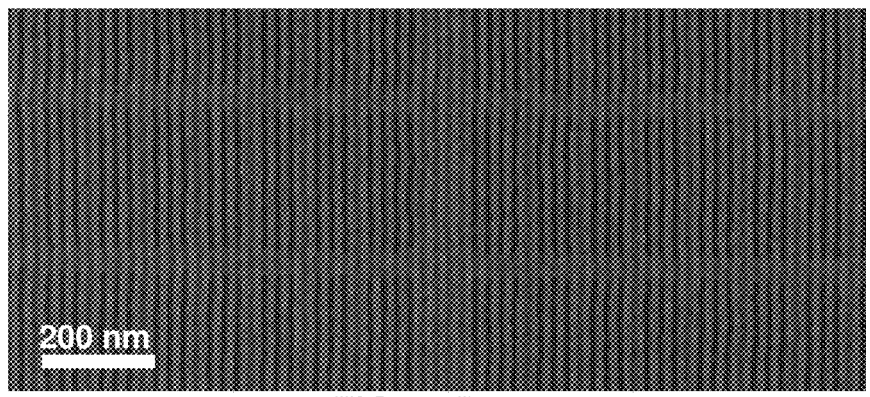
FIG. 29B is a SEM of the first sample manufactured according to methods of the present disclosure after formation of polymeric block component portions including a second pattern.

A prepattern includes a thin layer of hydrogen silsesquioxane (HSQ), patterned using electron beam lithography, which is preferentially wetted by PMMA. It lies on top of a thermally cross-linked film of poly(dicyclopentadiene methacrylate epoxide-ran-styrene) (25/75) (PEpoxyDCPMA-r-PS) that enables the formation of self-assembled domains laterally on the substrate. The HSQ pattern and the cross-linked film make up the chemical pattern layer. The HSQ pattern includes of 12 nm wide stripes with a 100 nm pitch and masking features with minor lateral dimensions that are approximately 40 nm or 90 nm (masking features perpendicular to the stripes may be 40 nm or 90 nm; masking features parallel with stripes are 90 nm). All features in the prepattern are contiguous and less than 5 nm in height. The self-assembling material used is a blend of 85% (w/w) symmetric poly(styrene-b-methyl methacrylate) (PS-PMMA; 22 kg/mol-22 kg/mol) block copolymer from Polymer Source and 15% (w/w) 2.8 kg/mol PMMA from Polymer Laboratories that forms lamellae with a ~25 nm period due to phase separation. Prior to application of the self-assembling material, the substrate with the chemical pattern layer was annealed at 205° C. for 15 minutes in air. DSA is achieved by casting a film of self-assembling material from solution in PGMEA onto the chemical pattern layer and annealing the film at 248° C. for 5 minutes. Oxygen reactive ion etching (RIE) is used to selectively remove PMMA domains due to their faster etch rate compared to PS. FIGS. 29A and 29B show SEM images of an initial prepattern and the resulting self-assembled pattern after DSA and oxygen RIE, respectively. This example demonstrates that the self-assembling material is aligned by the prepattern, but that this alignment is not affected by prepattern masking features.

Figure 29C:
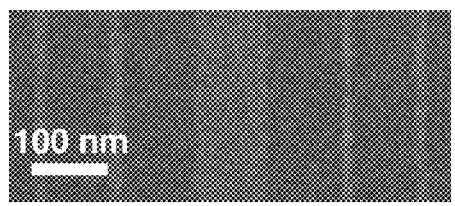
FIG. 29C is magnified view of a first region in FIG. 29A.
Figure 29F:
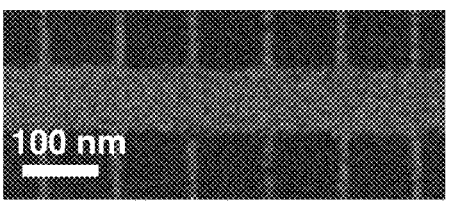
FIG. 29F is magnified view of a second region in FIG. 29A.
Figure 29D:
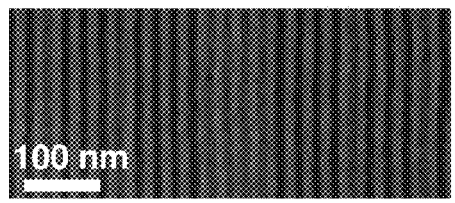
FIG. 29D is a magnified view of the first region in FIG. 29B.
Figure 29G:
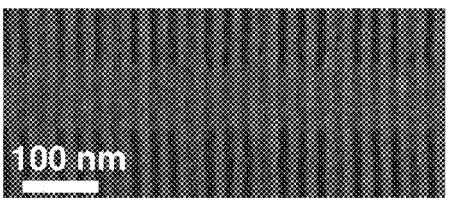
FIG. 29G is a magnified view of the second region in FIG. 29B.
Figure 295E:
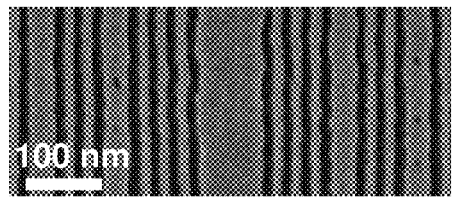
Figure 29H:
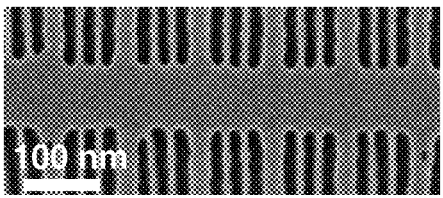
FIG. 29H is a magnified view of the second region of the first sample after transfer of a composite pattern into underlying material layers.

To demonstrate transferability of the pattern into underlying substrates, the HSQ pattern and cross-linked PEpoxyDCPMA-r-PS film lie on an 8 nm silicon-based antireflection coating (SiARC, from Shinitsu) on top of a ~30 nm OPL (HM8500, from JSR Micro). After selective removal of PMMA domains by $O_2$ RIE, continued $O_2$ RIE is used to break through the PEpoxyDCPMA25-r-PS75 film. SiARC is removed under the area occupied by the former PMMA domains but not under the area occupied by the prepattern using RIE with $CF_4$ and $H_2$ gases. Further etching into the OPL through the openings in the SiARC is accomplished through a subsequent RIE step with $O_2$ and $N_2$ gases. FIG. 29C shows a higher magnification SEM image of a masking feature with a minor dimension (~90 nm) that is designed to be perpendicular to the alignment of the self-assembled pattern, while SEM images in the area of similar masking features after DSA and oxygen RIE, and after transfer into the OPL, are shown in FIGS. 29D and 29E respectively. FIGS. 29F, 29G, and 29H are SEM images of a similar prepattern in the region of a masking feature with a minor dimension (~90 nm) designed to be parallel with the self-assembled pattern alignment, the resulting self-assembled pattern after DSA and oxygen RIE, and transfer into the OPL, respectively. In both cases, the union of the PS domains and the prepattern provide an effective composite mask for pattern transfer.

Example 2

Figure 30A:
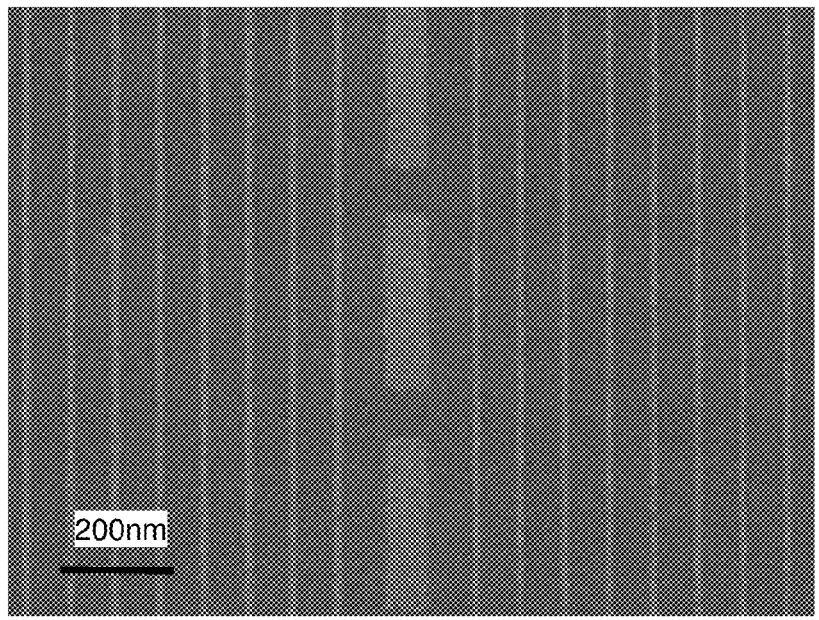
FIG. 30A is a SEM of a second sample manufactured according to methods of the present disclosure after formation of an etch-resistant prepattern.
Figure 30B:
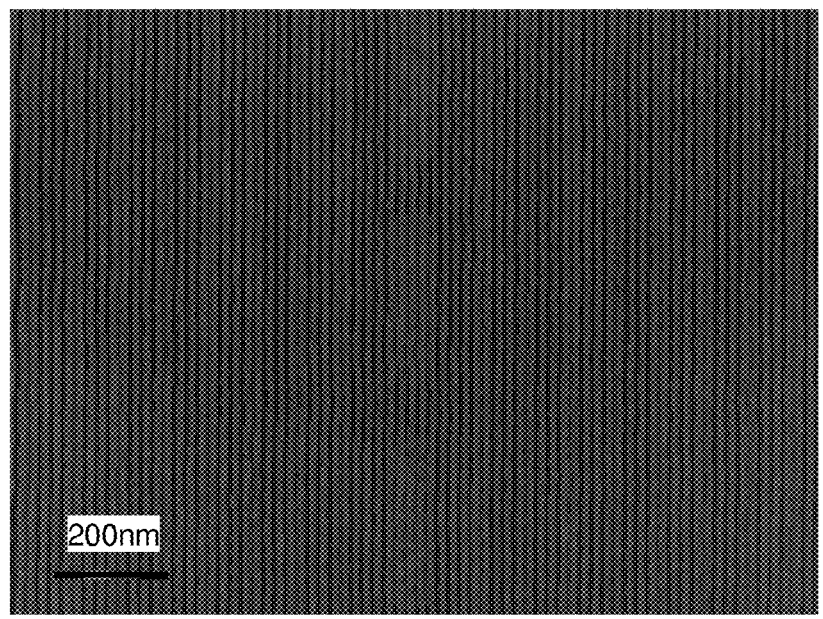
FIG. 30B is a SEM of the second sample manufactured according to methods of the present disclosure after formation of polymeric block component portions including a second pattern.

A prepattern includes a thin layer of hydrogen silsesquioxane (HSQ), patterned using electron beam lithography, which is preferentially wetted by PMMA. It lies on top of a thermally cross-linked film of PEpoxyDCPMA-r-PS (25/75) that enables the formation of self-assembled domains laterally on the substrate. The HSQ pattern and the cross-linked film make up the chemical pattern layer. The HSQ pattern includes 12 nm wide stripes with a 100 nm pitch and masking features are not contiguous with other prepattern features. All features in the prepattern are less than 5 nm in height. The self-assembling material used is a blend of 85% (w/w) symmetric poly(styrene-b-methyl methacrylate) (PS-PMMA; 22 kg/mol-22 kg/mol) block copolymer from Polymer Source and 15% (w/w) 2.8 kg/mol PMMA from Polymer Laboratories that forms lamellae with a ~25 nm period due to phase separation. Prior to application of the self-assembling material, the substrate with the chemical pattern layer was annealed at 205° C. for 15 minutes in air. DSA is achieved by casting a film of self-assembling material from solution in PGMEA onto the chemical pattern layer and annealing the film at 248° C. for 5 minutes. Oxygen reactive ion etching (RIE) is used to selectively remove PMMA domains due to their faster etch rate compared to PS. FIG. 30A is a SEM image of an HSQ prepattern with a central area containing 90 nm×390 nm rectangular masking features not contiguous with any other features in the prepattern, and FIG. 30B shows the results for an identical prepattern after DSA and oxygen RIE. The self-assembled pattern is aligned by the elements of the prepattern excluding the masking features. This example demonstrates that individual masking features may be isolated from all other features of the prepattern and the alignment of the self-assembled polymer is maintained.

Example 3

A prepattern includes a thin layer of hydrogen silsesquioxane (HSQ), patterned using electron beam lithography, which is preferentially wetted by PMMA. It lies on top of a thermally cross-linked film of PEpoxyDCPMA-r-PS (25/75)

that enables the formation of self-assembled domains laterally on the substrate. The HSQ pattern and the cross-linked film make up the chemical pattern layer. The HSQ pattern includes 12 nm wide stripes with a 100 nm pitch and masking features that are more complicated than simple rectangles. All features in the prepattern are less than 5 nm in height. For pattern transfer to the underlying substrate, the HSQ pattern and cross-linked PEpoxyDCPMA-r-PS film lie on a 10 nm silicon oxide layer (deposited by chemical vapor deposition) on top of a ~30 nm OPL (amorphous carbon, deposited by chemical vapor deposition). After selective removal of PMMA domains by $O_2$ RIE, continued $O_2$ RIE is used to break through the PEpoxyDCPMA-r-PS film. Silicon oxide is removed under the area occupied by the former PMMA domains but not under area occupied by the prepattern using RIE with $CF_4$ and $H_2$ gases. Further etching into the OPL through the openings in the silicon oxide is accomplished through a subsequent $O_2$ RIE step.

Figure 31A:
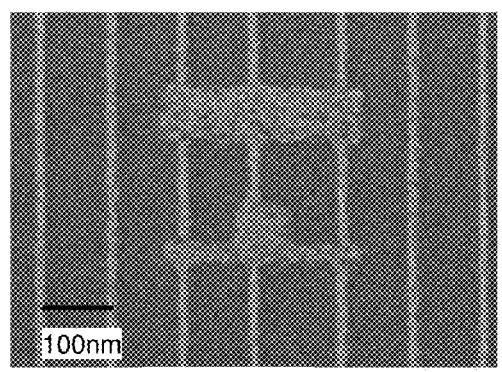
FIG. 31A is a SEM of a first region of a third sample manufactured according to methods of the present disclosure after formation of an etch-resistant prepattern.
Figure 31B:
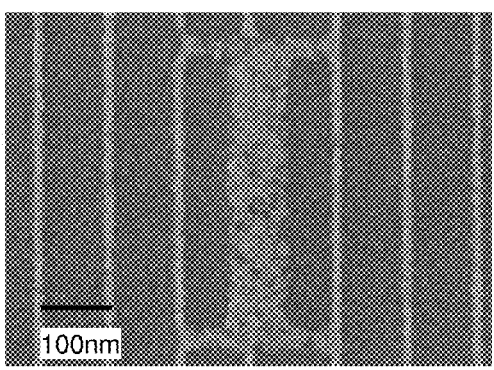
FIG. 31B is a SEM of the second region of the third sample manufactured according to methods of the present disclosure after formation an etch-resistant prepattern. A HSQ masking feature prepattern includes an "I"-shaped masking feature (210 nm wide by 440 nm long).
Figure 31C:
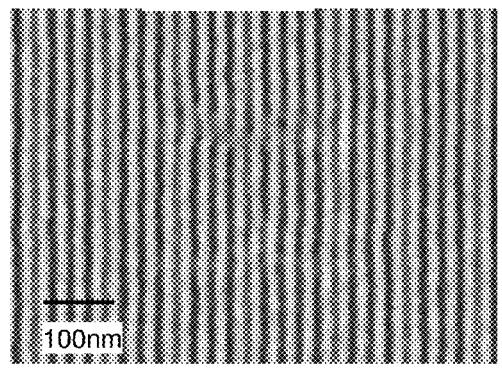
FIG. 31C is a SEM of the first region of the third sample manufactured according to methods of the present disclosure after formation of polymeric block component portions including a second pattern.
Figure 31D:
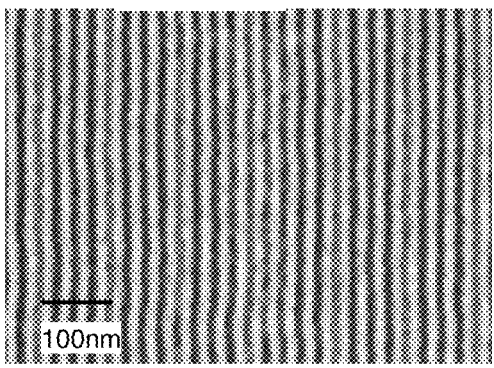
FIG. 31D is a SEM of a second region of a third sample manufactured according to methods of the present disclosure after formation of polymeric block component portions including a second pattern.
Figure 31E:
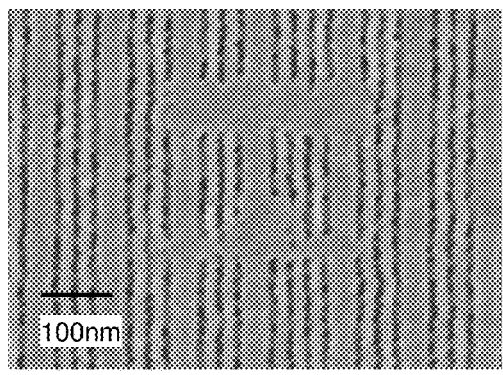
FIG. 31E is a SEM of the first region of the third sample manufactured according to methods of the present disclosure after transfer of a composite pattern into underlying material layers.
Figure 31F:
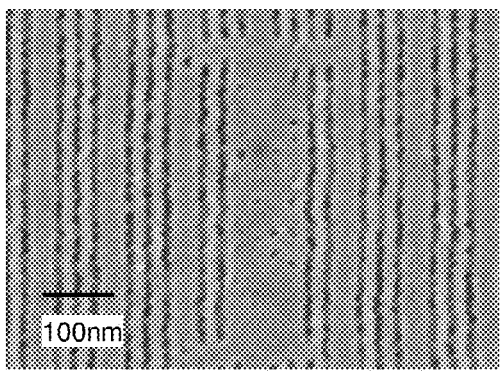
FIG. 31F is a SEM of the second region of the third sample manufactured according to methods of the present disclosure after transfer of a composite pattern into underlying material layers.

The self-assembling material used is a blend of 90% (w/w) symmetric poly(styrene-b-methyl methacrylate) (PS-PMMA; 22 kg/mol-22 kg/mol) block copolymer from Polymer Source and 10% (w/w) 2.5 kg/mol PMMA also from Polymer Source that forms lamellae with a ~25 nm period due to phase separation. Prior to application of the self-assembling material, the substrate with the chemical pattern layer was annealed at 205° C. for 15 minutes in air. DSA is achieved by casting a film of self-assembling material from solution in PGMEA onto the chemical pattern layer and annealing the film at 248° C. for 5 minutes. Oxygen reactive ion etching (RIE) is used to selectively remove PMMA domains due to their faster etch rate compared to PS. FIG. 31A shows a prepattern incorporating a "hat"-shaped masking feature 267 nm wide by 84 nm long (long direction parallel with stripes) near a 267 nm×80 nm rectangular masking feature, while FIG. 31B shows the inclusion of an "I"-shaped masking feature 210 nm wide and 440 nm long into a prepattern. FIGS. 31C and 31D are the results after DSA and oxygen RIE in the region of masking features identical to those shown in FIGS. 31A and 31B, respectively. DSA in areas outside the masking feature is unaffected. FIGS. 31E and 31F show the results of transfer into the OPL in the region of the masking features depicted in FIGS. 31A and 31B, respectively, indicating that the HSQ serves as a successful masking material to produce customized patterns.

Figure 31G:
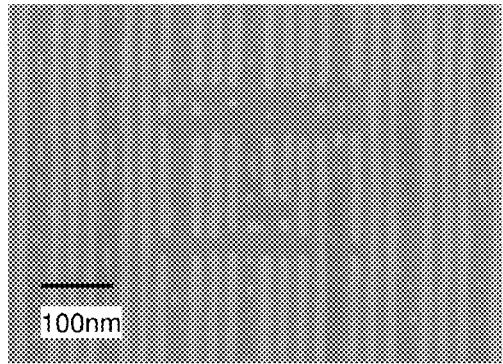
FIG. 31G is a SEM of the first region of the third sample manufactured according to methods of the present disclosure after pattern inversion that generates a complementary pattern.

FIG. 31G is the result of pattern inversion of a trench pattern closely resembling the one in FIG. 31E. For the substrate used, the HSQ pattern and cross-linked PEpoxyDCPMA-r-PS film lie on an 14 nm silicon-based antireflection coating (SiARC, from Shinitsu) on top of a ~30 nm OPL (HM8500, from JSR Micro). The self-assembling material used is a blend of 90% (w/w) symmetric poly(styrene-b-methyl methacrylate) (PS-PMMA; 22 kg/mol-22 kg/mol) block copolymer from Polymer Source and 10% (w/w) symmetric PS-PMMA (10 kg/mol-10 kg/mol) block copolymer also from Polymer Source that forms lamellae with a ~25 nm period due to phase separation. Processing was performed identically as above to form a trench pattern like FIG. 31E, except that transfer into the OPL was accomplished through an RIE using $O_2$ and $N_2$ gases. After formation of the trench pattern, a spin-on silicon-based dielectric material (NFC IRM-007-6, JSR Micro) was applied to the substrate and cured by annealing at 110° C. for one minute and then 140° C. for one minute. The spin-on dielectric fills the trenches and overcoats the substrate. RIE with $CF_4$ was used to etch back the spin-on dielectric to a height at or below the top surface of the OPL. The remaining OPL is removed by another RIE using $O_2$ and $N_2$ gases. This example demonstrates that masking features used in this disclosure are not limited to simple rectangular shapes, and that this method may be used to create DSA patterns with complex customization.

Example 4

A prepattern includes a thin layer of hydrogen silsesquioxane (HSQ), patterned using electron beam lithography, which is preferentially wetted by PMMA. It lies on top of a thermally cross-linked film of PEpoxyDCPMA-r-PS (25/75) that enables the formation of self-assembled domains laterally on the substrate. The HSQ pattern and the cross-linked film make up the chemical pattern layer. The HSQ pattern includes 12 nm wide stripes with a 100 nm pitch. Additional HSQ masking features such as crossbars perpendicular in direction to HSQ lines used to guide the PS-PMMA cylinder array were also included in the prepattern. All features in the prepattern are less than 5 nm in height. For pattern transfer to the underlying substrate, the HSQ pattern and cross-linked PEpoxyDCPMA-r-PS film lie on a 10 nm silicon oxide layer (deposited by chemical vapor deposition) on top of a ~30 nm OPL (amorphous carbon, deposited by chemical vapor deposition).

The self-assembling material used is poly(styrene-b-methyl methacrylate) (PS-PMMA; 46 kg/mol-21 kg/mol) block copolymer from Polymer Source that forms PMMA cylinders with a ~39 nm center-to-center distance in a PS matrix due to phase separation. Prior to application of the self-assembling material, the substrate with the chemical pattern layer was annealed at 205° C. for 15 minutes in air. DSA is achieved by casting a film of self-assembling material from solution in PGMEA onto the chemical pattern layer and annealing the film at 248° C. for 5 minutes. Oxygen reactive ion etching (RIE) is used to selectively remove PMMA domains due to their faster etch rate compared to PS, creating holes. After selective removal of PMMA domains by $O_2$ RIE, continued $O_2$ RIE is used to break through the PEpoxyDCPMA-r-PS film. Silicon oxide is removed under the area occupied by the former PMMA domains but not under area occupied by the prepattern using RIE with $CF_4$ and $H_2$ gases. Further etching into the OPL through the openings in the silicon oxide is accomplished through a subsequent $O_2$ RIE step.

FIGS. 32A and 32B show two SEM images of hole patterns that result after transfer into the OPL when the prepattern included such masking features. This demonstrates the possibility for more complex hole patterns that may ultimately be generated by this customization strategy when applied to self-assembling materials with perpendicular cylinder geometries.

While the present disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the present disclosure is intended to encompass all such alternatives, modifications and variations which fall within the scope and spirit of the present disclosure and the following claims.

What is claimed is:

1. A method of patterning a material layer on a substrate, said method comprising:
   providing a substrate with a material layer thereupon;
   applying a solution of a self-assembling material to a chemical pattern layer over said material layer to form lamellae,
   wherein said chemical pattern layer comprises first regions and second regions that include chemically distinct first and second materials, respectively, wherein one of said first and second materials comprises an etch-resistant material such that said first and second materials possess substantially different etch resistances,
   wherein said lamellae comprise alternating first and second domains composed of chemically distinct first and second polymeric block components, respectively, and said first and second domains have a first width and a second width, respectively, and have a characteristic pitch that is equal to a sum of said first width and said second width,
   wherein physically exposed top surfaces of said first regions and said second regions complementarily overlie an entirety of said substrate,
   wherein said first regions include a prepattern having alignment-conferring prepattern portions and at least one masking feature prepattern portion,
   wherein said first regions have a preferential affinity for said first domains,
   wherein said alignment-conferring prepattern portions comprise lengthwise strips having widths substantially equal to said first width of said first domains, and lengthwise center lines located at positions laterally separated from one another by distances substantially equal to integer multiples of a unit distance, said unit distance being substantially equal to said characteristic pitch,
   wherein each of said at least one masking feature prepattern portions has a width greater than said first width of said first domains or has a lengthwise center line located at a position laterally separated from said lengthwise center line of an alignment-conferring prepattern portion by a distance different from an integer multiple of said unit distance,
   wherein at least one of said first domains is formed over said alignment-conferring prepattern portions, and wherein said at least one first domain so formed are aligned to said alignment-conferring prepattern portions, and
   wherein subsets of said first and second domains that are formed over said second regions or over said at least one masking feature prepattern portions self-align with a subset of said first domains that is formed over said alignment-conferring prepattern portions to form aligned lamellar structures oriented substantially perpendicular to said substrate;
   selectively removing, by an etch process, said first domains or said second domains to form an etched self-assembled pattern; and
   transferring said etched self-assembled pattern selectively through either physically exposed portions of said first regions or physically exposed portions of said second regions of said chemical pattern layer into said material layer by at least one etch process to form a composite pattern including a union of said etched self-assembled pattern and said prepattern within said material layer, whereby said material layer is transformed into a patterned material layer containing said transferred pattern.

2. The method of claim 1, wherein portions of said first and second domains that are formed over said at least one masking feature prepattern portions do not self-align with portions of said first domains that are formed over said alignment-conferring prepattern portions.

3. The method of claim 1, wherein said alignment-conferring prepattern portions are non-contiguous along a lengthwise direction of said alignment-conferring prepattern portions.

4. The method of claim 1, wherein said chemical pattern layer is formed by:
   forming a layer of a coating material over said substrate, wherein said coating material is one of said first material and said second material to said substrate,
   covering selected areas of said coating material with a patterned resist layer,
   removing partially or completely said coating material in areas not protected by said patterned resist layer,
   depositing a layer of another of said first material and said second materials onto areas not protected by said patterned resist layer, and
   removing said patterned resist layer.

5. The method of claim 1, wherein said chemical pattern layer is formed by:
   forming a layer of a coating material over said substrate, wherein said coating material is one of said first material and second material,
   applying a resist layer comprising another of said first material and said second material to said layer of coating material, and
   patterning said resist layer.

6. The method of claim 1, wherein each of said at least one masking feature prepattern portions has a width greater than said first width of said first domains or has a lengthwise center line that substantially underlies said lengthwise center line of one of said second domains.

7. A method of patterning a material layer on a substrate, said method comprising:
   providing a substrate with a material layer thereupon;
   applying a solution of a self-assembling material to a chemical pattern layer over said material layer to form lamellae,
   wherein said chemical pattern layer comprises first regions and second regions that include chemically distinct first and second materials, respectively, wherein one of said first and second materials comprises an etch-resistant material such that said first and second materials possess substantially different etch resistances,
   wherein said lamellae comprise alternating first and second domains composed of chemically distinct first and second polymeric block components, respectively, and said first and second domains have a first width and a second width, respectively, and have a characteristic pitch that is equal to a sum of said first width and said second width,
   wherein physically exposed top surfaces of said first regions and second regions complementarily overlie an entirety of said substrate;
   wherein said first regions include a prepattern having alignment-conferring prepattern portions and at least one masking feature prepattern portion,
   wherein said first regions have a preferential affinity for said first domains, and
   wherein said alignment-conferring prepattern portions comprise lengthwise strips having widths substantially equal to one and a half times a unit distance and whose lengthwise center lines are located at positions laterally separated from one another by distances substantially equal to integer multiples of a unit distance, said unit distance being substantially equal to said characteristic pitch, wherein each of said at least one masking feature prepattern portions has a width different from said widths of said lengthwise strips or has a lengthwise center line located at a position laterally separated from said lengthwise center line of an alignment-conferring prepattern portion by a distance different from an integer multiple of said unit distance, wherein at least one first domain and one second domain are formed over said alignment-conferring prepattern portions, and wherein said first domains and said second domains so formed are aligned to said alignment-conferring prepattern portions, and wherein subsets of said first and second domains that are formed over said second regions or over said at least one masking feature prepattern portions self-align with a subset of said first and second domains formed over said alignment-conferring prepattern portions to form aligned lamellar structures oriented substantially perpendicular to said substrate;

selectively removing, by an etch process, said first domains or second domains to form an etched self-assembled pattern; and transferring said etched self-assembled pattern selectively through either physically exposed portions of said first regions or physically exposed portions of said second regions of said chemical pattern layer into said material layer by at least one etch process to form a composite pattern including a union of said etched self-assembled pattern and said prepattern within said material layer, whereby said material layer is transformed into a patterned material layer containing said transferred pattern.

8. The method of claim 7, wherein portions of said first and second domains that are formed over said at least one masking feature prepattern portions do not self-align with portions of said first domains that are formed over said alignment-conferring prepattern portions.

9. The method of claim 7, wherein said alignment-conferring prepattern portions are non-contiguous along a lengthwise direction of said alignment-conferring prepattern portions.

10. The method of claim 7, wherein said chemical pattern layer is formed by:
   forming a layer of a coating material over said substrate, wherein said coating material is one of said first material and said second material to said substrate,
   covering selected areas said coating material with a patterned resist layer,
   removing partially or completely said coating material in areas not protected by said patterned resist layer,
   depositing a layer of another of said first material and said second materials onto areas not protected by said patterned resist layer, and
   removing said patterned resist layer.

11. The method of claim 7, wherein said chemical pattern layer is formed by:
   forming a layer of a coating material over said substrate, wherein said coating material is one of said first material and second material,
   applying a resist layer comprising another of said first material and said second material to said layer of coating material, and
   patterning said resist layer.

12. The method of claim 7, wherein each of said at least one masking feature prepattern portions has a width different from said widths of said lengthwise strips, or has a lengthwise center line that substantially underlies a lengthwise center line of one of said first domains.

13. A method of patterning a material layer on a substrate, said method comprising:
   providing a substrate with a material layer thereupon;
   applying a solution of a self-assembling material to a chemical pattern layer over said material layer to form cylindrical first domains in a matrix of a second domain,
   wherein said chemical pattern layer comprises first regions and second regions that include chemically distinct first and second materials, respectively, wherein one of said first and second materials comprises an etch-resistant material such that said first and second materials possess substantially different etch resistances,
   wherein said cylindrical first domains and said second domain comprise chemically distinct first and second polymeric block components, respectively, and said first domains have a characteristic diameter and a characteristic pitch that is equal to a spatial period between centers of said first domains,
   wherein physically exposed top surfaces of said first regions and said second regions complementarily overlie an entirety of said substrate;
   wherein said first regions include a prepattern having a first axis in a plane parallel to said substrate and a second axis in said plane parallel to said substrate, and have alignment-conferring prepattern portions and at least one masking feature prepattern portion,
   wherein said first regions have a preferential affinity for said first domains, and
   wherein said alignment-conferring prepattern portions comprise areas having widths substantially equal to said characteristic diameter and are arranged in an array such that centers of said areas are located at positions translated from one another by distances substantially equal to a combination of integer multiples of a unit distance along a direction of said first axis and integer multiples of said unit distance along a direction of said second axis, said unit distance being substantially equal to said characteristic pitch,
   wherein each of said at least one masking feature prepattern portion has a width greater than said characteristic diameter or has a center located at a position translated from a center of an alignment-conferring prepattern portion by a distance different from a combination of integer multiples of said unit distance along said direction of said first axis and integer multiples of said unit distance along said direction of said second axis,
   wherein at least one of said first domains is formed over said alignment-conferring prepattern portions, and
   wherein subsets of said first domains that are formed over said second regions or over said at least one masking feature prepattern portions self-align with another subset of said first domains that is formed over said alignment-conferring prepattern portions so as to form an aligned array of cylinders oriented substantially perpendicular to said substrate;
   selectively removing, by an etch process, said first domains or said second domain to form an etched self-assembled pattern; and
   transferring said etched self-assembled pattern selectively through either physically exposed portions of said first regions or physically exposed portions of said second regions of said chemical pattern layer into said material layer by at least one etch process to form a composite pattern including a union of said etched self-assembled pattern and said prepattern within said material layer, whereby said material layer is transformed into a patterned material layer containing said transferred pattern.

14. The method of claim 13, wherein portions of said first domains and said second domain that are formed over said at least one masking feature prepattern portions do not self-align with portions of said first domains that are formed over said alignment-conferring prepattern portions.

15. The method of claim 13, wherein an angle between said first and second axes is substantially equal to 60 degrees or 120 degrees.

16. The method of claim 13, wherein said chemical pattern layer is formed by:
    forming a layer of a coating material over said substrate, wherein said coating material is one of said first material and said second material to said substrate,
    covering selected areas said coating material with a patterned resist layer,
    removing partially or completely said coating material in areas not protected by said patterned resist layer,
    depositing a layer of another of said first material and said second materials onto areas not protected by said patterned resist layer, and
    removing said patterned resist layer.

17. The method of claim 13, wherein said chemical pattern layer is formed by:
    forming a layer of a coating material over said substrate, wherein said coating material is one of said first material and second material,
    applying a resist layer comprising another of said first material and said second material to said layer of coating material, and
    patterning said resist layer.

18. The method of claim 13, wherein each of said at least one masking feature prepattern portions has a width greater than said characteristic diameter or has a center point that underlies said second matrix domain.

19. A method of patterning a material layer on a substrate, said method comprising:
    providing a substrate with a material layer thereupon;
    applying a solution of a self-assembling material to a chemical pattern layer over said material layer to form cylindrical first domains in a matrix of a second domain, wherein said chemical pattern layer comprises first regions and second regions that include chemically distinct first and second materials, respectively, wherein one of said first and second materials comprises an etch-resistant material such that said first and second materials possess substantially different etch resistances,
    wherein said cylindrical first domains and said second domain comprise chemically distinct first and second polymeric block components, respectively, and said first domains have a characteristic diameter and a characteristic pitch that is equal to said spatial period between centers of first domains,
    wherein physically exposed top surfaces of said first and second regions complementarily overlie an entirety of said substrate;
    wherein said first regions include a prepattern having alignment-conferring prepattern portions and at least one masking feature prepattern portion, and
    wherein said first regions have a preferential affinity for said first domains, and
    wherein said alignment-conferring prepattern portions comprise lengthwise strips having widths substantially equal to said characteristic diameter and whose lengthwise center lines are located at positions laterally separated from one another by distances substantially equal to integer multiples of a unit distance, said unit distance being in a range from 0.78 times said characteristic pitch to 0.95 times said characteristic pitch,
    wherein each of said at least one masking feature prepattern portions has a width greater than said characteristic diameter or has a lengthwise center line located at a position laterally separated from said lengthwise center line of an alignment-conferring prepattern portion by a distance different from an integer multiple of said unit distance,
    wherein at least one of said first domains is formed over said alignment-conferring prepattern portions, and wherein said at least one first domain so formed are aligned to said alignment-conferring prepattern portions,
    wherein subsets of said first domains that are formed over said second regions or over said at least one masking feature prepattern portions self-align with another subset of said first domains that are formed over said alignment-conferring prepattern portions to form an aligned array of cylinders oriented substantially perpendicular to said substrate;
    selectively removing, by an etch process, said first domains or said second domains to form an etched self-assembled pattern; and
    transferring said etched self-assembled pattern selectively through either physically exposed portions of said first regions or physically exposed portions of said second regions of said chemical pattern layer into said material layer by at least one etch process to form a composite pattern including a union of said etched self-assembled pattern and said prepattern within said material layer, whereby said material layer is transformed into a patterned material layer containing said transferred pattern.

20. The method of claim 19, wherein portions of said first domains and said second domain that are formed over said at least one masking feature prepattern portions do not self-align with portions of said first domains that are formed over said alignment-conferring prepattern portions.

21. The method of claim 19, wherein said alignment-conferring prepattern portions are non-contiguous along a lengthwise direction of said alignment-conferring prepattern portions.

22. The method of claim 19, wherein said chemical pattern layer is formed by:
    forming a layer of a coating material over said substrate, wherein said coating material is one of said first material and said second material to said substrate,
    covering selected areas said coating material with a patterned resist layer,
    removing partially or completely said coating material in areas not protected by said patterned resist layer,
    depositing a layer of another of said first material and said second materials onto areas not protected by said patterned resist layer, and
    removing said patterned resist layer.

23. The method of claim 19, wherein said chemical pattern layer is formed by:
    forming a layer of a coating material over said substrate, wherein said coating material is one of said first material and second material, applying a resist layer comprising another of said first material and said second material to said layer of coating material, and patterning said resist layer.

24. The method of claim 19, wherein each of said at least one masking feature portions has a width greater than said characteristic diameter or has a lengthwise center line that underlies said second matrix domain.

25. The method of claim 19, wherein said unit distance is in a range from 0.45 times said characteristic pitch to 0.55 times said characteristic pitch.

26. A method of patterning a material layer on a substrate, said method comprising:

providing a substrate with a material layer thereupon;

forming a chemical pattern layer over said material layer, said chemical pattern layer comprising a first material and a second material, wherein one of said first material and said second material comprises an etch-resistant material, on a substrate, wherein physically exposed top surfaces of said first material and physically exposed top surfaces of said second material complementarily overlie an entirety of said substrate, wherein regions in which top surfaces of said first material are physically exposed include a prepattern comprising alignment-conferring prepattern portions and at least one masking feature prepattern portion;

applying a self-assembling material over said chemical pattern layer;

inducing self-alignment of periodically arranged chemically distinct polymeric block components of said self-assembling material to said alignment-conferring prepattern portions, wherein portions of said self-assembling material over said at least one masking feature prepattern portions become self-aligned to said alignment-conferring prepattern portions;

removing at least one of said polymeric block components selective to the other of said polymeric block components and said etch-resistant material by an etch process to form an etched self-assembled pattern; and transferring a pattern into said material layer by an etch process, wherein said transferred pattern is a composite pattern including a union of said prepattern and said etched self-assembled pattern or a complement of said composite pattern, whereby said material layer is transformed into a patterned material layer containing said transferred pattern.

* * * * *